United States Patent
Chaudhary et al.

[11] Patent Number: 6,086,631
[45] Date of Patent: Jul. 11, 2000

[54] POST-PLACEMENT RESIDUAL OVERLAP REMOVAL METHOD FOR CORE-BASED PLD PROGRAMMING PROCESS

[75] Inventors: Kamal Chaudhary; Sudip K. Nag, both of San Jose, Calif.

[73] Assignee: Xilinx, Inc., San Jose, Calif.

[21] Appl. No.: 09/057,360

[22] Filed: Apr. 8, 1998

[51] Int. Cl.$^7$ ...................................................... G06F 17/50
[52] U.S. Cl. .................................. 716/16; 716/7; 716/17; 716/18
[58] Field of Search .......................... 395/500.02–500.19; 716/1–21

[56] References Cited

U.S. PATENT DOCUMENTS

| | | | |
|---|---|---|---|
| 5,513,124 | 4/1996 | Trimberger et al. | 395/500.08 |
| 5,598,343 | 1/1997 | Roy et al. | 395/500.17 |
| 6,066,024 | 12/1999 | Guruswamy et al. | 395/500.13 |

FOREIGN PATENT DOCUMENTS

WO 95/02903  1/1995  WIPO ........................... H01L 27/118

OTHER PUBLICATIONS

Murata, et al. "Rectangle–Packing–Based Module Placement", IEEE/ACM International Conference on Computer Aided Design, Nov. 5–9, 1995, pp. 472–479.

Vijayan, et al. "Floorplanning by Topological Constraint Reduction", IEEE 1990, pp. 106–109, Jan. 1990.

*Primary Examiner*—Paul R. Lintz
*Assistant Examiner*—Phallaka Kik
*Attorney, Agent, or Firm*—Patrick T. Bever, Esq.; Jeanette S. Harms, Esq.

[57] ABSTRACT

A post-placement residual overlap removal process for use with core-based programmable logic device programming methods that is called when an optimal placement solution includes one or more overlapping cores. Horizontal and vertical constraint graphs are utilized to mathematically define the two-dimensional positional relationship between the cores of the infeasible placement solution in two separate one-dimensional (i.e., horizontal and vertical) directions. Next, the constraint graphs are analyzed to determine whether they include a feasible solution (i.e., whether the overlaps existing in the placement solution can be removed simply by reallocating available resources to the overlapping cores). If one of the constraint graphs is not feasible, then the infeasible constraint graph is revised, and then the feasibility of both graphs is re-analyzed for feasibility. The feasibility analysis and constraint graph revision steps are repeated until both constraint graphs are feasible. After feasibility is determined, a slack allocation process is performed during which resources are allocated to the cores to generate a revised placement solution such that the cores are positioned as close to the original optimal solution as possible with no overlaps. Finally, the individual logic portions are re-placed using bipartite matching to complete the revised placement solution.

20 Claims, 30 Drawing Sheets

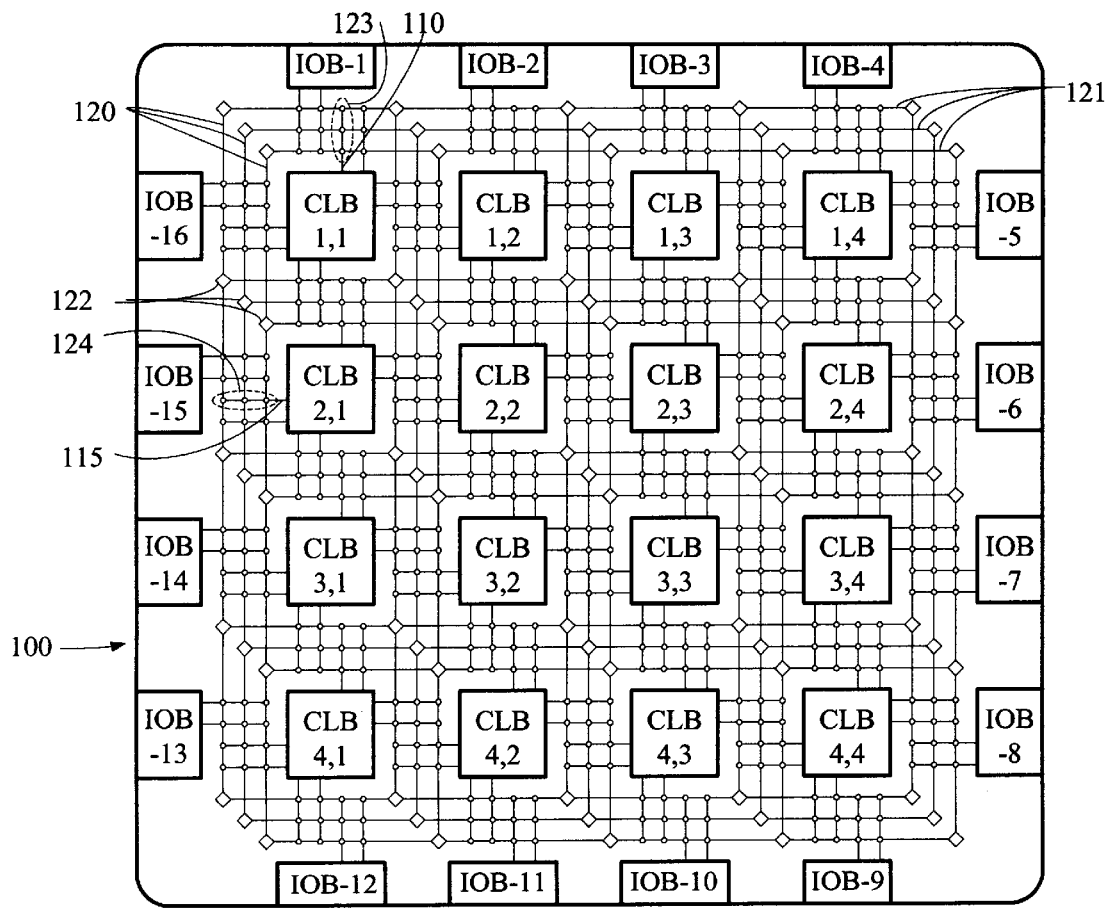
FIG. 1(A)
(PRIOR ART)
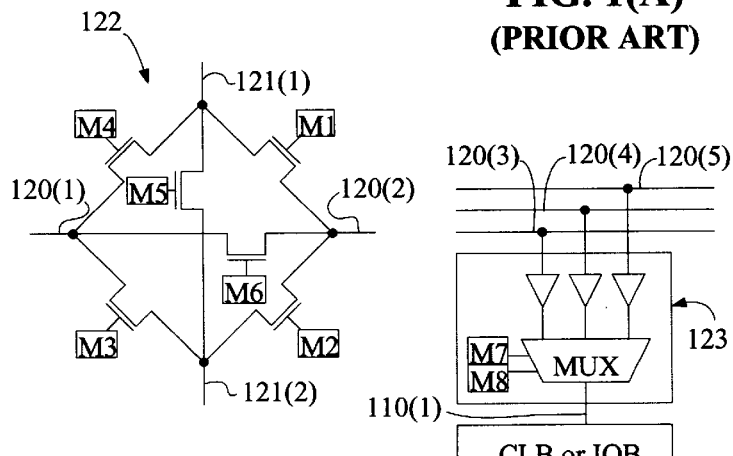
FIG. 1(B)
(PRIOR ART)
FIG. 1(C)
(PRIOR ART)
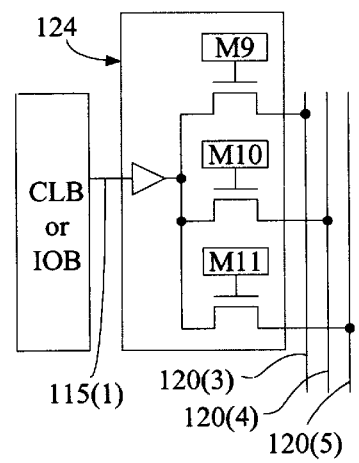
FIG. 1(D)
(PRIOR ART)

| CLB | | | I/O | | | 6-WAY SWITCH | | | INPUT SWITCH | | | OUTPUT SWITCH | | |
|---|---|---|---|---|---|---|---|---|---|---|---|---|---|---|
| CLB # | MEM CELL | VAL | IOB # | MEM CELL | VAL | 6-C # | MEM CELL | VAL | I-C # | MEM CELL | VAL | O-C # | MEM CELL | VAL |
| 1,1 | M(a1) | 0 | 1 | M(b1) | 0 | 1,1 | M1 | 1 | 1,1 | M7 | 0 | 1,1 | M9 | 0 |
| 1,1 | M(a2) | 1 | 1 | M(b2) | 1 | 1,1 | M2 | 1 | 1,1 | M8 | 0 | 1,1 | M10 | 1 |
| ⋮ | ⋮ | ⋮ | ⋮ | ⋮ | ⋮ | ⋮ | ⋮ | ⋮ | ⋮ | ⋮ | ⋮ | ⋮ | ⋮ | ⋮ |
| 1,2 | M(a1) | 1 | 2 | M(b1) | 1 | 1,2 | M1 | 1 | 2,2 | M7 | 0 | 4,3 | M9 | 0 |
| 1,2 | M(a2) | 0 | 2 | M(b2) | 0 | 1,2 | M2 | 1 | 2,2 | M8 | 1 | 4,3 | M10 | 1 |
| ⋮ | ⋮ | ⋮ | ⋮ | ⋮ | ⋮ | ⋮ | ⋮ | ⋮ | ⋮ | ⋮ | ⋮ | ⋮ | ⋮ | ⋮ |
| 4,4 | M(a1) | 0 | 16 | M(b1) | 0 | m,m | M5 | 0 | x,w | M7 | 1 | z,y | M10 | 0 |
| 4,4 | M(a2) | 0 | 16 | M(b2) | 0 | m,n | M6 | 1 | x,x | M8 | 0 | z,z | M11 | 1 |

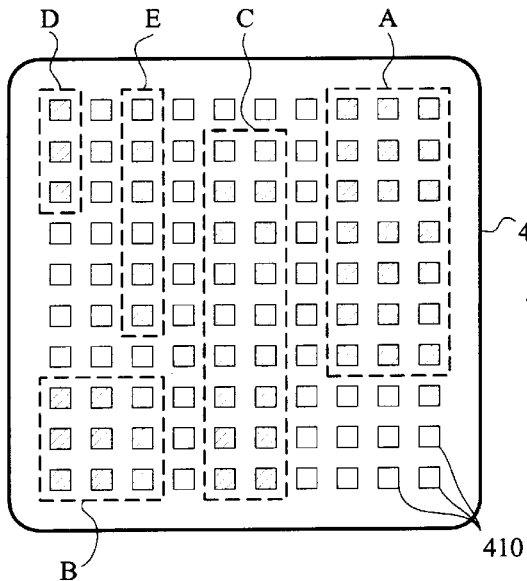
FIG. 4(A)
(PRIOR ART)
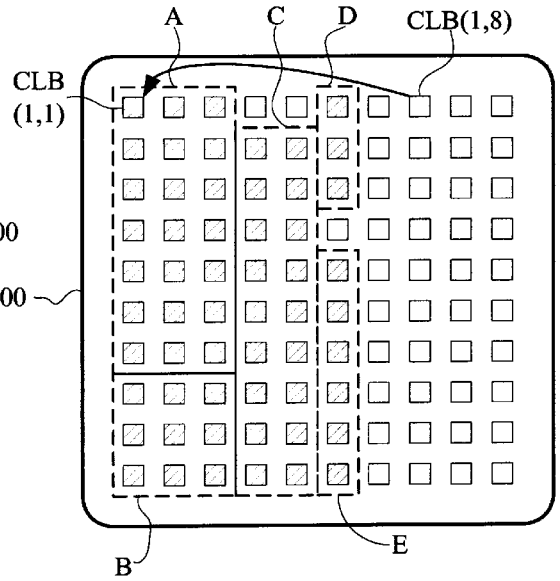
FIG. 4(B)
(PRIOR ART)
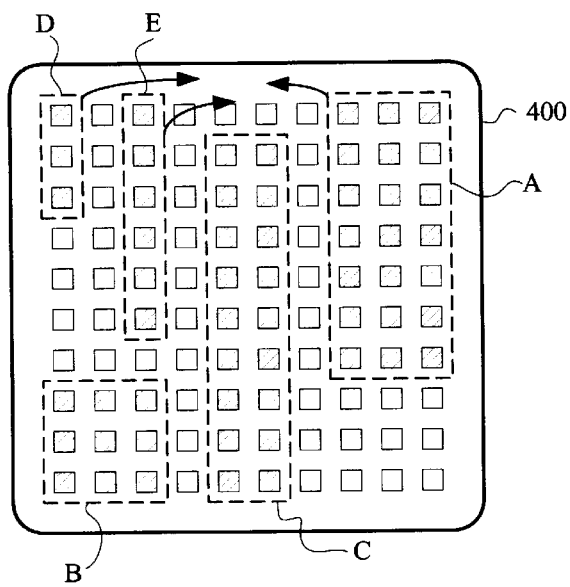
FIG. 5(A)
(PRIOR ART)
| FPGA | | |
|---|---|---|
| CLB # | MEM CELL | VAL |
| 1,1,1 | M(a1) | 0 |
| 1,1,1 | M(a2) | 1 |
| ⋮ | ⋮ | |
| 1,1,2 | M(a1) | 1 |
| 1,1,2 | M(a2) | 0 |
| ⋮ | ⋮ | |
| 1,4,4 | M(a1) | 0 |
| 1,4,4 | M(a2) | 0 |
FIG. 5(B)
(PRIOR ART)

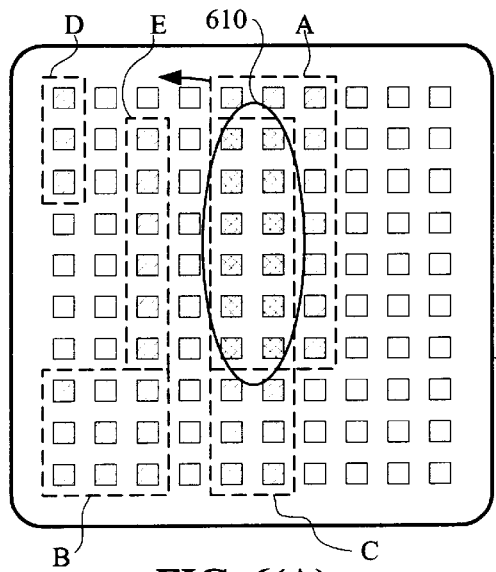
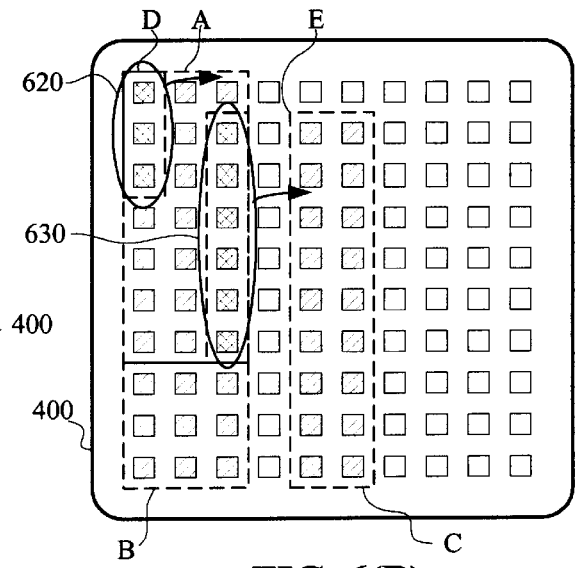
FIG. 6(A)
(PRIOR ART)
FIG. 6(B)
(PRIOR ART)
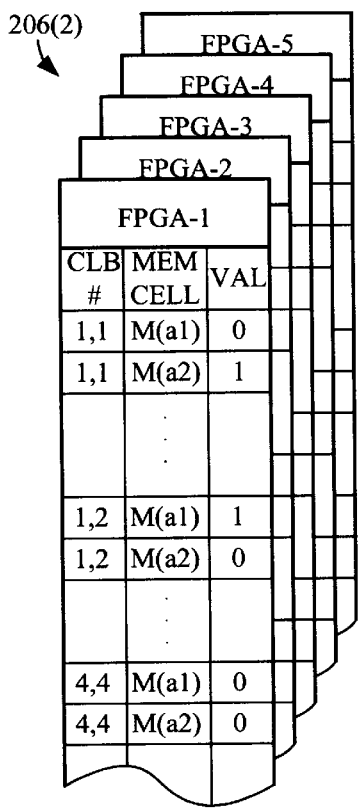
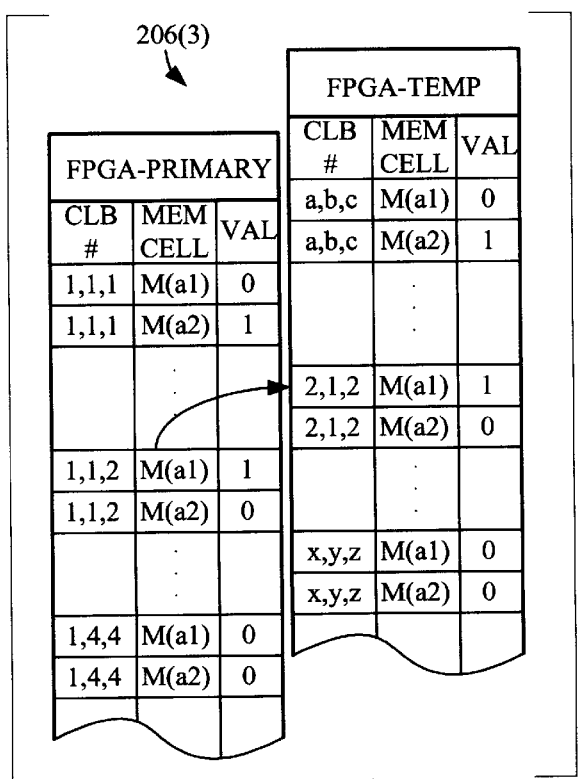
FIG. 6(C)
(PRIOR ART)
FIG. 6(D)
(PRIOR ART)

| CLB | | | I/O | | | 6-WAY SWITCH | | | INPUT SWITCH | | | OUTPUT SWITCH | | |
|---|---|---|---|---|---|---|---|---|---|---|---|---|---|---|
| CLB # | MEM CELL | VAL | IOB # | MEM CELL | VAL | 6-C # | MEM CELL | VAL | I-C # | MEM CELL | VAL | O-C # | MEM CELL | VAL |
| 1,1 | M(a1) | 0 | 1 | M(b1) | 0 | 1,1 | M1 | 1 | 1,1 | M7 | 0 | 1,1 | M9 | 0 |
| 1,1 | M(a2) | 1 | 1 | M(b2) | 1 | 1,1 | M2 | 1 | 1,1 | M8 | 0 | 1,1 | M10 | 1 |
| ⋮ | ⋮ | | ⋮ | ⋮ | | ⋮ | ⋮ | | ⋮ | ⋮ | | ⋮ | ⋮ | |
| 1,2 | M(a1) | 1 | 2 | M(b1) | 1 | 1,2 | M1 | 1 | 2,2 | M7 | 0 | 4,3 | M9 | 0 |
| 1,2 | M(a2) | 0 | 2 | M(b2) | 0 | 1,2 | M2 | 1 | 2,2 | M8 | 1 | 4,3 | M10 | 1 |
| ⋮ | ⋮ | | ⋮ | ⋮ | | ⋮ | ⋮ | | ⋮ | ⋮ | | ⋮ | ⋮ | |
| 4,4 | M(a1) | 0 | 16 | M(b1) | 0 | m,m | M5 | 0 | x,w | M7 | 1 | z,y | M10 | 0 |
| 4,4 | M(a2) | 0 | 16 | M(b2) | 0 | m,n | M6 | 1 | x,x | M8 | 0 | z,z | M11 | 1 |

CLB SITE OVERLAP TABLE

| CLB # | # OF LPs | CLB # | # OF LPs |
|---|---|---|---|
| 1,1 | 0 | 1,2 | 0 |
| 1,3 | 0 | 1,4 | 1 |
| 1,5 | 1 | 1,6 | 1 |
| 1,7 | 0 | 1,8 | 0 |
| 1,9 | 0 | 1,10 | 0 |
| 2,1 | 1 | 2,2 | 1 |
| 2,3 | 1 | 2,4 | 2 |
| 2,5 | 3 | 2,6 | 2 |
| 2,7 | 1 | 2,8 | 1 |

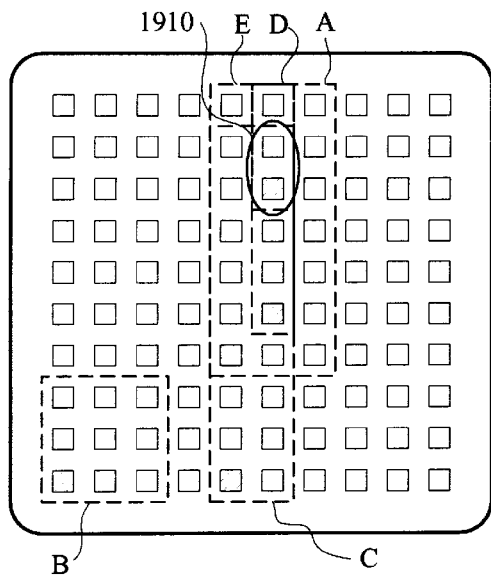
FIG. 19(A)
FIG. 19(B)
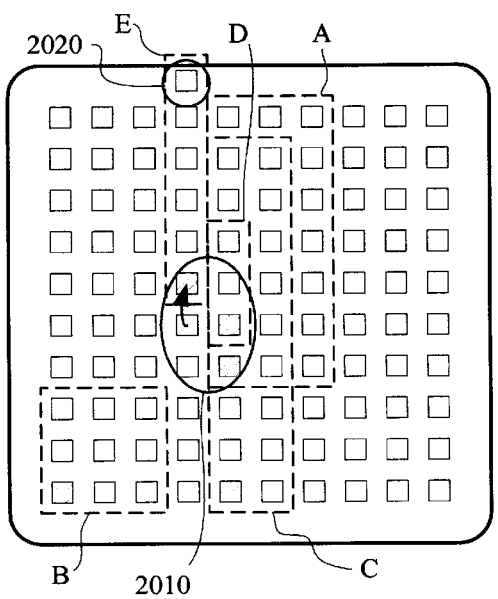
FIG. 20(A)
FIG. 20(B)

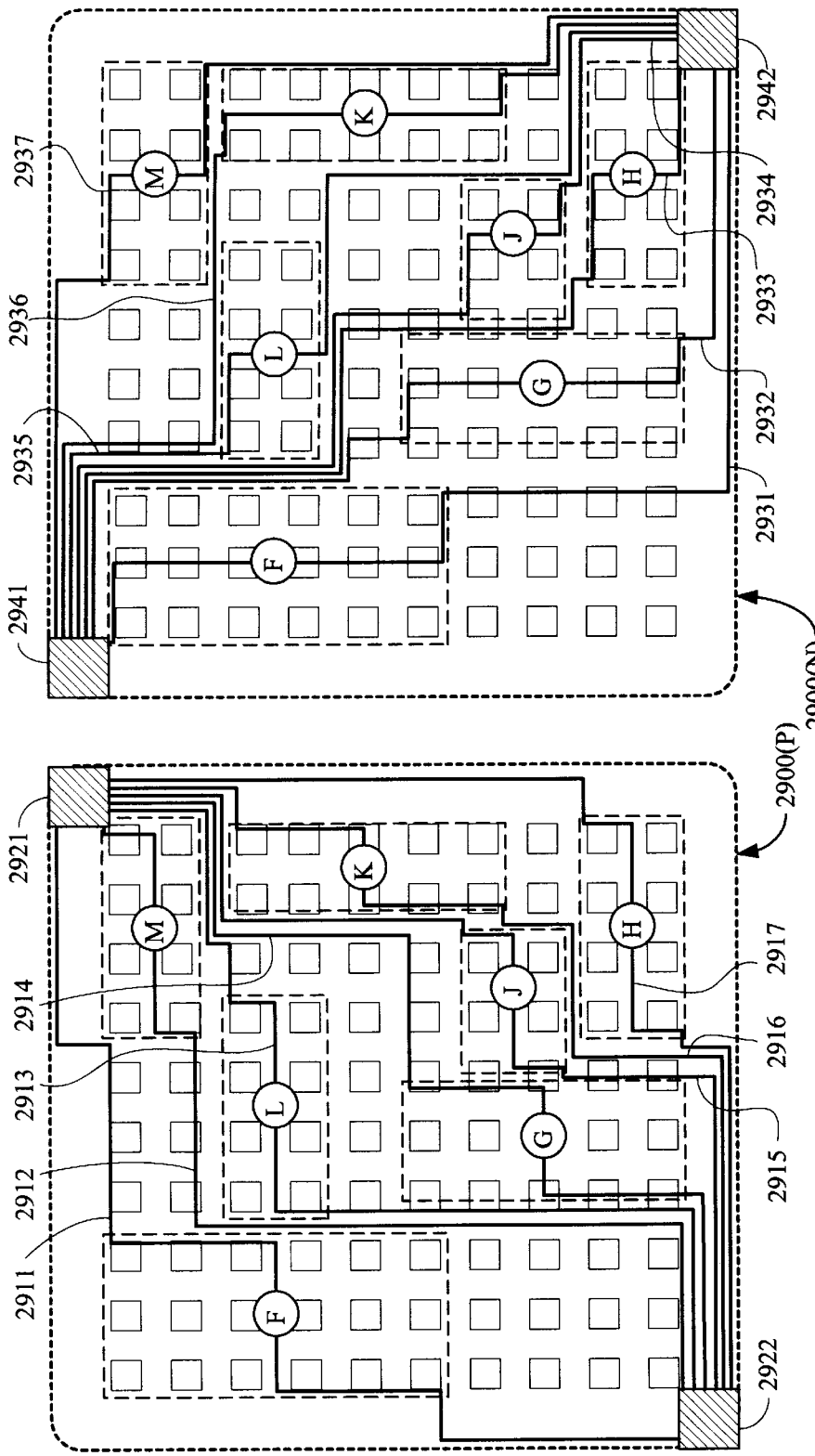
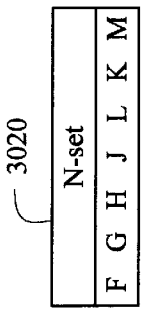
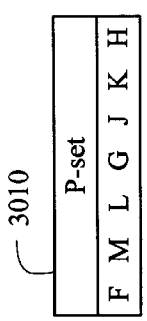

| HORIZONTAL CONSTRAINT GRAPH FEASIBILITY | | | | | | |
|---|---|---|---|---|---|---|
| HOR PATH | CORE WDTH | CORE WDTH | CORE WDTH | CORE WDTH | PATH LNGTH | FPGA WIDTH | SLACK |
| HP1 | F/3 | M/4 | — | — | 7 | 10 | 3 |
| HP2 | F/3 | L/4 | K/2 | — | 9 | 10 | 1 |
| HP3 | F/3 | G/3 | J/4 | K/2 | 12 | 10 | -2 |
| HP4 | F/3 | G/3 | H/4 | — | 10 | 10 | 0 |

| VERTICAL CONSTRAINT GRAPH FEASIBILITY | | | | | | | |
|---|---|---|---|---|---|---|---|
| VER PATH | CORE HGHT | CORE HGHT | CORE HGHT | CORE HGHT | PATH LNGTH | FPGA HGHT | SLACK |
| VP1 | $\frac{F}{6}$ | — | — | — | 6 | 10 | 4 |
| VP2 | $\frac{G}{5}$ | $\frac{L}{2}$ | $\frac{M}{2}$ | — | 9 | 10 | 1 |
| VP3 | $\frac{H}{2}$ | $\frac{J}{2}$ | $\frac{L}{2}$ | $\frac{M}{2}$ | 8 | 10 | 2 |
| VP4 | $\frac{H}{2}$ | $\frac{K}{5}$ | $\frac{M}{2}$ | — | 9 | 10 | 1 |

3420

| P-set | | | | |
|---|---|---|---|---|
| PL | V | PW | U | PR |
FIG. 40(A) — 4010
| N-set | | | | |
|---|---|---|---|---|
| NL | U | NW | V | NR |
FIG. 40(B) — 4020
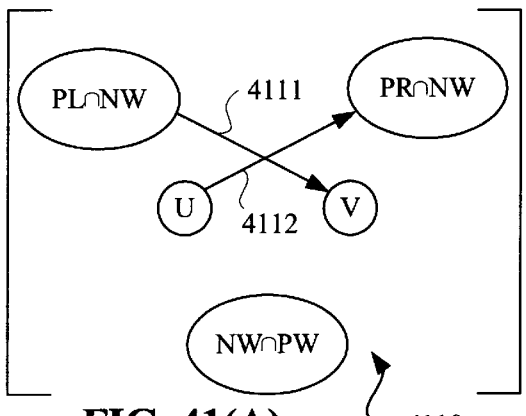
FIG. 41(A) — 4110
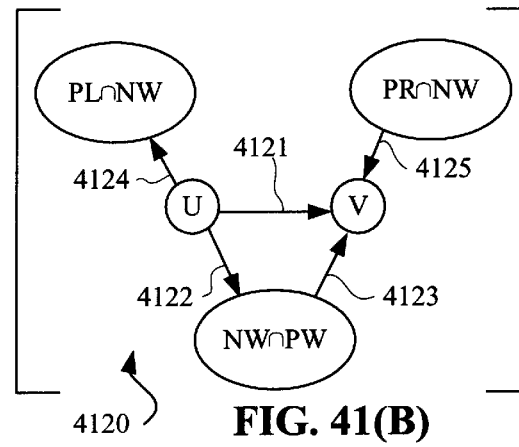
FIG. 41(B) — 4120
| P-set | | | | |
|---|---|---|---|---|
| PL | V | PW | U | PR |
FIG. 42(A) — 4210
| N-set | | | | |
|---|---|---|---|---|
| NL | (V) | NW | (U) | NR |
FIG. 42(B) — 4220
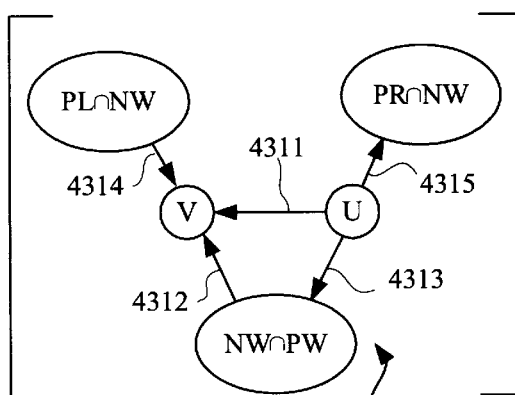
FIG. 43(A) — 4310
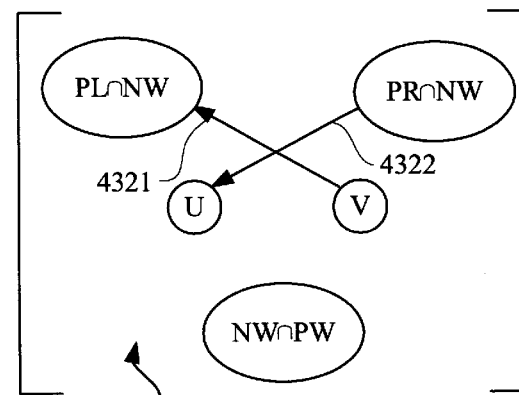
FIG. 43(B) — 4320

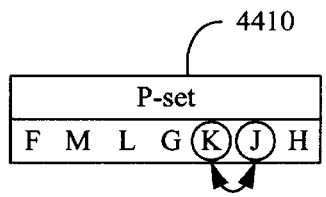
FIG. 44(A)
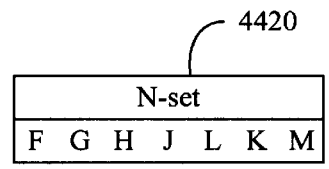
FIG. 44(B)
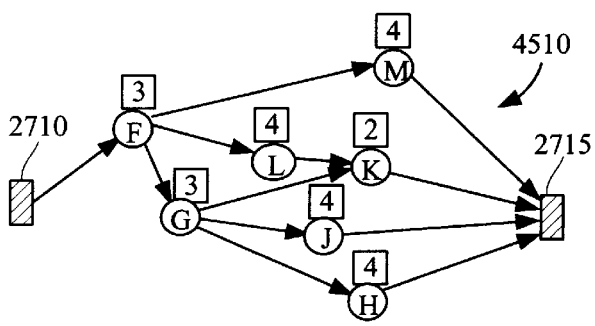
FIG. 45(A)
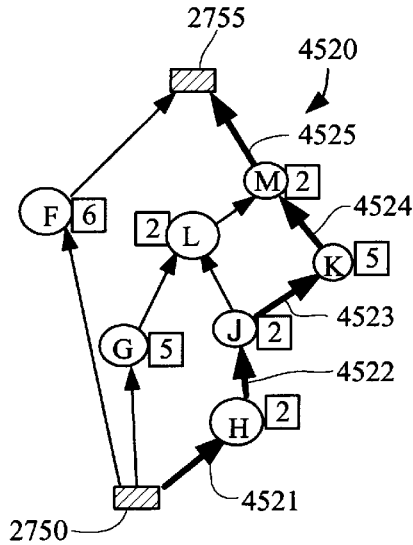
FIG. 45(B)
| VERTICAL CONSTRAINT GRAPH FEASIBILITY | | | | | | | |
|---|---|---|---|---|---|---|---|
| PATH | CORE DIST | CORE DIST | CORE DIST | CORE DIST | PATH LNGTH | FPGA HGHT | SLACK |
| 1 | F/6 | — | — | — | 6 | 10 | 4 |
| 2 | G/5 | L/2 | M/2 | — | 9 | 10 | 1 |
| 3 | H/2 | J/2 | L/2 | M/2 | 8 | 10 | 2 |
| 4 | H/2 | J/2 | K/5 | M/2 | 11 | 10 | -1 |
FIG. 46

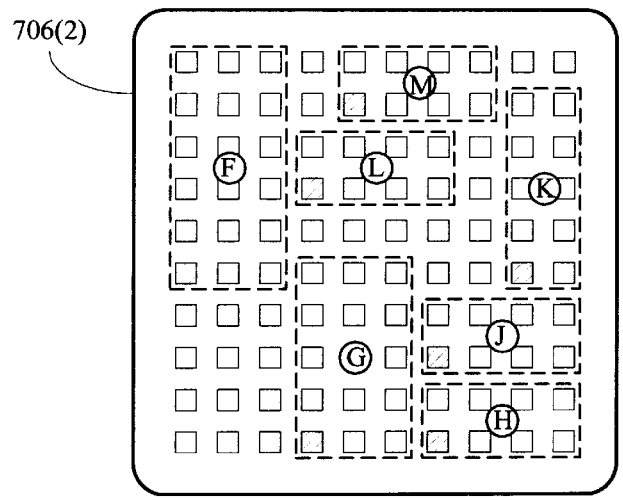
FIG. 54
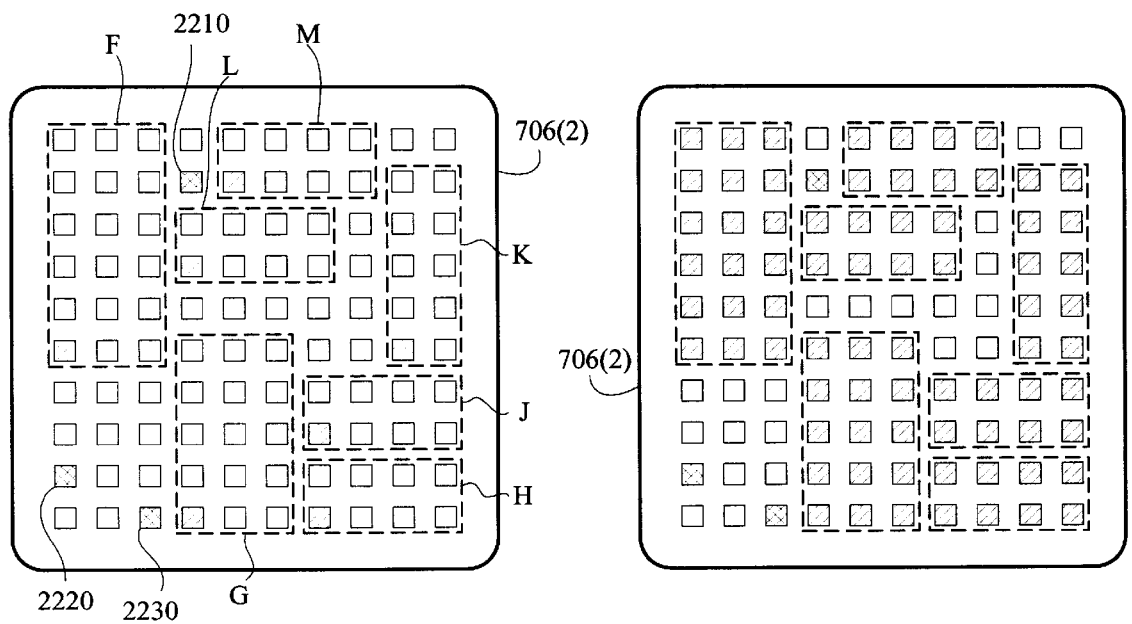
FIG. 55  FIG. 56

POST-PLACEMENT RESIDUAL OVERLAP REMOVAL METHOD FOR CORE-BASED PLD PROGRAMMING PROCESS

FIELD OF THE INVENTION

The present invention relates to programmable logic devices (PLDs), and more particularly to methods for placing logic in Field Programmable Gate Arrays (FPGAs).

BACKGROUND OF THE INVENTION

Programmable logic devices (PLDs) typically include a plurality of logic elements and associated interconnect resources that are programmed by a user to implement user-defined logic operations (e.g., an application specific circuit design). A PLD is typically programmed using programming software that is provided by the PLD's manufacturer, a personal computer or workstation capable of running the programming software, and a device programmer. In contrast, application specific integrated circuits (ASICs) have fixed-function logic circuits and fixed signal routing paths, and require a protracted layout process and an expensive fabrication process to implement a user's logic operation. Because PLDs can be utilized to implement logic operations in a relatively quick and inexpensive manner, PLDs are often preferred over ASICs for many applications.

FIG. 1(A) shows an example of a field programmable gate array (FPGA) 100, which is one type of PLD. Although greatly simplified, FPGA 100 is generally consistent with XC3000™ series FPGAs, which are produced by Xilinx, Inc. of San Jose, Calif.

FPGA 100 includes an array of configurable logic blocks CLB(1,1) through CLB(4,4) surrounded by IOBs IOB-1 through IOB-16, and programmable interconnect resources that include vertical interconnect segments 120 and horizontal interconnect segments 121 respectively extending between the rows and columns of CLBs and IOBs.

Each CLB includes configurable combinational circuitry and optional output registers that are programmed to implement logic in accordance with CLB configuration data stored in memory cells (not shown). Data is transmitted into each CLB on input wires 110 and is transmitted from each CLB on output wires 115. The configurable combinational circuitry of each CLB implement a portion of a logic operation responsive to signals received on input wires 110 in accordance with the CLB configuration data stored in that CLB's memory cells. Similarly, the optional output registers of each CLB transmit signals from the CLB onto a selected output wire 115 in accordance with the stored CLB configuration data. As discussed in further detail below, CLB configuration data for each CLB is generated by place-and-route software during a programming process. Typically, all of the CLBs of an FPGA include identical configurable circuitry, so configuration data stored in the memory cells of one CLB can be transferred to the memory cells of another CLB to allow "movement" of logic portions represented by the configuration data between the CLBs.

Each IOB includes configurable circuitry that is controlled by associated memory cells, which are programmed to store IOB configuration data during the place-and-route process. In accordance with the IOB configuration data, each IOB selectively allows an associated pin (not shown) of FPGA 100 to be used either for receiving input signals from other devices, or for transmitting output signals to other devices. Similar to the CLBs, all of the IOBs of an FPGA typically include identical configurable circuitry so that IOB configuration data can be easily transferred from one IOB to another IOB.

The programmable interconnect resources of FPGA 100 are configured using various switches to generate signal paths on which input and output signals are passed between the CLBs and IOBs to implement logic operations. These various switches include segment-to-segment switches, segment-to-CLB/IOB input switches, and CLB/IOB-to-segment output switches. Segment-to-segment switches include configurable circuitry that selectively couple wiring segments to form signal paths. Segment-to-CLB/IOB input switches include configurable circuitry that selectively connects the input wire 110 of a CLB (or IOB) to the end of a signal path. CLB/IOB-to-segment output switches include configurable circuitry that selectively connects the output wire 115 of a CLB (or IOB) to the beginning of a signal path.

FIG. 1(B) shows an example of a 6-way segment-to-segment switch 122 that selectively connects vertical wiring segments 121(1) and 121(2), and horizontal wiring segments 120(1) and 120(2), in accordance with 6-way switch configuration data stored in memory cells M1 through M6. 6-way switch 122 includes normally-open pass transistors that are turned on to provide a signal path (or branch) between any two (or more) of the wiring segments in accordance with the 6-way switch configuration data. For example, a signal path is provided between vertical wiring segment 121(1) and vertical wiring segment 121(2) by programming memory cell M5 to turn on its associated pass transistor. Similarly, a signal path is provided between vertical wiring segment 121(1) and horizontal wiring segment 120(2) by programming memory cell M1 to turn on its associated pass transistor. Similar signal paths between any two (or more) wiring segments are provided by selecting the relevant memory cell (or memory cells). Typically, the six-way configuration data stored in memory cells M1 through M6 is generated by a routing portion of the place-and-route software implemented during the programming process.

FIG. 1(C) shows an example of a segment-to-CLB/IOB input switch 123 that selectively connects an input wire 110(1) of a CLB (or IOB) to one or more interconnect wiring segments in accordance with input switch configuration data stored in memory cells M7 and M8. Segment-to-CLB/IOB input switch 123 includes a multiplexer (MUX) having inputs connected to horizontal wiring segments 120(3) through 120(5) through buffers, and an output that is connected to CLB input wire 110(1). Memory cells M7 and M8 transmit control signals on select lines of the MUX such that the MUX passes a signal from one of the wiring segments 120(3) through 120(5) to the associated CLB (or IOB). As with the 6-way switch configuration data, the input switch configuration data is generated by a routing portion of the place-and-route software implemented during the programming process.

FIG. 1(D) shows an example of a CLB/IOB-to-segment output switch 123 that selectively connects an output wire 115(1) of a CLB (or IOB) to one or more interconnect wiring segments in accordance with input switch configuration data stored in memory cells M9 through M11. CLB/IOB-to-segment output switch 124 includes three pass transistors connected between output wire 115(1) and vertical wiring segments 120(3) through 120(5), and gates that are connected memory cells M9 through M11. Memory cells M9 through M11 store output switch configuration data that turns on selected pass transistors to pass output signals from the CLB (or IOB) to one or more of wiring segments 120(3) through 120(5). As with other switch configuration data, the output switch configuration data is generated by a routing portion of the place-and-route software implemented during the programming process.

PLDs are typically programmed using configuration data generated during a PLD programming process. PLD programming processes are in part determined by the particular configurable circuit structure of the target PLD to be programmed. The PLD programming processes discussed below are specifically directed to FPGAs incorporating the configurable circuit structure described above.

FIG. 2(A) shows a block diagram generally illustrating the system utilized to generate configuration data for a target FPGA 100 such that the target FPGA implements a user's logic operation. The system includes a computer 200 and a programmer 210. The computer 200 has a memory 201 for storing software tools referred to herein as place-and-route software 202 and device programming software 203. The memory 201 also stores a computer-readable FPGA description 204, which identifies all of the interconnect resources, IOBs and CLBs of the target FPGA 100, including all of the memory cells associated with each of these elements.

The FPGA programming process typically begins when the user 230 enters the logic operation 205 into memory 201 via an input device 220 (for example, a keyboard, mouse or a floppy disk drive). The user then instructs the place-and-route software 202 to generate configuration data (place-and-route solution) which, when entered into the target FPGA device 100, programs the FPGA device 100 to implement the logic operation. The place-and-route software begins this process by accessing the FPGA description 204 and the logic operation 205. The place-and-route software 202 then divides the logic operation 205 into inter-related logic portions that can be implemented in the individual CLBs of the target FPGA 100 based on the description provided in the FPGA description 204. The place-and-route software 202 then assigns the logic portions to specific CLBs of the FPGA description 204. Routing data is then generated by identifying specific interconnect resources of the FPGA description 204 that can be linked to form the necessary signal paths between the inter-related logic portions assigned to the CLBs in a manner consistent with the logic operation 205. The placement and routing data is then combined to form the configuration data that is stored in a configuration data table 206.

FIG. 2(B) is a graphical representation of the configuration data table 206 that is part of memory 201. Configuration data table 206 includes several groups of configuration data associated with the various configurable circuits of the target PLD, such as the CLBs, IOBs, 6-way switches 122, input switches 123 and output switches 124. For example, in the graphical representation shown in FIG. 2(B), each column includes data for a particular element type, and the values (1 or 0) assigned to the associated memory cells of that element. For example, the CLB column includes CLB 1,1 (located in the upper left corner of FPGA 100 in FIG. 1) and values (VAL) assigned to associated memory cells M(a1), M(a2) . . . Similarly, the I/O column includes IOB-1 and the values assigned to associated memory cells M(b1), M(b2) . . . The memory cells associated with each 6-way switches 122, input switches 123 and output switches 124 are identified by their assigned address, and the values assigned to their memory cells are stored in a similar manner.

If the place-and-route software 202 fails to generate, for example, a routing solution for a particular target PLD (in one case, and hereinafter FPGA) 100, then the user may repeat the place-and-route operation using a different FPGA (e.g., one having more interconnect resources). Place-and-route operations and associated software are well known by those in the FPGA field.

After the place-and-route software 202 generates configuration data including memory states for all of the memory cells of target FPGA 100, the contents of configuration data table 206 are loaded into a PROM 150 (or directly into the target FPGA 100) via the programming software 203 and the programmer 210. Configuration data is loaded into PROM 150 when, for example, the target FPGA 100 includes volatile memory cells. In this case, PROM 150 is connected to special configuration pins of the target FPGA 100. When power is subsequently applied to the target FPGA 100, configuration logic provided on FPGA 100 loads the configuration data from PROM 150 into its volatile memory cells, thereby configuring FPGA 100 to implement the logic operation.

Core-based PLD programming methods were developed to shorten the PLD programming process by allowing logic designers to represent large portions of their logic operations with "black box" symbols referred to herein as "cores". Relatively simple logic operations are typically easily generated at a logic gate level by logic design personnel using, for example, CAD-based circuit design software, and then placed and routed in a relatively short amount of time using basic PLD programming methods. Conversely, the generation of relatively complex logic operations at a gate level is time consuming and tedious. To reduce the burden on logic designers, core-based programming includes a library of "cores" (sometimes referred to as "macros") that are associated with large, commonly-used logic functions, such as counters. Cores are selected from the library and incorporated into complex logic operations as single elements. Each core includes predefined configuration data that is typically implemented in several CLBs and associated interconnect resources to generate the particular logic function that is defined by that core. Therefore, core-based PLD programming reduces the time required to generate a complex logic operation by allowing a circuit designer to implement a large, commonly-used logic function of their large logic operation using a single core selected from the core library.

Core libraries are typically included in the PLD programming software provided by the manufacturer of a PLD. Examples of circuit cores available in the XACT™ programming software available from Xilinx, Inc. that are provided for programming XC4000™ series FPGAs include FIR filters, 16-bit multipliers, Fast Fourier Transforms (FFTs) and large adders. These cores are often represented by configuration data that requires the use of several CLBs arranged in a particular pattern on a target FPGA.

FIGS. 3(A) and 3(B) are diagrams illustrating examples of two hypothetical cores. The cores shown in FIGS. 3(A) and 3(B) are greatly simplified for explanatory purposes, and are not typically implemented in the manner described in this example. Further, also for explanatory purposes, each CLB is assumed to include configurable logic that can implement only one logic gate. Typically, actual cores are include significantly more logic than that shown in these examples, and actual CLBs include configurable logic that can implement more than one logic gate.

FIG. 3(A) shows a first example of a core 310 implementing an RS flip flop made up of four NAND gates. Core 310 includes CLB configuration data for memory cells associated with four CLBs such that each CLB implements one two-input NAND gate. In addition, core 310 includes switch configuration data for memory cells associated with the interconnect resources required to provide signal paths for input signals S, R and CP, output signals Q and Q', and the intermediate signal paths between the CLBs. Typically, a logic designer cannot alter the configuration data associated with core 310 from its original CLB assignment pattern.

For example, core 310 requires four CLBs arranged in the two-by-two CLB assignment pattern shown in FIG. 3(A). When core 310 is implemented on a target FPGA, the place-and-route software places core 310 into four CLBs of the target FPGA that are arranged in the two-by-two pattern shown in FIG. 3(A).

FIG. 3(B) shows another example of a core 320 for a four-input multiplexer that is implemented by four three-input AND gates, two inverters and one four-input OR gate. Core 320 includes the CLB configuration data associated with the memory states of the seven CLBs required to implement the logic gates. In addition, core 320 includes switch configuration data associated with the memory cells of the interconnect resources required to provide signal paths for input signals I0, I1, I2, I3, S0 and S1, output signal Y, and the intermediate signal paths between the CLBs. Similar to core 310 (see FIG. 3(A)), eight CLBs arranged in the two-by-four CLB assignment pattern shown in FIG. 3(B) are required to implement core 320 (i.e., the one unused CLB is typically not available for implementing other logic).

Although core-based PLD programming methods provide a more convenient vehicle for circuit designers to generate complex logic operations, they introduce certain constraints that complicate the place-and-route methods typically utilized during PLD programming. These complications are described in the following paragraphs.

FIGS. 4(A) and 4(B) are graphical representations of placement arrangements showing five cores A, B, C, D and E placed on a target FPGA 400. FPGA 400 has 100 CLBs 410 arranged in 10 rows and 10 columns. The placement of core A is indicated by the dashed-line box located around the top seven rows in the right-most three columns of FPGA 400, and by the shaded CLBs located within the dashed box. Cores B. C, D and E are similarly identified.

FIGS. 4(A) and 4(B) employ graphical representations that are intended to illustrate the provisional placement and subsequent relocation (movement) of logic portions relative to CLB sites during the place-and-route portion of a PLD programming process in accordance with known methods. That is, although FIGS. 4(A) and 4(B) may appear to indicate that cores A, B, C, D and E are placed in CLBs of an actual FPGA, these figures are mere graphical representations of the provisional placement arrangements defined in configuration data table 206 (see FIG. 2(B)). Programming of an actual FPGA 400 takes place after the place-and-route software has determined an acceptable placement and routing solution.

In the graphical representations used herein, the "movement" of cores relative to the CLB sites indicates that configuration data associated with the logic portions assigned to a first group of CLB sites has been reassigned to a second group of CLB sites in configuration data table 206. For example, core A is moved from a first group of CLB sites located on the right edge of CLB 400 (shown in FIG. 4(A)) to a second group of CLB sites located on the left edge of CLB 400 (FIG. 4(B)). During this move, the upper left logic portion of core A is moved from CLB site CLB(1,8) in FIG. 4(A) to CLB site CLB(1,1) in FIG. 4(B). Typically, core movement is implemented by a gradual migration of the core from an initial position to a final position, where each step of the gradual migration includes an incremental shift of configuration data from one CLB site to an adjacent CLB site.

As used herein, the term "annealing" refers to a part of the placement process in which initially-placed logic portions are re-allocated in an attempt to form an optimal place-and-route solution based on user-defined criteria or other considerations. For example, assume that FIG. 4(A) illustrates one possible example of an initial placement of cores A, B, C, D and E during the place-and-route process. Further, assume that FIG. 4(B) illustrates an optimal arrangement of these cores based on criteria supplied by the user (e.g., the user requires all of the cores to be closely packed along the left edge of the target FPGA 400). Annealing methods are used to move the cores between the CLBs of FPGA 400 from the initial placement arrangement shown in FIG. 4(A) in an attempt to find the optimal placement solution show in FIG. 4(B).

Annealing methods for core-based PLD programming methods can be generally divided into two types: a non-overlapping annealing method type in which overlapping (i.e., assigning logic portions from two or more cores to a single CLB site) is not permitted, and an overlapping method type in which overlapping is permitted. These two method types are illustrated in FIGS. 5(A) through 6(D).

FIGS. 5(A) and 5(B) illustrate the first annealing method type wherein overlapping is not permitted. FIG. 5(A) is a graphical representation showing how the CLB assignment arrangements of large cores prevent free movement of the cores. As shown in FIG. 5(B), configuration data table 206(1) provides only a single memory value location for each memory cell of each CLB. Therefore, overlapping is precluded because each memory cell of a CLB site can hold data for only one core. Because cores must maintain their CLB assignment arrangement, large cores (such as core C) "block" the migration of other cores. For example, as shown in FIG. 5(A), the elongated core C is centrally located between cores A and cores B, D and E. In addition, core C is mapped into nine of the ten CLB sites associated with two columns of CLBs, leaving only the first row of these columns free for the assignment of logic portions. Therefore, only cores that have CLB assignment arrangements that are one CLB high (i.e., are entirely located in a single CLB row) are permitted to migrate past core C. As a result, the movement of core A from the right side to the left side of FPGA 400 is blocked by core C because core A is assigned to seven CLB rows. Likewise, the movement of cores D and E from the left side to the right side of FPGA 400 is blocked by core C because core D and E are assigned to three and six CLB rows, respectively.

FIGS. 6(A) through 6(D) illustrate the second annealing method type in which core overlaps are permitted during migration. As shown in FIG. 6(A), as core A migrates toward the left side of FPGA 400 (as indicated by the arrow), some of the logic portions of core A overlap some of the logic portions of core C. Specifically, a group 610 of twelve CLB sites (surrounded by the oval) in the fifth and sixth columns of FPGA 400 are concurrently assigned to both core A and core C. This creates an overlap condition in which logic portions of cores A and C are provisionally mapped into the same CLB sites. of course, this overlap condition must be removed in the final placement solution, but is tolerated during the annealing process because it allows the placement software to find the optimal placement solution (e.g., in which core A is migrated to the left of core C). As shown in FIG. 6(B), when core A is migrated fully to the left (i.e., situated above core B), an overlap is produced between core A and cores D and E. To relieve this overlap, for example, cores D and E are migrated to the right side of core C, as indicated by the arrows. Subsequent annealing procedures result in the optimal placement solution shown in FIG. 4(B).

Although overlap permissive annealing methods are desirable because they produce optimal placement solutions, they require a large amount of memory, and require a very long "run" time for the place-and-route software to find an optimal placement solution. Two such overlap permissive annealing methods are described below, and are referred to as a fixed memory annealing method and a "allocate/de-allocate on the fly" annealing method.

FIG. 6(C) shows a representation of memory storing a first modified configuration data table 206(2) in accordance with the fixed memory annealing method. In accordance with the fixed memory annealing method, several sets of configuration data memory are reserved for storing overlap information. For example, as shown in FIG. 6(C), modified configuration data table 206(2) includes five pre-defined sets of memory locations (FPGA-1 through FPGA-5) that allow up to five overlapping cores to be provisionally assigned to a single CLB site. For example, when cores A through E are in the initial placement arrangement shown in FIG. 4(A), where no overlaps exist, all of the configuration data is stored in a primary memory location (e.g., in memory set FPGA-1). Subsequently, as core A migrates from the initial placement arrangement to the overlapping condition shown in FIG. 5(A), the CLB sites initially occupied by logic portions of core C are overlapped by logic portions of core A. To accommodate this overlap, the logic portions of core A are stored in a secondary memory set (e.g., FPGA-2). Similarly, subsequent overlapping conditions are stored in secondary memory sets FPGA-3, FPGA-4 and FPGA-5.

There are several problems associated with the fixed memory annealing method. First, the number of overlapping cores is limited to the number of memory sets. For example, the modified configuration data table 206(2) shown in FIG. 6(C) is limited to five overlapping cores. If a sixth core migrates to a CLB site already occupied by five other cores, then the migration of the sixth core must be rejected as an illegal move. Another problem associated with fixed memory annealing methods is that, even when relatively few memory sets are provided, vast amounts of memory are required. The use of large amounts of memory can result in slower processing in some memory-restricted systems.

FIG. 6(D) shows a representation of memory storing a second modified configuration data table 206(3) in accordance with the "allocate on the fly" annealing method. Instead of fixed memory locations, the "allocate on the fly" annealing method uses a first (FPGA-PRIMARY) memory, and a multipurpose temporary (FPGA-TEMP) memory that is configured as necessary to store the overlap data for any given CLB site. For example, when cores A through E are in the initial placement arrangement shown in FIG. 4(A), where no overlaps exist, all of the configuration data is stored in the FPGA-PRIMARY memory. Subsequently, as core A migrates from the initial placement arrangement to the overlapping condition shown in FIG. 5(A), the CLB sites initially occupied by logic portions of core C are overlapped by logic portions of core A. To accommodate this overlap, portions of the FPGA-TEMP memory are addressed to identify the CLB sites in which the overlap occurs, and the logic portions of overlapping core A are stored in these newly-addressed memory locations. For example, assume a logic portion of core C is stored in CLB site 1,2 (identified as 1,1,2 in FIG. 6(D)) of the FPGA-PRIMARY memory set, and a subsequent migration by core A causes an overlap at CLB site 1,2. To accommodate this overlap, the placement software generates a secondary memory location in the FPGA-TEMP memory set (identified as 2,1,2 in FIG. 6(D)), then transfers the overlap data to the secondary memory location. Similarly, subsequent overlapping conditions are stored in the FPGA-TEMP memory set as memory location 3,1,2, 4,1,2, etc.

The "allocate on the fly" annealing method has certain advantages over the fixed memory annealing method because it does not require large amounts of reserved memory, and because it can allow a virtually unlimited number of overlaps at a given CLB site. However, the "allocate on the fly" annealing method is time intensive because it requires the placement-and-routing software to generate and address the temporary memory locations during the placement process.

Another problem with overlap permissive annealing methods is that they sometimes produce "optimal" placement solutions that include one or more overlapping cores. As mentioned above, overlap permissive annealing methods generate infeasible intermediate states (i.e., wherein overlaps between the cores exist) in the course of iterative placement improvement. The use of infeasible intermediate states provides great flexibility to the optimization process, thereby hastening the progress towards an optimal solution. To ensure that the overlaps are completely removed by the end of the placement phase, placement algorithms dynamically increase the overlap-related weights as the optimization proceeds. While progressively increasing the penalty for overlaps during annealing successfully removes all overlaps in most cases, it cannot guarantee that overlaps will be removed in all cases. This is especially true in the programming of PLDs, such as FPGAS, where the number of sites (CLBs) into which the logic portions may be placed is fixed. Also, because very few overlaps remain at the end of the placement process, it is desirable to obtain a feasible placement solution (with no overlaps) that is as close to the original infeasible solution as possible.

What is needed is a post-placement residual overlap removal method for use with overlap-permissive annealing processes that identifies the minimal placement change necessary to generate a feasible placement solution while removing all overlaps.

SUMMARY OF THE INVENTION

The present invention is directed to a post-placement residual overlap removal method for use in core-based programmable logic device (PLD) programming processes that is called when the "optimal" placement solution generated by an overlap-permissive annealing process is infeasible (i.e., includes one or more overlapping cores). The residual overlap removal method is particularly useful for core-based PLD programming processes directed to, for example, field programmable gate arrays (FPGAs) that include configurable logic blocks arranged in a two-dimensional pattern (e.g., rows and columns). The post-placement residual overlap removal method analyses the two-dimensional positional relationships between the cores of the infeasible placement solution. It then determines a combination of core movements in two dimensions (e.g., horizontally along the rows, and vertically along the columns) that are required to remove the overlaps while minimizing differences between a final feasible placement solution and the infeasible placement solution. However, two-dimensional analysis is difficult to implement using a computer. Therefore, the residual overlap removal process of the present invention separates the two-dimensional positional relationship into two one-dimensional positional relationships, thereby greatly facilitating implementation by a computer. Further, because the residual overlap removal process can be utilized in a computer, it is possible to remove overlaps from placement solutions that may be too complicated for solution by intuitive (i.e., manual) or other methods.

The post-placement residual overlap removal process according to an embodiment of the present invention begins by isolating the cores associated with a placement solution (i.e., temporarily removing individual logic portions from the infeasible placement solution). Horizontal and vertical constraint graphs are then created that mathematically define the two-dimensional positional relationship between the cores of the placement solution in two separate one-dimensional (i.e., horizontal and vertical) directions. Next, the constraint graphs are analyzed to determine whether they are feasible (i.e., whether the overlaps existing in the placement solution can be removed simply by reallocating available resources to the overlapping cores). If one of the constraint graphs is not feasible, then the infeasible constraint graph is revised to remove an infeasible connection, and the feasibility of both constraint graphs is again analyzed. The feasibility analysis and constraint graph revision process are repeated until both of the constraint graphs are feasible. A slack allocation process is then performed wherein slack is distributed in the vertical and horizontal constraint graphs to generate a revised placement solution in which the cores are positioned as close to the original infeasible solution as possible with no overlaps. Finally, the individual logic portions are replaced using bipartite matching to complete the revised placement solution.

In accordance with an embodiment of the present invention, the creation of constraint graphs begins by determining the two-dimensional relationship between the edges of each core relative to the edges of other cores and to the edges of the target FPGA. The edges of overlapping cores are then modified to eliminate the overlap. A set of positive and negative loci are then identified that are determined by the location of each core relative to the other cores and to the edges of the target FPGA. A positive sorted set (P-set) and a negative sorted set (N-set) are then created in which the cores are respectively ordered in accordance to the positive and negative loci. Finally, horizontal and vertical constraint graphs are formed that include paths determined by the P-set and N-set.

The horizontal and vertical constraint graphs represent the two-dimensional positional relationship of the cores associated with the infeasible placement solution in terms of two one-dimensional positional relationships, thereby greatly facilitating implementation by a computer. The horizontal constraint graph includes data associated with the width (i.e., along the rows) of each core, along with horizontal distances (arcs) between each core in the infeasible placement solution. Similarly, the vertical constraint graph includes data associated with the height (i.e., along the columns) of each core, along with vertical distances (arcs) between each core in the infeasible placement solution. Overlaps are indicated by negative arc values in the horizontal and vertical constraint graphs.

The final objective of the residual overlap removal process is to reposition the cores in the horizontal and vertical constraint graphs such that all negative arc lengths (indicating overlaps) values in the horizontal and vertical constraint graphs are changed to zero (or a positive number). Ideally, this should be achieved with a minimal change in the value of the other (non-negative) arcs. Any change in arc lengths between the original arc lengths (associated with the infeasible placement solution) and the final placement data (i.e., after revision) represents movement of the cores from the original "optimal" placement solution. Therefore, the objective of the present residual overlap removal process is to eliminate negative arc lengths while minimizing changes to all other arc lengths in the final placement solution.

The first step toward the elimination of negative arc lengths is to determine whether the horizontal and vertical constraint graphs are feasible. To facilitate this feasibility analysis, each constraint graph includes paths which define positional restrictions on each core based on its positional relationship to other cores located above or below (in the vertical constraint graph), or to the sides (in the horizontal constraint graphs) of that core. For example, if a first group of CLBs of a row are assigned to a first core, and a second group of CLBs of the same row are assigned to a second core, then the first and second cores are assigned to the same horizontal path in the horizontal constraint graph. Subsequent movement of the first core along the row is restricted by the presence of the second core. Similarly, vertical paths are determined by the presence of cores along the columns of CLBs. Feasibility of the constraint graphs is determined by the width/height of all of the cores in each path. In other words, if the sum of the widths of the cores in a horizontal path is less than the total width of the target FPGA, then the path is considered feasible because a negative arc value can typically be eliminated by shifting the position of the cores along the path. However, if the sum of the widths of the cores in a horizontal path is greater than the total width of the target FPGA, then no amount of shifting along the path will eliminate negative arc values from the path. Therefore, when such a path exists in a constraint graph, the constraint graph is considered infeasible.

In accordance with an embodiment of the present invention, the process of revising infeasible constraint graphs begins by selecting a critical path from an infeasible constraint graph. A critical path is one in which the total width/height of the cores in that path exceed the resources available in the target FPGA. Next, a critical arc or a critical core of the critical path is selected. The critical arc or critical core is determined based on the effect (e.g., cost) that its removal from the critical path would have on the horizontal and vertical constraint graphs. The cores located on each end of the critical arc are then exchanged in either the P-set or the N-set such that the critical arc is removed from the critical path. Alternatively, the critical core is moved in either the P-set or the N-set such that the critical core is removed from the critical path. Finally, the horizontal and vertical constraint graphs are reformulated using the revised P-set and N-set, and then the feasibility of the reformulated constraint graphs is re-analyzed.

After both constraint graphs are feasible, a slack allocation process is performed to determine how much slack is available in each path for adjustment of core positions, and how this slack is distributed among the various arcs so that the final position of each core is as close to its original position as possible without overlapping. In accordance with an embodiment of the present invention, the slack allocation process begins by determining the original arc lengths (arc weights) for all arcs in the revised horizontal and vertical constraint graphs. Next, a minimum path slack is calculated for each arc, and a maximum path weight is calculated for each arc. The minimum path slack value for a particular arc indicates the maximum length that arc can be assigned, as determined by all of the paths passing through that arc. The maximum path weight value for a particular arc is the weight value (representing total length of all arcs) associated with the path passing through that arc that has the greatest weight value of all paths passing through the arc. The final arc length for each arc is then calculated by multiplying the original arc weight times the minimum path slack for that arc, and then dividing by the maximum path weight for the arc. Finally, the final arc lengths are used to reposition the cores to form a final placement solution.

BRIEF DESCRIPTION OF THE DRAWINGS

FIG. 1(A) is a diagram showing a portion of simplified prior art FPGA.

FIGS. 1(B), 1(C) and 1(D) are diagrams showing switch circuits utilized to route signals in the FPGA of FIG. 1(A).

FIGS. 4(A) and 4(B) are diagrams respectively illustrating examples of initial (rough) and final (optimal) placement solutions of cores relative to the CLB sites of a target FPGA.

FIGS. 5(A) and 5(B) are diagrams respectively illustrating a prior art annealing process wherein overlapping is not permitted, and an example of a memory structure associated with the annealing process.

FIGS. 6(A) and 6(B) are diagrams respectively illustrating a second prior art annealing process in which overlapping is permitted.

FIGS. 6(C) and 6(D) are diagrams representing memory arrangements used in the prior art annealing process in which overlapping is permitted.

FIGS. 19(A) and 19(B) are diagrams representing the multiple overlap of cores on a target PLD and resulting CLB site overlap table values.

FIGS. 20(A) and 20(B) are diagrams representing the placement of cores and resulting CLB site assignment memory table in accordance with a second embodiment of the present invention.

FIGS. 29(A) and 29(B) are graphical representations illustrating positive and negative loci sets, respectively.

FIGS. 30(A) and 30(B) are diagrams including a positive sorted set (P-set) and a negative sorted set (N-set) that list the order in which the cores are arranged in the positive loci set and negative loci set, respectively.

FIGS. 40(A) and 40(B) are diagrams showing examples of a P-set and an N-set, respectively, that list sample cores U and V relative to other cores in a generalized placement solution.

FIGS. 41(A) and 41(B) are a horizontal constraint graph and a vertical constraint graph, respectively, that are generated by the P-set and N-set of FIGS. 40(A) and 40(B).

FIGS. 42(A) and 42(B) are diagrams showing the P-set and N-set, respectively, in which sample cores U and V are exchanged to eliminate an arc in the vertical constraint graph.

FIGS. 43(A) and 43(B) are a horizontal constraint graph and a vertical constraint graph, respectively, that are modified in response to the core exchange shown in the P-set and N-set of FIGS. 42(A) and 42(B).

FIGS. 44(A) and 44(B) are diagrams showing the P-set and N-set, respectively, in which cores J and K of the second logic operation are exchanged to eliminate a critical arc from the horizontal constraint graph shown in FIG. 33.

FIGS. 45(A) and 45(B) are a horizontal constraint graph and a vertical constraint graph, respectively, that are modified in response to the core exchange shown in the P-set and N-set of FIGS. 44(A) and 44(B).

FIG. 46 shows a vertical constraint graph feasibility table that includes data associated with the vertical constraint graph shown in FIG. 45(B) that is used during a second application of the constraint graph feasibility analysis.

FIG. 54 is a graphical representation of configuration data showing the final placement solution of the cores associated with the second logic operation.

FIG. 55 is a graphical representation of configuration data shown in FIG. 54, as modified to include individual logic portions of the second logic operation.

FIG. 56 is a graphical representation of configuration data shown in FIG. 55, as modified to include non-reference logic portions associated with the cores of the second logic operation.

DETAILED DESCRIPTION OF THE DRAWINGS

The present invention is directed to placement and annealing methods utilized during PLD programming processes, and particularly to PLD programming processes directed to FPGAs, such as FPGA 100 (FIG. 1(A). Although the placement and annealing methods are described below with reference to FPGAs, these methods may be beneficially utilized in other types of PLDs. Therefore, the appended claims should not necessarily be limited to methods for programming FPGAs.

Figures 7, 8A:
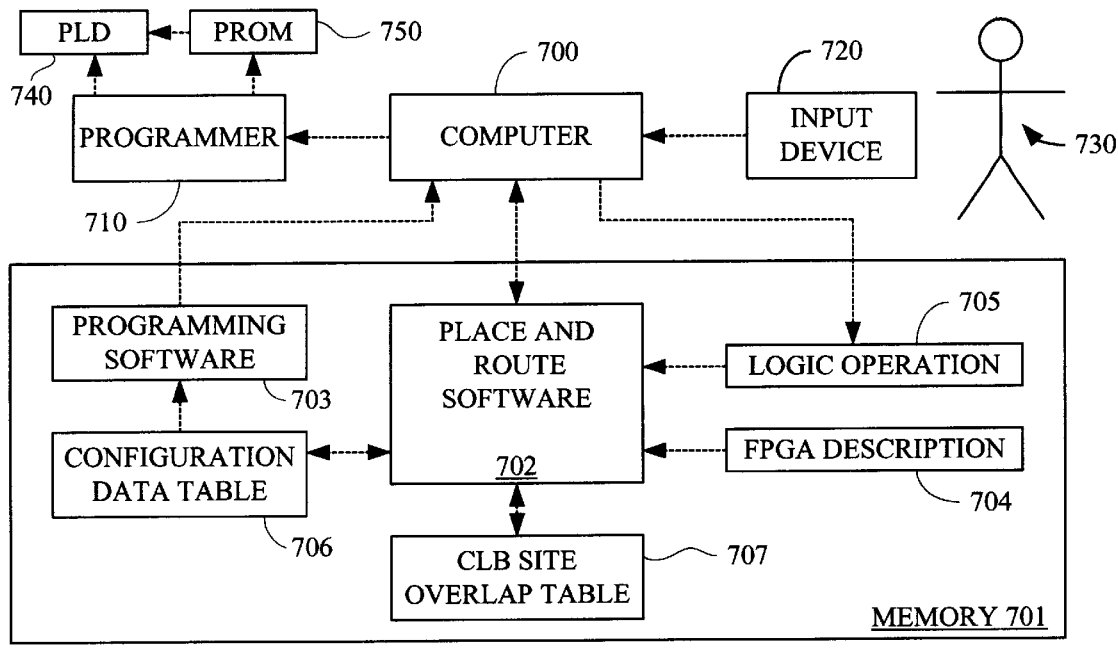
FIG. 7 is a block diagram showing a system utilized to program a PLD in accordance with the present invention.
FIGS. 8(A), 8(B) and 8(C) are diagrams depicting data tables utilized by place and route software in accordance with the present invention.

FIG. 7 shows a block diagram generally illustrating a system utilized to generate configuration data for programming a target FPGA 740 in accordance with one embodiment of the present invention. The system includes a computer 700 and a programmer 710. Computer 700 has a memory 701 for storing software tools including place-and-route software 702 and device programming software 703. Memory 701 also stores a computer-readable FPGA description 704, which identifies all of the interconnect resources, IOBs and CLBs of the target FPGA 740, including all of the memory cells associated with each of these elements. In addition, a portion of memory 701 is reserved for configuration data table 706 and a CLB site overlap table 707.

Figures 8B, 8C:
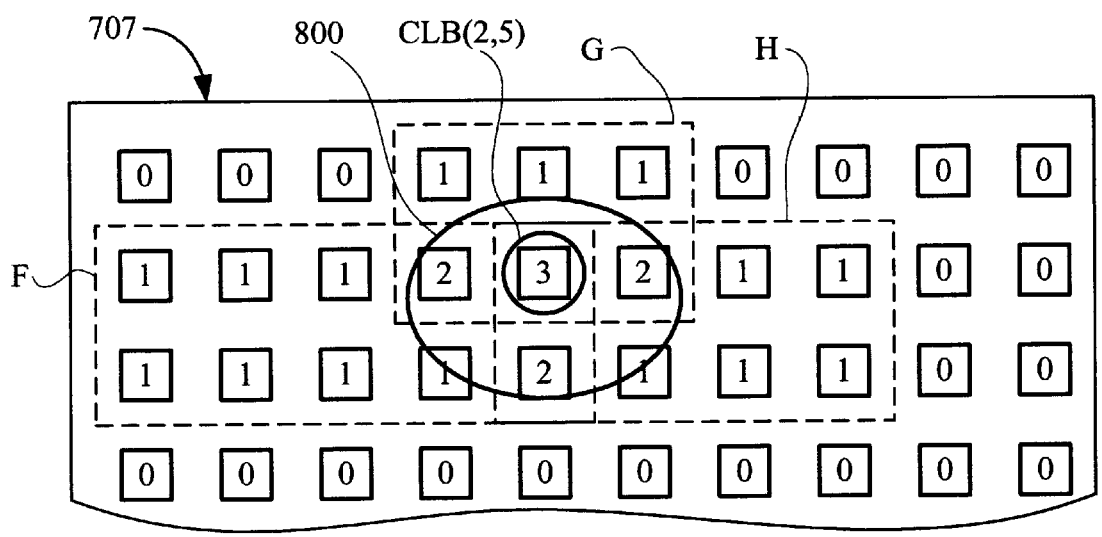

FIGS. 8(A), 8(B) and 8(C) provide graphical representations of configuration data table 706 and CLB site overlap table 707. These graphical representations, along with similar graphical representations in other FIGS. addressed below, are provided merely to describe one possible embodiment of table data 706 and CLB site overlap table 707. Therefore, the appended claims should not necessarily be limited by the graphical representations provided in the figures.

Figures 2A, 2B:
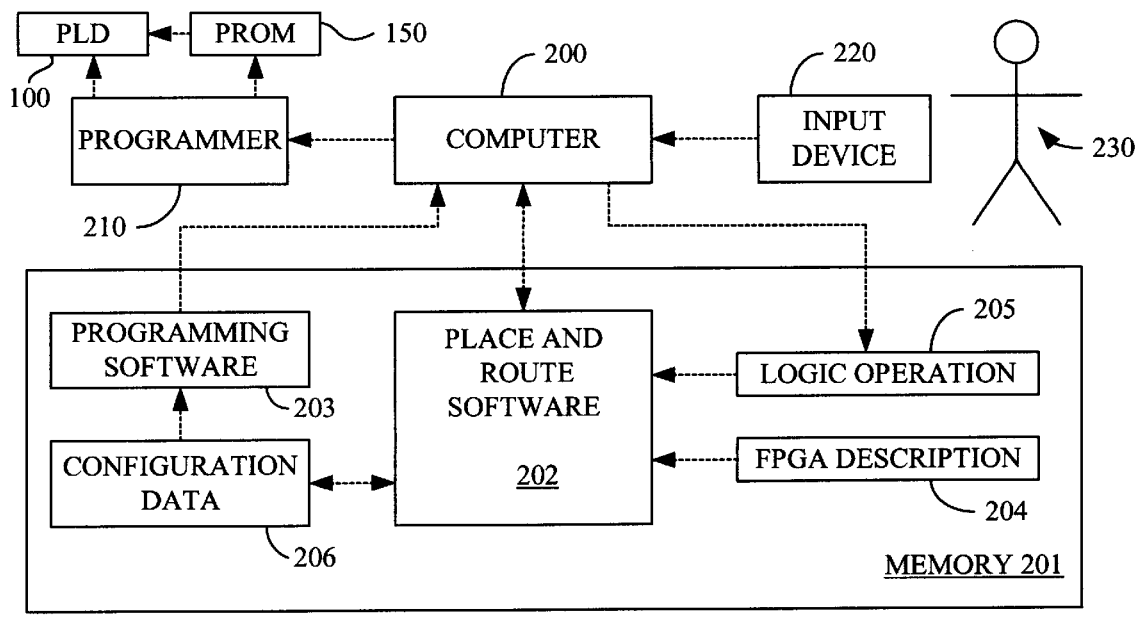
FIG. 2(A) is a block diagram showing a known system utilized to program an FPGA.
FIG. 2(B) is a diagram depicting a configuration data table for storing configuration data generated by place and route software using the known system shown in FIG. 2(A).
Figure 3A:
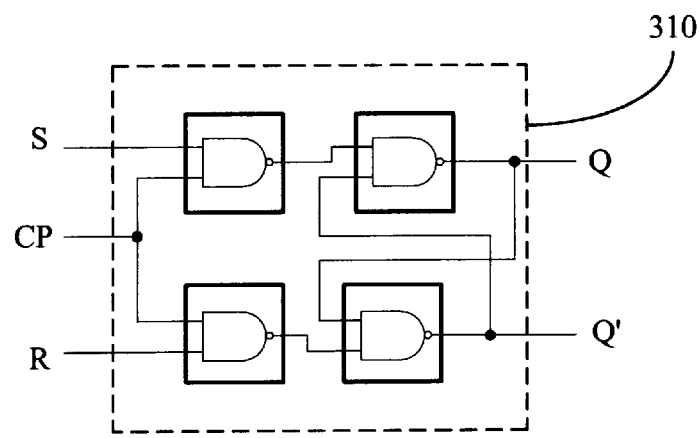
FIGS. 3(A) and 3(B) are diagrams showing simplified examples of cores used during core-based PLD programming.
Figure 3B:
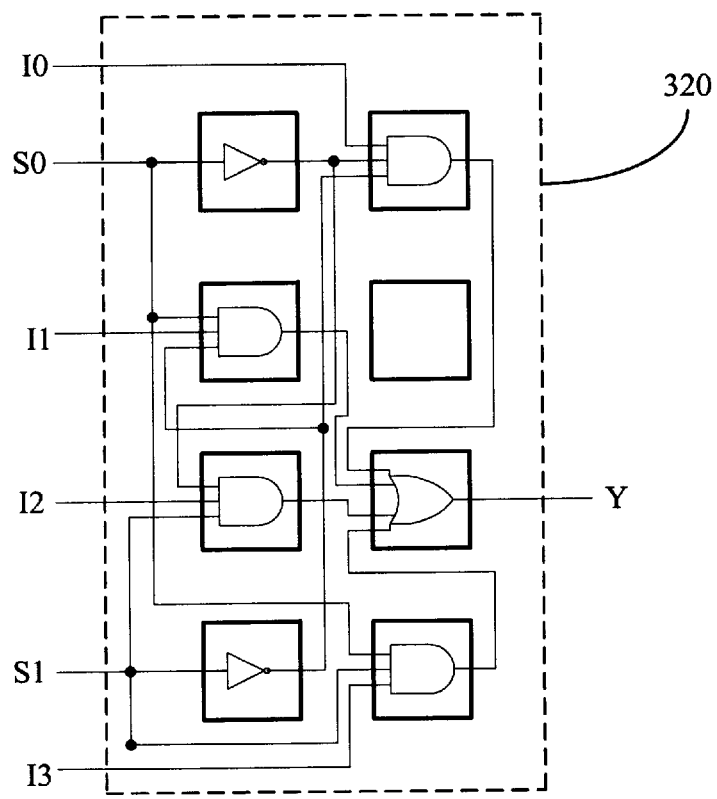

FIG. 8(A) is a graphical representation of configuration data table 706 that is stored in memory 701. Configuration data table 706 is similar to configuration data table 206 of the prior art system shown in FIG. 2(A) in that configuration data table 706 includes memory locations associated with the memory cells of the various configurable circuits associated with FPGA 740, such as the CLBS, IOBs, and interconnect resources. However, as described below, the place-and-route software associated with the present invention utilizes configuration data table 706 in a manner different from that employed in the prior art. In general, during the placement and annealing processes, only a portion of each core is stored in configuration data table 706, thereby leaving a large portion of configuration data table 706 available for core migration.

FIGS. 8(B) and 8(C) are alternative representations of CLB site overlap table 707 that is also stored in memory 701. FIG. 8(B) is a diagram showing CLB site overlap table 707 using a table representation, and FIG. 8(C) is a diagram indicating the information of CLB site overlap table 707 using a graphical representation.

Referring to FIG. 8(B), CLB site overlap table 707 stores an integer value in column "# OF LPs" that is associated with each CLB site identified in the column "CLB #". The "# OF LPs" value is determined by the number of overlapping logic portions assigned to the associated CLB site, which is determined by the location of cores during the placement and annealing processes. The "# of LPs" value is further explained with reference to the graphical representation shown in FIG. 8(C).

FIG. 8(C) is a graphical representation of CLB site overlap table 707 wherein cores F, G and H are placed on an FPGA having ten rows and ten columns CLBs (only the top four rows of CLB sites are shown). Each square indicates one CLB site, and the integer located within each square indicates the current number of logic portions assigned to that CLB site. For example, at the moment depicted in FIG. 8(C), cores F, G and H are positioned as indicated by the dashed-line boxes surrounding groups of CLB sites. Specifically, core F is located in the second and third rows and extends from the first column (left edge) to the sixth column of CLBs. Similarly, core G is located in the top two rows and fourth through sixth columns, and core H is located in the second and third rows and fifth through eighth columns. The placement of cores F, G and H creates an overlap group 800. Overlap group 800 includes four CLB sites that are each assigned at least two logic portions. CLB site CLB(2,5) is assigned one logic portion from each of the three cores F, G and H. As discussed in further detail below, the CLB site overlap table allows the placement and annealing processes of the present invention to determine an optimal solution using overlap permissive annealing methods without requiring vast amounts of memory and run time. Specifically, because only a single integer value is stored for each CLB site, very little memory is necessary to provide an overlap permissive annealing method. When used in conjunction with the above-mentioned practice of placing only a portion of each core in configuration data table 706, an overlap permissive annealing method is provided in accordance with the present invention that is extremely fast and memory efficient.

Referring again to FIG. 7, the FPGA programming process begins when the user 730 enters the logic operation 705 into memory 701 via an input device 720 (for example, a keyboard, mouse or a floppy disk drive). User 730 then instructs the place-and-route software 702 to generate configuration data (place-and-route solution) which, when entered into the target FPGA device 740, programs the FPGA device 740 to implement the logic operation. This configuration data, which includes memory state data for all of the memory cells of target FPGA 740, is stored in configuration data table 706. Finally, the contents of configuration data table 706 are loaded into a PROM 750 (or directly into the target FPGA 740) via the programming software 703 and the programmer 710.

Figure 9:
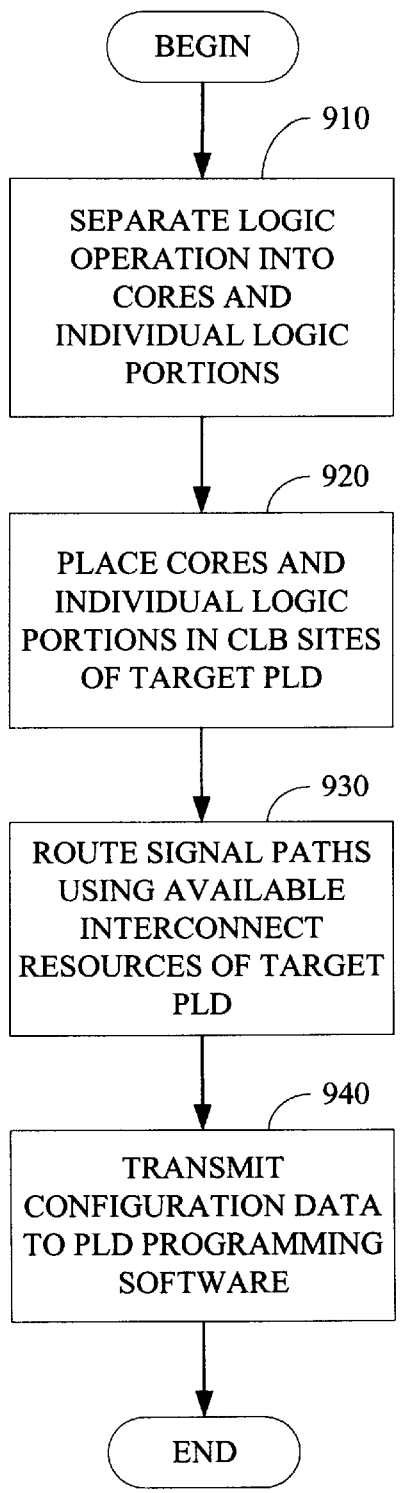
FIG. 9 is a flow diagram showing the basic steps of a PLD programming method in accordance with the present invention.

FIG. 9 is a flow diagram illustrating the basic steps associated with a PLD programming process incorporating the placement and annealing methods of the present invention. As in prior art processes, the PLD programming process begins by accessing a computer-readable FPGA description and a description of the user-defined logic operation, and then separates the user-defined logic operation into pre-defined cores and other inter-related logic portions that can be implemented in the individual CLBs of the target FPGA 740 (Step 910). The place-and-route software then places (assigns) the logic portions into initial CLB sites (Step 920). A routing process is then performed in which signal paths connecting the assigned CLBs are routed (Step 930). Specifically, during the routing process, the place-and-route software identifies specific interconnect resources from the FPGA description that form the necessary signal paths between the placed logic portions. The placement and routing solutions are then combined to form FPGA configuration data (Step 940) that is utilized to configure an actual FPGA device.

In the disclosed embodiments described below, steps 910, 930 and 940 of the PLD programming process are implemented using methods well known by those in the FPGA field. Therefore, these steps will not be discussed further.

Figure 10:
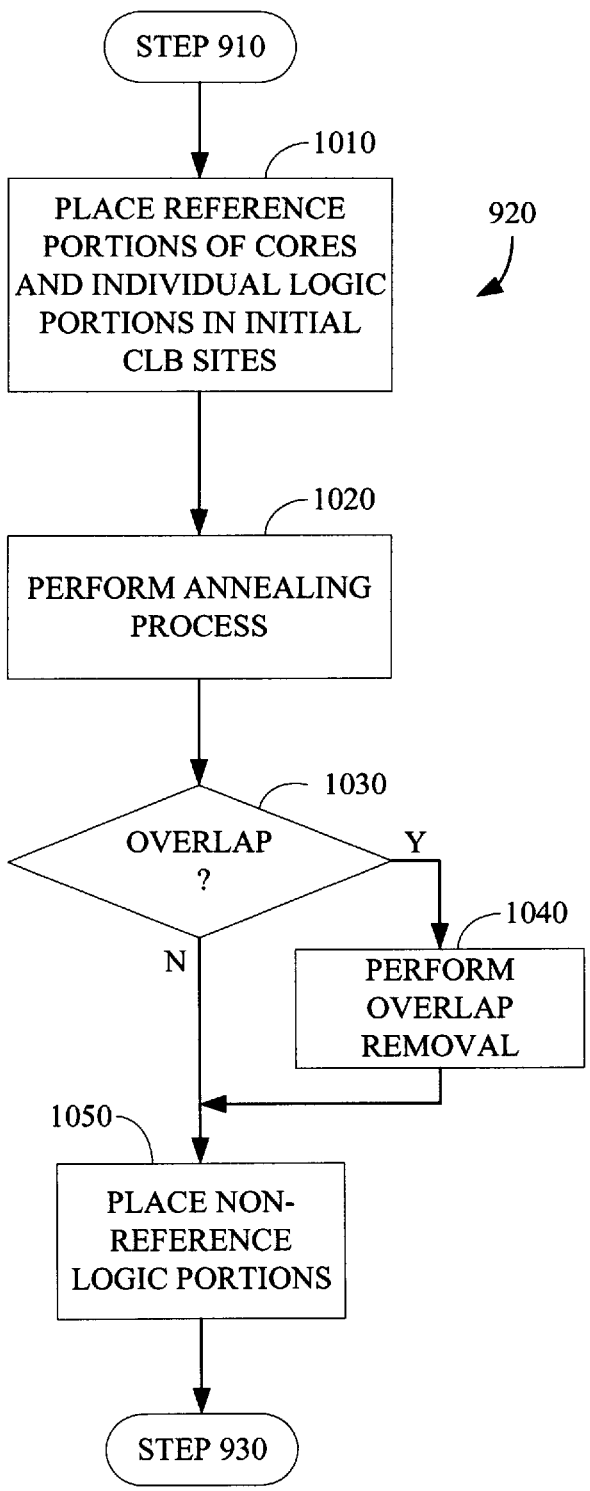
FIG. 10 is a flow diagram showing the steps associated with a placement process utilized in the PLD programming method of FIG. 9.

FIG. 10 is a flow diagram showing the basic steps performed during the placement process (Step 920) of the PLD programming process in accordance with the present invention. The placement process begins by placing each core and individual logic portion of the logic operation into an initial CLB site (Step 1010). In accordance with the present invention, only pre-determined reference logic portions associated with each of the cores is placed in Step 1010-other logic portions (referred to as non-reference logic portions) of the each core are not placed. In addition, an initial cost (i.e., a numerical value representing the relative "goodness" of a placement arrangement) is determined for the initial placement arrangement. An annealing process is then performed to optimize the placement arrangement by seeking a placement solution having an optimal (lowest) cost (Step 1020). In accordance with a second aspect of the present invention, only the placed reference logic portions and individual logic portions are moved during the annealing process, thereby allowing virtually unrestricted migration of the cores. After a placement arrangement having an optimal cost is found, the annealed placement arrangement is checked to determine whether there are any residual overlapping cores (Step 1030). If overlaps exist, then an overlap removal process is performed in accordance with a third aspect of the present invention to eliminate the overlap condition (Step 1040). After the overlap removal method generates a refined placement solution, or if the overlap removal process is not performed, the non-reference logic portions associated with the cores of the logic operation are placed in the unassigned CLB sites (Step 1050). With a final placement solution stored in configuration data table 706, control passes back to the main program for execution of a routing process (Step 930).

Initial Placement Process

Figure 11:
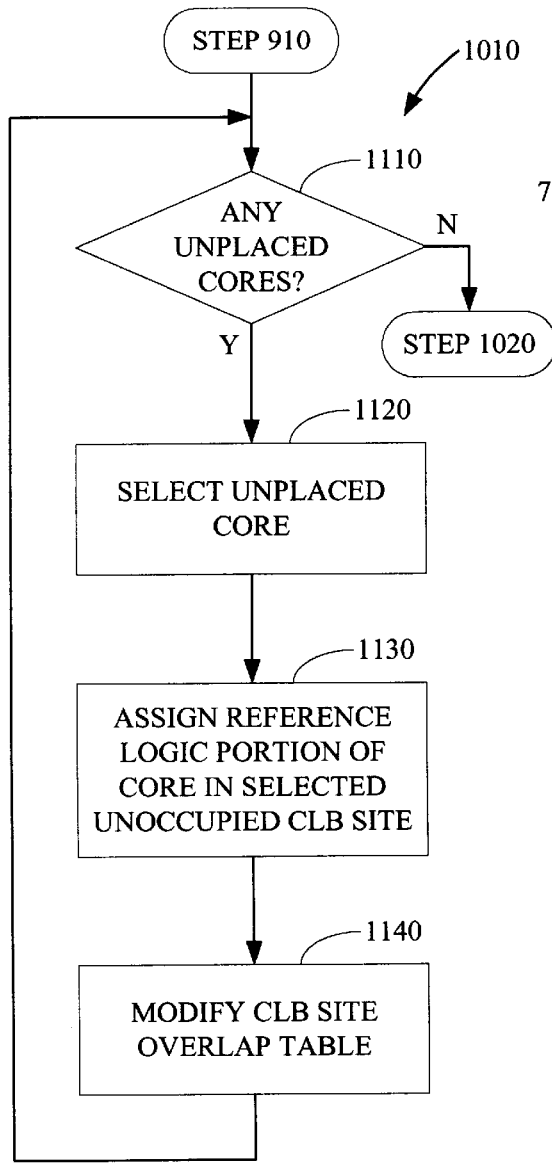
FIG. 11 is a flow diagram showing a process for initially placing cores that is utilized in the placement process of FIG. 10.

FIG. 11 is a flow diagram showing the process steps associated with the initial placement of reference logic portions and individual logic portions (Step 1010, FIG. 10) in accordance with a first aspect of the present invention.

The existence of unplaced cores (or individual logic portions) is determined in Step 1110. If any unplaced cores or individual logic portions exist, control passes to Step 1120.

The placement process selects an unplaced core in Step 1120. The selection of an unplaced core may be random, or based on the characteristics of all unplaced cores (i.e., such that the largest unplaced core is selected first, and individual logic portions are selected last). After all cores are placed, individual logic portions are then selected and placed. Control then passes to Step 1130.

In Step 1130, the selected core is placed in the CLB portion of configuration data table 706 (see FIGS. 7 and 8(A)). In accordance with the first aspect, only a reference logic portion of each core is placed in configuration data table 706 during Step 1130. The other (non-reference) logic portions of the core are not placed in configuration data table 706 until Step 1050 (discussed below). Note that the selection of a reference logic portion for each core can be determined by, for example, the logic portion that receives input data from or transmits output data on a signal path (net) having the most significant timing constraint. The reference logic portion may also be selected based on its position relative to the other logic portions of the core. For example, in the examples used herein, the logic portion of each core that is located in a lower, leftmost portion of the core. Of course, the selection of a reference logic portion for an individual logic portion is trivial because, by definition, the individual logic portion includes only one logic portion.

Figure 12A:
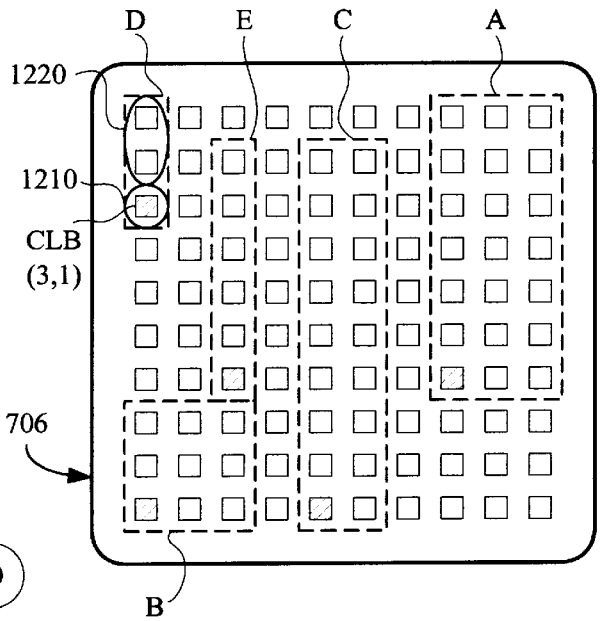
FIGS. 12(A) and 12(B) are diagrams depicting modifications to the computer memory during the initial placement process of FIG. 11.

FIG. 12(A) is a graphical representation of configuration data table 706 showing an example in which cores A through E are initially placed in an FPGA having one hundred CLBs arranged in ten rows and ten columns. Each of the cores A through E includes several logic portions that are arranged in the patterns indicated by the dashed-line boxes shown in FIG. 12(A). For example, core D includes three logic portions arranged in a one-by-three pattern. Similarly, core A includes twenty-one logic portions arranged in a three-by-seven pattern, core B includes nine logic portions arranged in a three-by-three pattern, core C includes eighteen logic portions arranged in a two-by-nine pattern, and core E includes six logic portions arranged in a one-by-six pattern.

When a selected core is initially placed in accordance with Step 1130, only the configuration data associated with the reference logic portion of the selected core is placed in a CLB site. For example, when core D is initially placed, reference logic portion 1210 is placed in a selected CLB cite in configuration data table 706 (indicated by the shaded box representing the CLB site at the third row, first column of configuration data table 706). Non-reference logic portions 1220 of core D are not placed. In other words, the configuration data associated with the non-reference logic portions 1220 of core D is not stored in the CLB sites that are located above reference logic portion 1210 (this is indicated by the empty boxes in the first and second rows, first column of configuration data table 706). Similarly, only the reference logic portions of cores A, B, C and E are placed (indicated by the shaded box in within the dashed-line boxes indicated each of these cores).

After the reference logic portion of the selected core is placed in a selected CLB site in configuration data table 706, control passes to Step 1140.

In Step 1140, the placement of the selected core is registered in the CLB site overlap table 707 by modifying the "# OF LPs" values of the associated CLB sites (see FIGS. 7, 8(B) and 8(C)). Specifically, the number of logic portions (# OF LPs) value for each CLB site in CLB site overlap table 707 is "0" (zero) before any cores are placed. When a selected core is placed in accordance with Step 1130, the number of logic portions (# OF LPs) value is increased at each CLB site in CLB site overlap table 707 corresponding to the placement position of both the reference logic portion and the non-reference logic portion(s) of the selected core. As previously discussed, each core typically includes two or more logic portions in a fixed relationship (e.g., a four logic portion core may be arranged in a two-by-two or one-by-four pattern). Because of the fixed relationship between the logic portions, if the placement location (i.e., CLB site location) of the reference logic portion is known, then the placement location of each of the non-reference logic portion is easily determined based on its position in the pattern relative to the reference logic portion. Therefore, after the reference logic portion of the selected core is placed in Step 1130, the number of logic portion (# OF LPs) value for each CLB site of the CLB site overlap table 707 associated with a logic portion of the selected core is easily identified and incremented. Note that each individual logic portion only changes the "# OF LPs" value of the CLB site in CLB site overlap table 707 that is assigned to the individual logic portion.

Figure 12B:
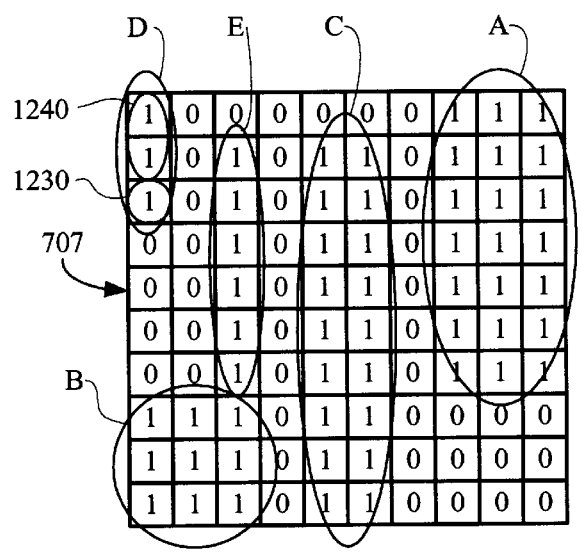

FIG. 12(B) is a graphical representation showing an example of how CLB site overlap table 707 is modified to include information representing the initial placement of cores A through E in accordance with Step 1140. When CLB site overlap table 707 is modified in accordance with Step 1140 to reflect the placement of a selected core, the "# OF LPs" value corresponding to the CLB site associated with the placement location of the reference logic portion of the selected logic portion is increased by one. In addition, the "# OF LPs" value corresponding to the CLB sites identified by the pattern of non-reference logic portions of the selected core are also incrementally increased. For example, when CLB site overlap table 707 is modified to indicate the placement of core D in the position shown in FIG. 12(A), the CLB site 1230 is incrementally increased by one to indicate the placement of the reference logic portion of core D. In addition, CLB sites 1240 are also increases by one to indicate the presence of the non-reference logic portions of core D. Similarly, CLB site overlap table 707 is modified to indicate the placement of cores A, B, C and E (indicated by the ovals).

After CLB site overlap table 707 is modified in Step 1140, control passes back to Step 1110.

The loop formed by Steps 1110 through 1140 is repeated until all of the cores are initially placed in configuration data table 706 according to Step 1130, and CLB site overlap table 707 is updated to indicate the initial placement according to Step 1140. Individual (non-core) logic portions are also placed. When all of the cores and individual logic portions associated with a logic operation are initially placed, control passes to the annealing process (Step 1020).

Annealing Process

Figure 13:
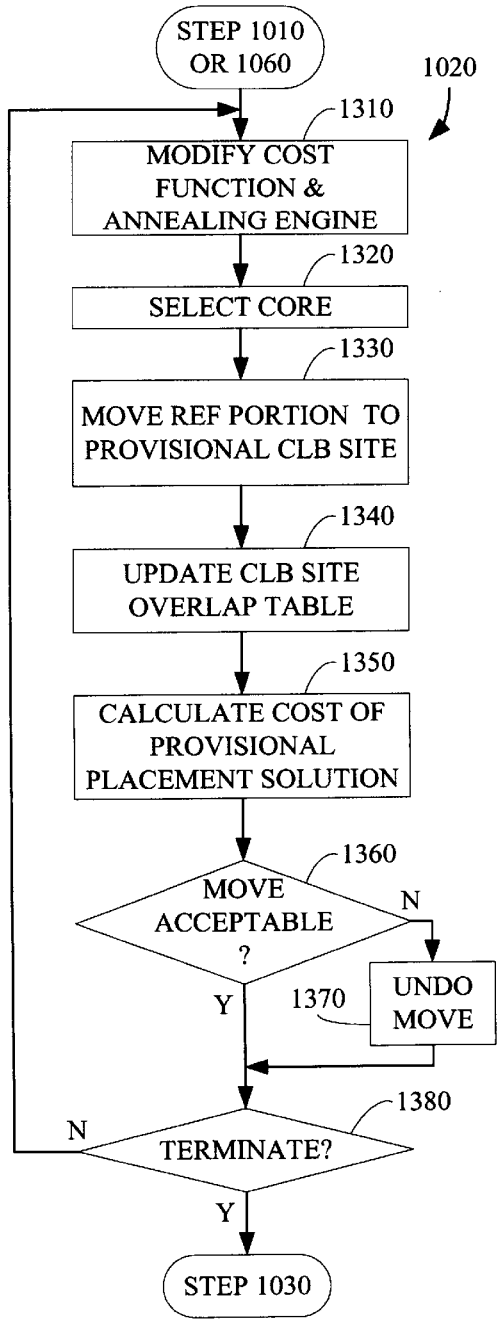
FIG. 13 is a flow diagram showing an annealing process that is utilized in the placement process of FIG. 10.

FIG. 13 is a flow diagram showing the annealing process (Step 1020, FIG. 10) in accordance with a second aspect of the present invention.

The annealing process begins by modifying one or more variables associated with a cost function and an annealing engine utilized to identify the optimal routing solution (Step 1310). A core is then selected (Step 1320), and the reference portion of the selected core is incrementally moved to a provisional CLB site (Step 1330). The CLB site update table is then updated to reflect the provisional movement of the core (Step 1340) and the cost of the provisional placement solution (i.e., the placement solution associated with the provisional movement of the selected core) is then calculated (Step 1350). The acceptability of the provisional movement is then determined based on the cost change associated with the provisional placement solution (Step 1360), and the provisional move is undone if this cost change is not acceptable (Step 1370). Steps 1310 through 1370 are repeated until an "optimal" placement solution is found (Step 1380).

Returning to Step 1310, modification of the cost function and annealing engine parameters is discussed first. It is noted, however, that the modification of the cost function and annealing engine parameters can be performed at other points during the annealing process.

The "cost" of a placement solution is a numerical value calculated in accordance with several factors associated with the relative location of the portions of a logic operation in the placement solution. A cost function is typically used to determine the cost of a placement solution. The cost function generates a value that is based on several factors including, for example, estimated total wire length, estimated signal path timing and the number of overlapping logic portions associated with the placement solution. For example, the cost of a placement solution may be calculated using the following cost function:

$$\text{Cost} = [Ww \times (\text{estimated total wire length})] + [Wt \times (\text{signal path timing})] + [Wo \times (\text{number of overlaps})].$$

In the above cost function, Ww is a weighting coefficient that is multiplied by the total estimated wire length associated with a placement solution. For example, if the cores of a logic operation are placed far apart, the amount of wire required to transmit signals between the cores is typically larger than if the cores were closely spaced. The Ww weighting factor is determined based on the importance a user places on the wire length. For example, if the user wishes for the cores to be closely spaced, then the Ww weighting factor is increased. Conversely, if the user doesn't care about core spacing, the Ww weighting factor may be decreased. With all other factors being equal, a larger Ww weighting factor has a greater influence on the cost of a placement solution than a smaller Ww weighting factor, thereby driving the annealing engine (discussed below) toward a placement solution wherein the cores are closely spaced.

In addition, in the above cost function equation, Wt is a weighting coefficient that is multiplied by the total estimated signal path timing associated with a placement solution. Similar to the estimated wiring length of a placement solution, signal path timing is based on the relative placement of the cores. However, signal path timing is also determined on the importance placed on certain signal paths (called "critical nets") of the logic operation. A placement solution that requires a long signal path for a critical net increases the total signal path timing estimate. Similar to the Ww weighting coefficient, the Wt weighting coefficient is adjusted to indicate the relative importance placed on the signal path timing of a placement solution. For example, if the user wishes to minimize signal path timing for all critical nets, then the Wt weighting factor is increased. Conversely, if the user doesn't care about signal path timing, the Wt weighting factor may be decreased. With all other factors being equal, a larger Wt weighting factor has a greater influence on the cost of a placement solution than a smaller Wt weighting factor, thereby driving the annealing engine toward a placement solution wherein the signal path timing of critical nets is minimized.

Finally, in the above cost function equation, Wo is a weighting coefficient that is multiplied by the number of overlapping logic portions during the annealing process. As discussed above, CLB site overlap table 707 indicates the number of overlapping logic portions in a placement arrangement. For example, if all of the cores of a logic operation include logic portions placed in the same CLB site, the number of overlapping logic portions is typically much larger than if the core were spaced apart. In accordance with the present invention, the Wo weighting coefficient is modified throughout the annealing process to encourage overlapping during the early stages of the annealing process, and to discourage overlapping during the later stages. Specifically, the Wo weighting coefficient is initially set at a relatively low value, and is increased at a gradual rate during the annealing process. As a result, the "Wo x (number of overlaps)" portion of the cost function is insignificant during the initial passes through the annealing process loop (i.e., Steps 1310 through 1380; see FIG. 13), and is highly significant during the later passes. This modification (i.e., gradual increase) of the Wo weighting coefficient is executed during Step 1310 based on, for example, the number of times Step 1310 was previously executed.

As mentioned above, in addition to modifications to the cost function, a cost engine is also modified in Step 1310. A "cost engine" is a mathematical relationship that is used to determine whether to accept or reject a particular incremental adjustment to a placement solution. In effect, the cost engine "drives" the migration of cores toward an optimal placement solution by rejecting incremental movements that increase the cost of a particular placement solution over a predetermined amount. In one embodiment, the cost engine is represented by the following relationship:

$$e^{-\delta C/TEMP} < RAND(1,0)$$

In the above annealing engine relationship, "δC" is the incremental change in cost caused by the incremental movement of a core (as discussed below), TEMP is the "temperature" of the annealing process, and "RAND(1,0)" is a random number that is between 0 (zero) and 1 (one). In accordance with the annealing engine relationship, an incremental movement is rejected when the value $e^{-\delta C/TEMP}$ is less than the RAND(1,0) value.

Similar to the Wo weighting coefficient of the cost function, the TEMP value of the annealing engine relationship is modified at step 1310 so that the annealing engine is more tolerant of core movements early in the annealing process that increase cost. In particular, the TEMP value is initially set relatively high, and is gradually decreased during the later stages of the annealing process. In one embodiment, the TEMP value is decreased by a fixed amount each time the cost improvement of a given single move is not significantly different (i.e., 10% or less) from the best cost improvement achieved over a previous fixed number (e.g., 10,000) of consecutive core moves. A relatively large TEMP value causes $e^{-\delta C/TEMP}$ to be close to 1 (one) even for moves that significantly increase cost, thereby causing the annealing engine to accept most incremental movements. The TEMP value is decreased as the annealing process proceeds such that the δC generated by a particular move more significantly affects $e^{-\delta C/TEMP}$. As a result, a proportionally larger percentage of moves are rejected.

Figure 14A:
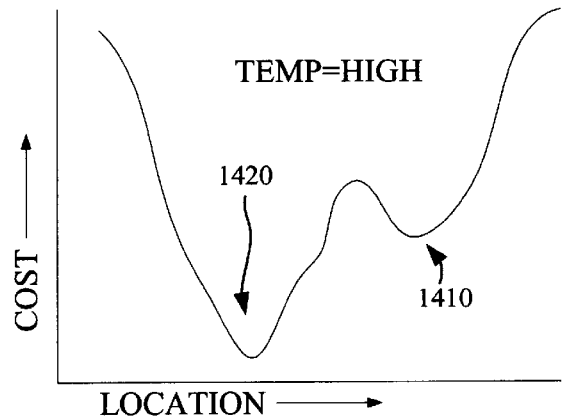
FIGS. 14(A) through 14(C) are diagrams indicating how an annealing engine is changed during the annealing process of FIG. 13.
Figure 14B:
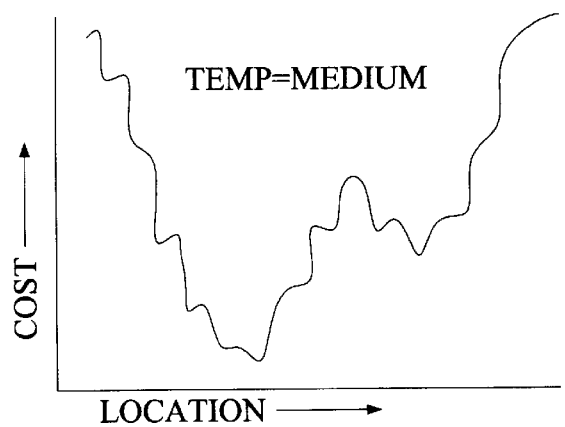
Figure 14C:
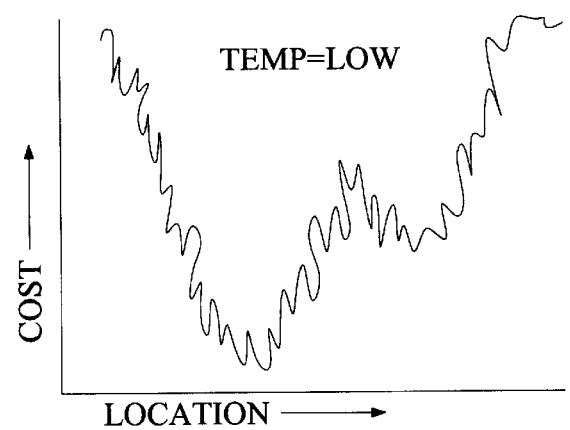

FIGS. 14(A) through 14(C) are graphs illustrating the effect of the TEMP value on the annealing engine. As shown in FIG. 14(A), when the TEMP value is high, the annealing engine is less sensitive to the effect of core location on cost. That is, because the annealing engine only rejects movements that significant increase cost, the high TEMP value tends to "smooth out" the COST/LOCATION curve. As a result, the annealing engine is more likely to move out of relative cost minimums, such as point 1410, and toward absolute cost minimum 1420 associated with the optimal placement solution. As the annealing process proceeds, the TEMP value is decreased to a "medium" value, thereby increasing the number of relative cost minimums such that the annealing engine tends to accept placement solutions that are more localized on the COST/LOCATION curve. Finally, as shown in FIG. 14(C), the TEMP value is decreased to a "low" value, thereby further increasing the number of relative cost minimums such that the annealing engine tends to accept placement solutions that are even more localized on the COST/LOCATION curve.

Referring back to FIG. 13, after the cost function variables are adjusted, control passes to Step 1320.

In Step 1320, a core is randomly selected for incremental movement (migration). In one embodiment, a core may be selected randomly from among the placed cores. In another embodiment, a core may be selected based on other criteria, such as timing constraint considerations. During the annealing process, individual logic portions are treated as special case cores. Control then passes to Step 1330.

In Step 1330, the reference logic portion of the selected core is moved incrementally from its current (initial) placement location to a provisional placement location in an adjacent CLB site. In one embodiment, the "direction" in which the reference logic portion is moved is randomly selected. The only restriction placed on the reference portion movement is that a reference portion may not move into a CLB site already occupied by the reference logic portion of another core.

Figure 15A:
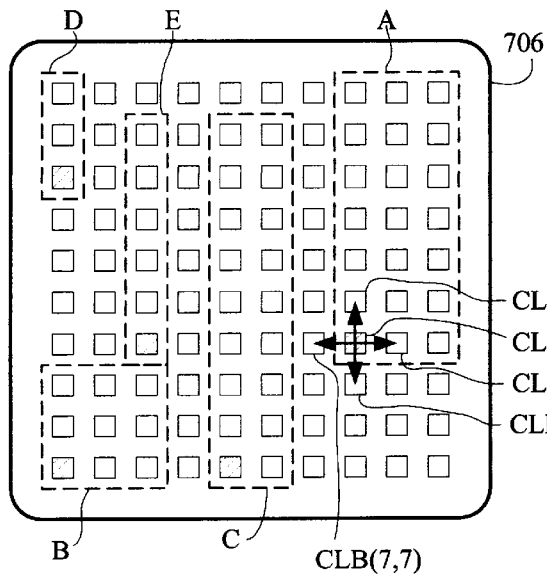
FIGS. 15(A) and 15(B) are diagrams illustrating the incremental movement of a selected core in accordance with the annealing process of FIG. 13.
Figure 15B:
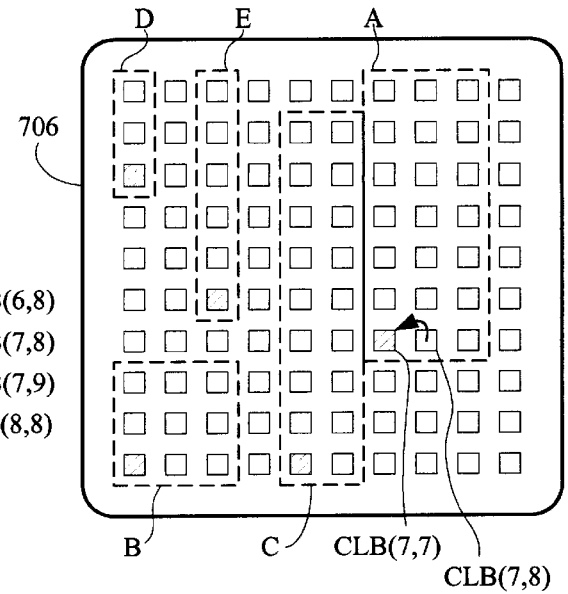

FIGS. 15(A) and 15(B) are graphical representations an illustrating an example of an incremental core movement in accordance with Step 1330.

As shown in FIG. 15(A), the present example assumes that core A is selected in step 1320, and the reference logic portion of core A is assigned to CLB site CLB(7,8). The possible incremental movements of the reference logic portion of core A are indicated by the arrows shown in FIG. 15(A). Specifically, the possible moves of the reference logic portion are upward (to CLB(6,8)), downward (to CLB(8,8)), leftward (to CLB(7,7)), or rightward (to CLB(7, 9)). In one embodiment, movements of core A in the upward and rightward direction are restricted because this would force at least one non-reference logic portion out of CLB side overlap table 707. In that embodiment, the only non-restricted movements of the reference logic portion of core A are to the left or downward.

FIG. 15(B) shows an example in which core A is incrementally moved leftward from its initial position to a provisional position in accordance with Step 1320. In particular, the movement of core A is implemented by the reassignment of the reference logic portion from CLB site CLB(7,8) to CLB site CLB(7,7) (indicated by the arrow). In effect, the incremental movement of the reference logic portion causes all of core A to move because, as discussed above, the positions of the non-reference logic portions of core A are determined by the position of the reference logic portion. This movement is indicated by the shift of the dashed-line box associated with core A from the initial position shown in FIG. 15(A) to the provisional position shown in FIG. 15(B).

After incremental movement of the selected core in the configuration data table 706, control passes to Step 1340.

In Step 1340, CLB site overlap table 707 is updated to reflect the incremental movement of the selected core from the initial position to the provisional position that was executed in Step 1330. In particular, movement of the reference portion from the initial CLB site causes the "# OF LPs" value associated with that CLB site to be reduced by one (unless a non-reference logic portion of the selected core is moved into that CLB cite). The CLB site into which the reference logic portion moves is similarly increased by one (unless a non-reference portion of the selected core was previously assigned to that CLB site). Similar reductions and increases are made to reflect the incremental migration of the non-reference logic portions of the selected core to the provisional location.

Figure 16A:
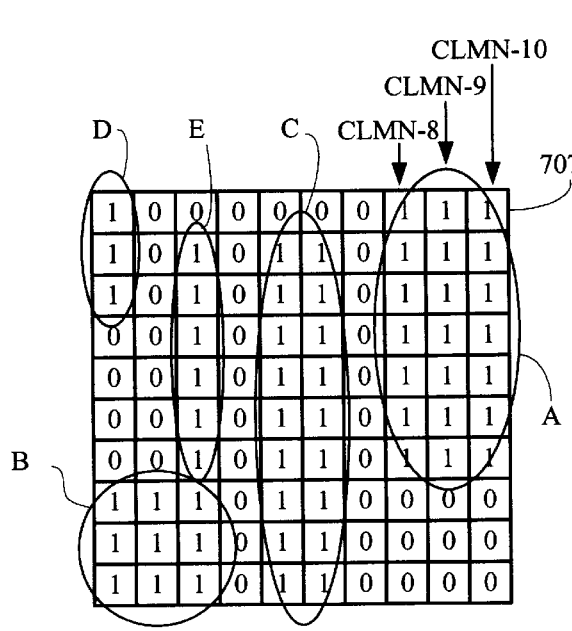
FIGS. 16(A) and 16(B) are diagrams representing the modification of CLB site overlap memory caused by the incremental movement shown in FIG. 15(B).
Figure 16B:
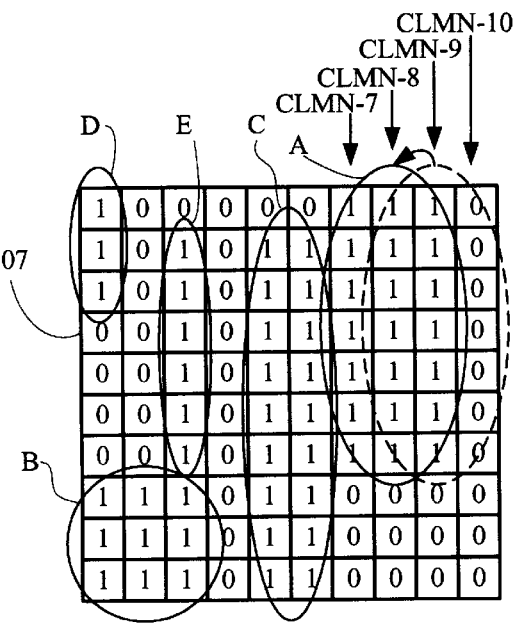

FIGS. 16(A) and 16(B) are graphical representations showing how the CLB site overlap table 707 is modified in response to the incremental movement of core A in accordance with Step 1340. FIG. 16(A) shows the initial group of CLB sites occupied by core A and the associated "# of LPs" values in CLB site overlap table 707. FIG. 16(B) shows the provisional group of CLB sites occupied by core A and the associated "# OF LPs" values associated with the provisional placement solution (i.e., after the leftward incremental movement of core A in Step 1330). When core A moves from the initial position to the provisional position (as indicated in FIG. 16(B)), the "# OF LP" values associated with the CLB sites located in the rightmost column (CLMN 10) of CLB site overlap table 707 are changed from "1" (one) to "0" (zero), indicating that no logic portions are assigned to the CLB sites in the provisional position. Note that the "# OF LP" values associated with the CLB sites located in CLMN 9 of CLB site overlap table 707 are not changed because, even though a logic portion is shifted out of CLMN 9 into CLMN 8, logic portions from CLMN 10 are shifted into CLMN 9. Finally, the "# OF LP" values associated with CLMN 7 of CLB site overlap table 707 are changed from "0" (zero) to "1" (one), indicating that logic portions of core A are assigned to these previously unoccupied CLB sites in the provisional position.

After the CLB site overlap table is updated, control passes to Step 1350.

In Step 1350, the cost is calculated for the provisional placement arrangement using the cost function (discussed above), and this cost is compared with the cost associated with the initial placement arrangement. Assuming that cores A through E are interconnected by signal paths, the incremental leftward movement of core A typically reduces the cost (as calculated by the cost function) because the wiring distances and signal path timing estimates would be reduced, and because no additional overlaps are created by the move. Under these circumstances, the cost of the provisional placement arrangement is typically lower than that of the initial placement arrangement. Control then passes to Step 1360.

In Step 1360, the difference between the cost of the provisional placement arrangement and the initial placement arrangement is entered into the annealing engine to determine whether the provisional move should be accepted or rejected. As discussed above, if the incremental move improves the overall placement solution cost, then a negative $\delta C$ value is generated. When the negative $\delta C$ value is inserted into the $e^{-\delta C/TEMP}$ equation of the annealing engine, a number greater than 1 is generated. Because this number is always greater than the random number "RAND(1,0)", incremental movements that improve the overall cost are always accepted, and control passes to Step 1380. On the other hand, if the cost is increased by an incremental move, then the annealing engine accepts the move only if the value generated by the $e^{-\delta C/TEMP}$ equation is greater than the random number "RAND(1,0)". If it is not greater, control passes to Step 1370.

If control is passed to Step 1370, the provisional incremental movement of the selected core is "undone" (i.e., configuration data table 706 and CLB site overlap table 707 are returned to the state indicating the placement arrangement existing before Step 1330). For example, configuration data table 706 would be changed from the placement shown in FIG. 15(B) back to the placement shown in FIG. 15(A), and CLB site overlap table 707 would be changed from the state shown in FIG. 16(B) back to the stage shown in FIG. 16(A). Control then passes to Step 1380.

In Step 1380, the current placement arrangement is analyzed to determine whether an optimal placement solution has been achieved, and control should be passed to Step 1030 (see FIG. 10). Several factors known to those in the art are utilized to determine whether an optimal placement solution has been achieved, such as when further migration of the cores does not generate any significant (i.e., plus or minus 5%) improvement in cost. If these factors indicate that the current placement arrangement is not optimal, then control is passed back to Step 1310 for further iterations of the annealing engine.

The annealing process is typically repeated multiple times in an attempt to identify an optimal placement solution. Each pass through the annealing process loop (i.e., Steps 1310 through 1380) produces a potential incremental core movement that drives the logic operation toward the optimal placement solution.

Figure 17A:
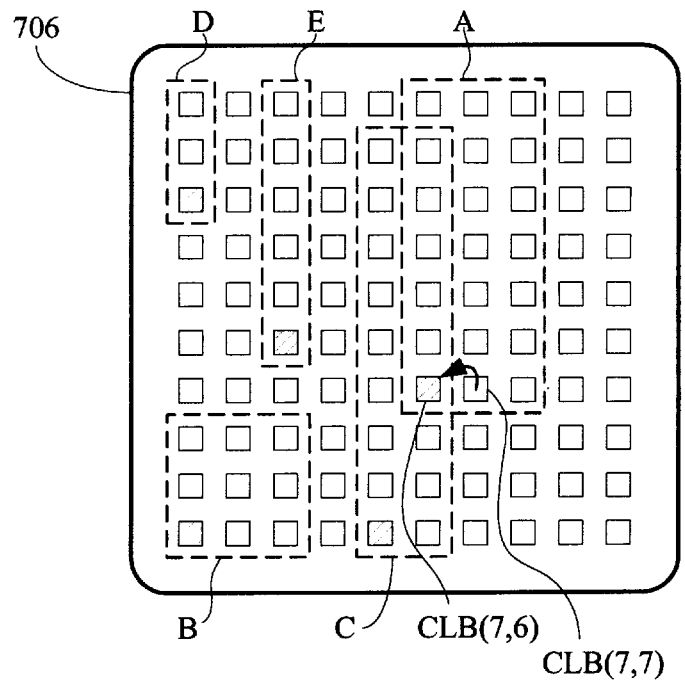
FIGS. 17(A) and 17(B) are diagrams illustrating an incremental movement of a core that creates an overlap condition during the annealing process.
Figure 17B:
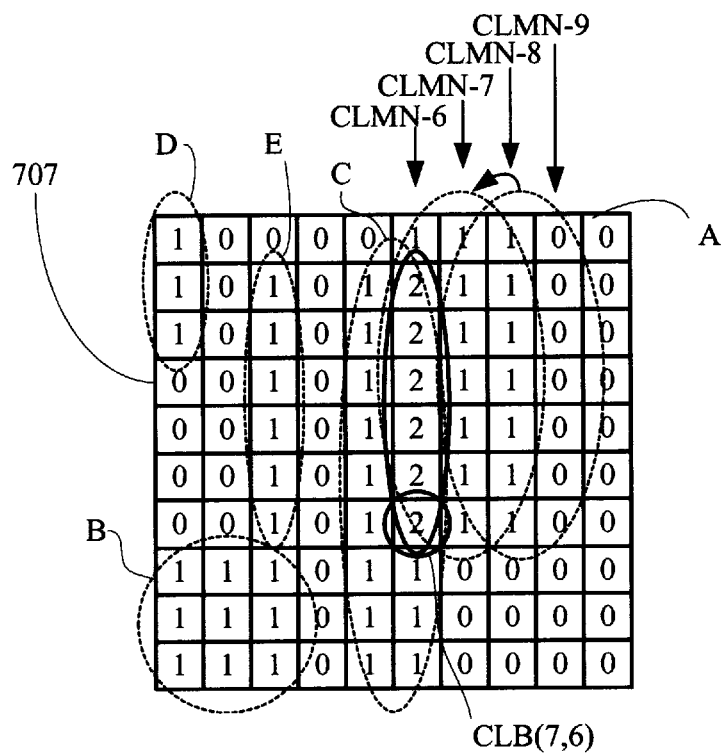

FIGS. 17(A) and 17(B) are graphical illustrations of configuration data table 706 and CLB site overlap table 707 showing an example of how a first core overlaps a second core during the annealing process. In the example shown in FIG. 17(A), core A migrates from CLB site CLB(7,7) to CLB site CLB(7,6). This movement is legal because CLB site CLB(7,6) of configuration table 706 is unoccupied (even though it is within the group of CLB sites required to place core C). As discussed above, before the movement of the reference portion of core A into CLB site CLB(7,6), the "# OF LPs" value for this CLB site was "1" (one), indicating that a logic portion of core C was assigned to this CLB site in CLB site overlap table 707. As indicated in FIG. 17(B), when the reference logic portion of core A moves into CLB site CLB(7,6), the "# OF LPs" value for this CLB site is increased from "1" (one) to "2", thereby indicating an overlap condition (i.e., that two logic portions are assigned to this CLB site in CLB site overlap table 707). Similarly, other CLB sites in CLMN-6 that are assigned to both core A and core C are increased to "2" (as indicated by the oval). In this manner, overlap conditions are detected during the annealing process. As a result, the CLB site overlap table allows the placement and annealing processes of the present invention to determine an optimal solution using overlap permissive annealing methods without requiring vast amounts of memory and run time. Specifically, because only a single integer value is stored for each CLB site, very little memory is necessary to provide an overlap permissive annealing method. When used in conjunction with the above-mentioned practice of placing only a portion of each core in configuration data table 706, an overlap permissive annealing method is provided in accordance with the present invention that is extremely fast and memory efficient.

FIGS. 18(A) through 18(D) are graphical representations illustrating how core migration is utilized during the annealing process to achieve an optimal placement solution.

Figure 18A:
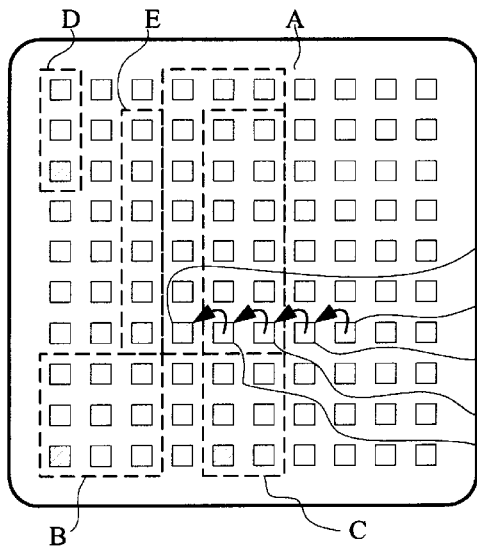
FIGS. 18(A) through 18(D) are diagrams illustrating the migration of cores during successive annealing process iterations.

In accordance with the present invention, because only a reference logic portion of each core is placed and moved in configuration data table 706, the annealing process is greatly facilitated because large cores typically do not block the migration of other cores toward the optimal placement solution. For example, as shown in FIG. 18(A), core A is free to migrate "through" core C because only the reference logic portion of core C is placed in configuration data table 706. In particular, FIG. 18(A) shows how, during successive passes through the annealing process loop, the reference logic portion of core A migrates from CLB site CLB(7,8) to CLB site CLB(7,7), from CLB site CLB(7,7) to CLB site CLB(7,6), from CLB site CLB(7,6) to CLB site CLB(7,5), and from CLB site CLB(7,5) to CLB site CLB(7,4). Because the non-reference logic portions of core C are not placed in configuration data table 706, core A is not prevented from migrating toward the optimal placement solution, as experienced using prior art routing methods.

Figure 18B:
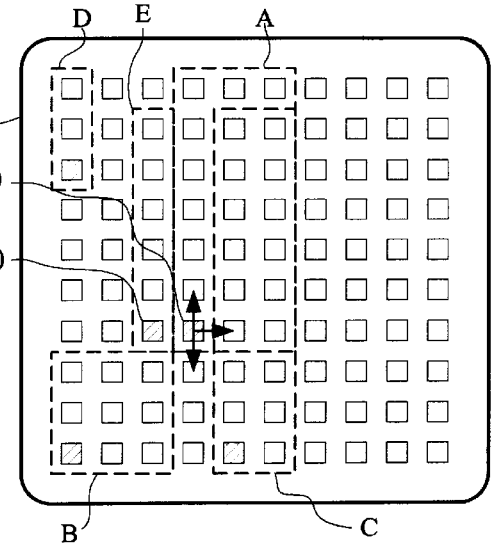

FIG. 18(B) is a graphical representation showing a restriction on the migration of the reference logic portion of core A. In particular, because the reference logic portion of core E occupies CLB site CLB (7,3), migration of the reference logic portion of core A into this CLB site is prevented. Therefore, when the reference logic portion of core A is moved from CLB site CLB(7,4), the only legal moves are upward, downward, and to the right (as indicated by the arrows). By preventing the movement of a first reference logic portion into a CLB site already occupied by a second reference logic portion, the large memory requirements of the prior art methods are avoided.

Figure 18C:
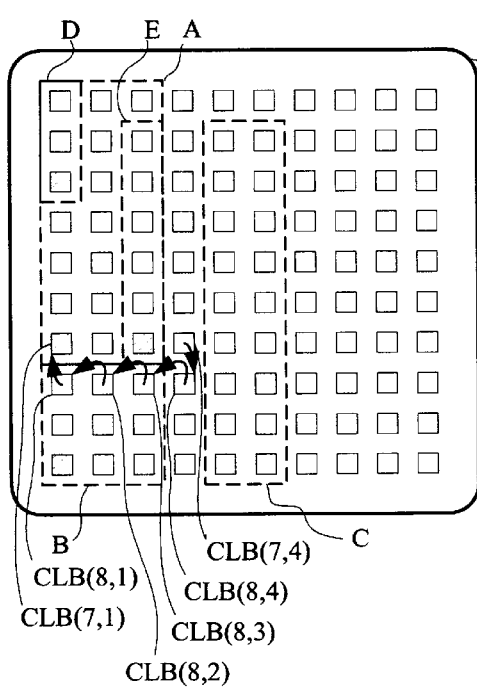

FIG. 18(C) is a graphical representation of configuration data table 706 showing a possible series of incremental movements whereby core A migrates to the optimal placement position above core B. Specifically, the reference logic portion is moved in respective passes through the annealing process loop from CLB site CLB(7,4) to CLB site CLB(8,4), from CLB site CLB(8,4) to CLB site CLB(8,3), from CLB site CLB(8,3) to CLB site CLB(8,2), from CLB site CLB (8,2) to CLB site CLB(8,1), and from CLB site CLB(8,1) to CLB site CLB(7,1). Each of these incremental movements is legal because none requires placement into an occupied CLB site, even though core A overlaps each of cores E, B and D during its migration. The series of incremental movements shown in FIG. 18(C) again illustrate that, because the non-reference logic portions of cores E, B and D are not placed in configuration data table 706, core A is able to migrate in a relatively unrestricted manner to the optimal placement solution.

Figure 18D:
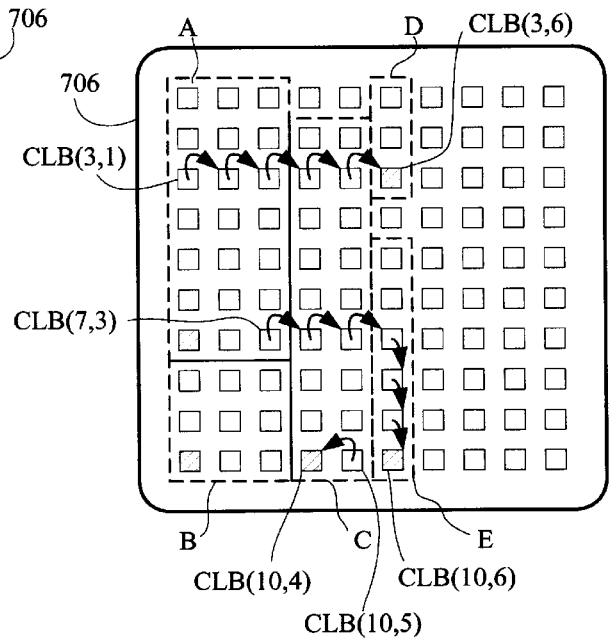

FIG. 18(D) is a graphical representation of configuration data table 706 showing additional possible incremental movements whereby cores C, D and E migrate to the optimal placement position shown in FIG. 4(B). In particular, the reference logic portion of core C migrates from CLB site CLB(10,5) to CLB site CLB(10,4), the reference logic portion of core D migrates from CLB site CLB(7,3) to CLB site CLB(10,6), and the reference logic portion of core E migrates from CLB site CLB(3,1) to CLB site CLB(3,6). Thus, the placement and annealing methods according to the present invention allow relatively unrestricted movement of cores, thereby facilitating the realization of optimal placement solutions even when large cores are utilized in the logic operations to be placed.

FIGS. 19(A) and 19(B) are graphical representations of configuration data table 706 and CLB site overlap table 707 showing an example of how a virtually unlimited number of cores can be overlapped without producing the problems associated with the prior art methods. In particular, FIG. 19(A) shows a graphical representation of configuration data table 706 wherein cores A, C, D and E are in an overlapping condition. This overlapping condition is represented by "# OF LPs" values in CLB site overlap table 707 (FIG. 19(B)) that are greater than one. In accordance with the present invention, a virtually unlimited number of logic portions can be assigned to each CLB site (provided only one of the logic portions is a reference logic portion) simply by increasing the "# OF LPs" value by one for each of the logic portions. For example, the overlap of four logic portions at CLB sites 1910 in FIG. 19(A) is represented by a single integer ("4") in the corresponding locations 1920 of CLB cite overlap table 707 (FIG. 19(B)). Because a single integer value is used to identify overlap conditions, the vast amount of memory required in fixed memory, overlap-tolerant annealing methods is not required. Further, because of the one-to-one correspondence between the CLB sites of configuration data table 706 and CLB cite overlap table 707, the additional time required to address and access memory locations used in the "allocate on the fly", overlap-tolerant annealing methods. Therefore, the placement and annealing methods in accordance with the present invention are substantially faster than those previously utilized in the prior art.

FIGS. 20(A) and 20(B) are graphical representations of configuration data table 706 and CLB site overlap table 707 showing a second embodiment of the present invention. As discussed in the above embodiment, the non-reference logic portions of the selected core may restrict movement of a selected core in a particular direction. For example, as indicated in area 2010 in FIG. 20(A), assume the rightward movement of core E is blocked by the reference portions of cores A and D. If core E moves upward to avoid these reference logic portions, the uppermost non-reference logic portion 2020 becomes separated from a CLB site, thereby creating an improper placement solution. To accommodate this type of movement during the annealing process, CLB site overlap table 707 may be modified to include additional rows 2030 and additional columns 2040, as shown in FIG. 20(B). These additional rows and columns provide a "phantom" CLB cite that may be used to temporarily accommodate logic portions that are displaced from the rows and columns associated with actual CLB sites. For example, the displaced non-reference portion 2020 shown in FIG. 20(A) may be accommodated in "phantom" CLB site 2050 as shown in FIG. 20(B). Of course, all logic portions must be moved from these "phantom" CLB sites in the final placement solution.

After the annealing process is complete (i.e., an optimal placement solution is found), control shifts back to Step 1030 (see FIG. 10).

Referring again to FIG. 10, the optimal placement solution generated by the annealing process of Step 1020 occasionally yields one or more overlapping cores. That is, the placement solution having the lowest cost at the end of the annealing process sometimes includes one or more overlaps. When this occurs, control passes to the overlap removal process of Step 1040. Conversely, control passes to Step 1050 (placement of non-reference logic portions) if no overlaps exist in Step 1030, or after the overlap removal process is performed in Step 1040.

Because the above example yielded an "optimal" placement solution that does not include any overlaps, the placement of non-reference cores (Step 1050) is discussed next. The overlap removal process (Step 1040) is discussed below with respect to a second "optimal" placement solution that includes overlapping cores.

Referring again to FIG. 10, in Step 1050 all non-reference logic portions associated with the cores of the logic operation are placed in configurable data 706.

Figure 21:
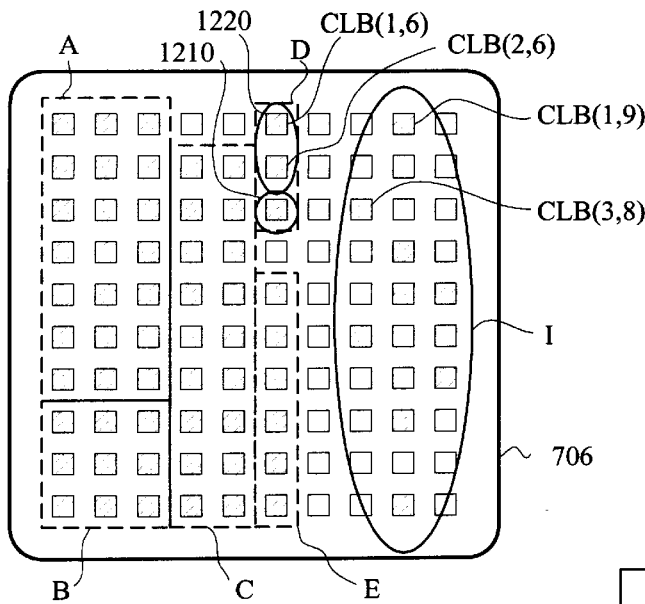
FIG. 21 is a graphical representation showing placement of non-reference logic portions after annealing.

FIG. 21 is a graphical representation of configuration data table 706 after the non-reference logic portions are placed in accordance with Step 1050. Each shaded CLB site box indicates that this CLB site contains configuration data associated with an assigned logic portion. Specifically, non-reference logic portions 1220 of core D are placed in CLB sites CLB(1,6) and CLB(2,6). As discussed above, non-reference logic portions 1220 were not placed with reference portion 1210 in initial placement Step 1130 (see FIGS. 11 and 12(A)). In Step 1050, non-reference portions 1220 are placed in CLB sites whose location is determined by their relationship to reference portion 1210. That is, the fixed logic portion arrangement of core D is a one-by-three pattern. Because reference logic portion 1210 is located at the lower end of this fixed arrangement, non-reference logic portions 1220 are necessarily located above reference logic portion 1210. Therefore, as shown in FIG. 21, non-reference portions 1220 are placed in CLB sites CLB(1,6) and CLB (2,6) in accordance with Step 1050.

As noted above, individual logic portions I (shown in FIG. 21), which are not associated with a core, are placed during the annealing process in CLB sites not occupied by the cores. For example, independent logic portions may be placed in CLB sites CLB(1,9) and CLB(3,8) that are located to the right of the CLB sites occupied by cores A through E.

After all non-reference logic portions are placed in accordance with Step 1050, control passes to Step 930 (FIG. 9). As mentioned above, the routing process performed in Step 930 and the configuration data transmission process performed in Step 940 utilize known methods. Therefore, these processes are not discussed herein.

Residual Overlap Removal Process

A post-placement residual overlap removal process in accordance with a third aspect of the present invention is called in Step 1040 (FIG. 10) when the "optimal" placement solution generated by the annealing process (described above) includes one or more overlapping cores. Although the residual overlap removal process is described with respect to placement solutions generated by the novel placement and annealing processes described herein, the residual overlap removal process may be applied to placement solutions generated, for example, by the conventional overlap permissive annealing methods described above.

Figure 22:
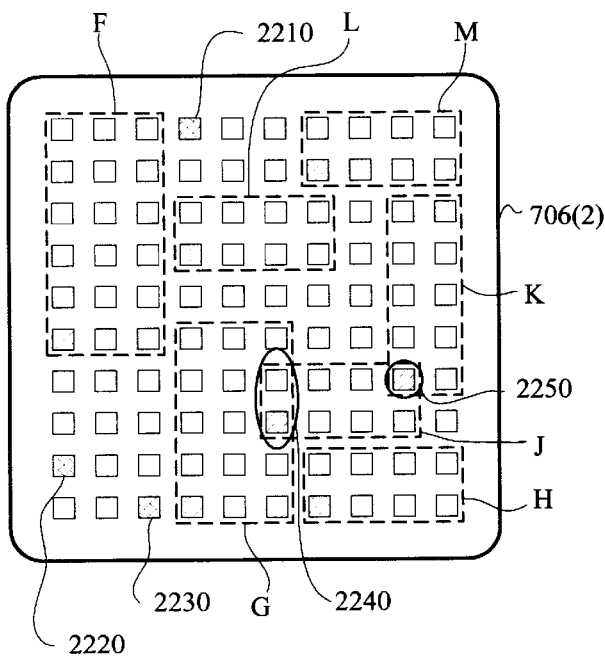
FIG. 22 is a graphical representation showing post-annealing placement solution associated with a second logic operation wherein residual overlapping exists.

FIG. 22 is a graphical representation of configuration data table 706(2) showing a second placement solution generated, for example, in accordance with the annealing process of Step 1030. The placement solution shown in FIG. 22 includes cores F, G, H, J, K, L and M, and also includes individual (non-core) logic portions 2210, 2220 and 2230. To facilitate the description of the residual overlap removal process of the present invention, this placement solution is intentionally provided with a first overlap 2240 between cores G and J, and a second overlap 2250 between cores J and K. These overlaps are not necessarily generated by the placement and annealing process described above.

FIGS. 23(A) through 23(D) are graphical representations illustrating an intuitive approach for removing the residual overlap conditions existing in the placement solution stored in configuration data table 706(2).

Figure 23A:
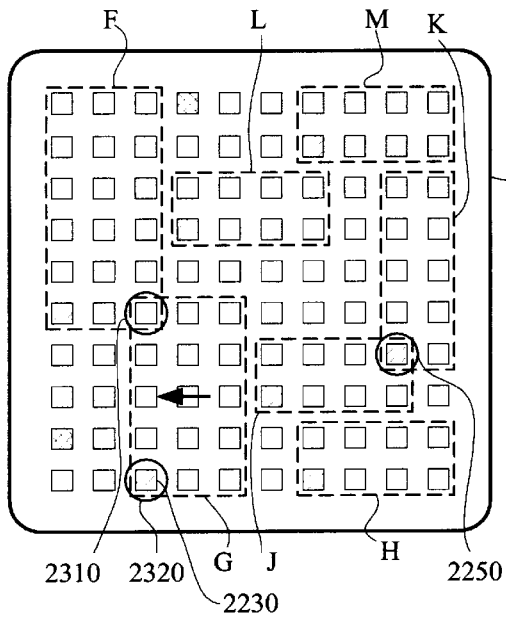
FIGS. 23(A) through 23(D) are depicting an intuitive approach to removing the residual overlapping cores from the placement solution shown in FIG. 22.

As shown in FIG. 23(A), overlap 2240 between core G and core J (see FIG. 22) may be removed by moving core G to the left. However, this move creates a first new overlap 2310 between core G and core F, and a second new overlap 2320 between core G and individual logic portion 2230. Thus, the leftward movement of core G merely replaces overlap 2240 between cores J and G with new overlap 2310 between cores G and F, and new overlap 2320 between core G and individual logic portion 2230. Further, overlap 2310 presents a particularly difficult problem because further leftward movement of core G would further increase the number of overlapping CLB sites between core G and core F. Core F cannot be moved upward (due to its position relative to the top edge of the target FPGA), and cannot be moved to the right to remove the overlap with core G without significant repositioning of the other cores. As mentioned above, a goal of the residual overlap removal process is to provide a placement solution that is as close as possible to the original "optimal" placement solution generated during annealing. Therefore, because significant changes to the original placement solution would be required, the leftward movement of core G is clearly not desirable.

Figure 23B:
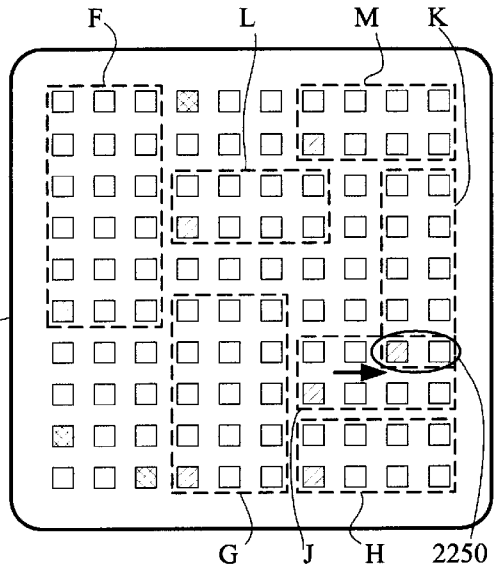
Figure 23C:
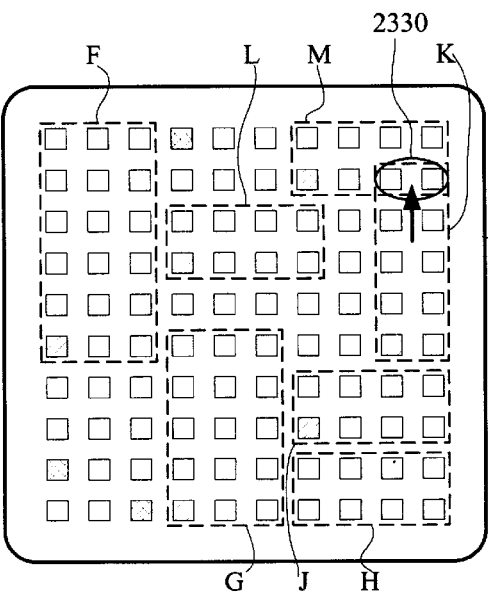
Figure 23D:
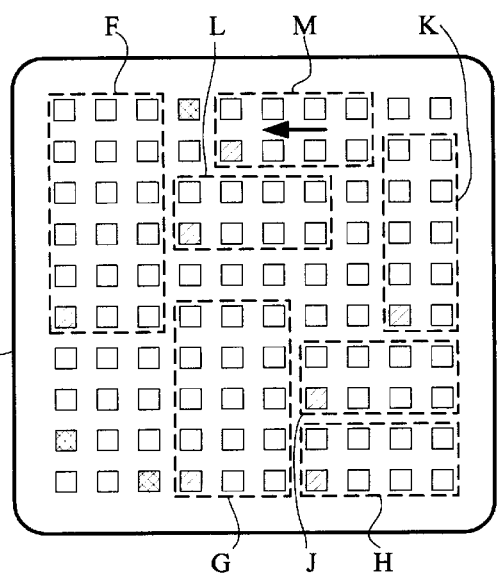

FIGS. 23(B) through 23(D) show an alternative series of core movements that remove the overlaps while providing a placement solution that is as close as possible to the original "optimal" placement solution. FIG. 23(B) shows that the overlap between core G and core J is removed by moving core J to the right. As indicated, movement of core J to the right increases the number of CLB sites associated with overlap 2250 between core J and core K. However, as shown in FIG. 23(C) overlap 2250 is removed by the subsequent upward movement of core K. In other words, unlike core F, core K can be moved to remove the new overlap without substantial repositioning of other cores. As indicated in FIG. 22(C), the upward movement of core K creates an overlap 2330 between core K and core M. Again however, a relatively small movement of core M can also remove newly created overlap 2330. Specifically, FIG. 23(D) shows that overlap 2330 between core K and core M is removed by moving core M to the left. As a result of this move, a revised placement solution is generated that is free from overlaps, and is as close to the original "optimal" placement solution as possible.

In accordance with the third aspect of the present invention, a post-placement residual overlap removal process is provided that performs the analysis and generates core movements illustrated by the intuitive approach shown in FIGS. 23(B) through 23(D) in a manner that can be utilized in, for example, a computer. That is, the intuitive approach shown in FIGS. 23(A) through 23(D) analyzes the overlap condition in two dimensions (i.e., horizontally along the rows, and vertically along the columns), and recognizes the combination of movements in these dimensions that are required to remove the overlaps. However, two-dimensional analysis is difficult to implement in a computer. Therefore, the residual overlap removal process of the present invention separates the two-dimensional problem into two one-dimensional problems that are significantly easier to implement in a computer. Further, because the residual overlap removal process can be utilized in a computer, it is possible to remove overlaps from placement solutions that may be too complicated for solution by intuitive (i.e., manual) methods.

Figure 24:
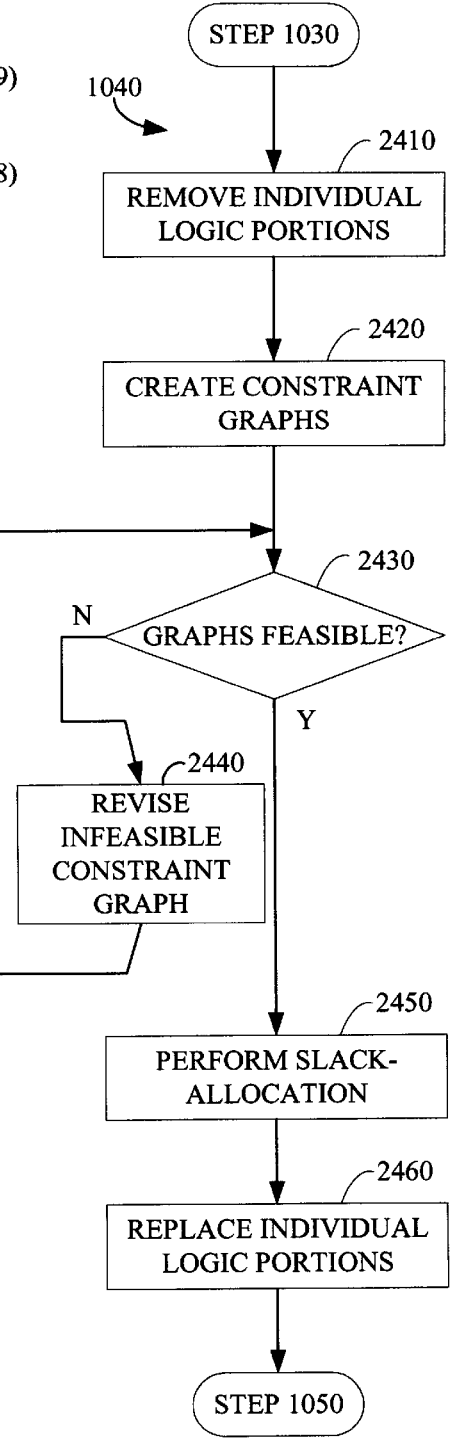
FIG. 24 is a flow diagram showing post-placement residual overlap removal process in accordance with a third aspect of the present invention.

FIG. 24 is a flow diagram showing the basic steps associated with the post-placement residual overlap removal process according to an embodiment of the present invention. The process generally begins by isolating the cores associated with a placement solution (i.e., temporarily removing individual logic portions) (Step 2410). Constraint graphs are then created that mathematically define the two-dimensional positional relationship between the cores of the placement solution in two separate one-dimensional (i.e., horizontal and vertical) directions (Step 2420). Next, the constraint graphs are analyzed to determine whether they include a feasible solution (i.e., whether the overlaps existing in the placement solution can be removed simply by reallocating available resources to the overlapping cores) (Step 2430). If one of the constraint graphs is not feasible, then the infeasible constraint graph is revised (Step 2440) and control returns to Step 2430. The loop provided by Steps 2430 and 2440 is repeated until the constraint graphs are feasible. A slack allocation process (Step 2450) is then performed wherein resources are allocated to the cores, as arranged in the feasible constraint graphs, to generate a revised placement solution such that the cores are positioned as close to the original "optimal" solution as possible with no overlaps. Finally, the individual logic portions removed in Step 2410 are re-placed using bipartite matching to complete the revised placement solution, which is stored in configuration data table 706(2).

The post-placement residual overlap removal process according to the present invention will now be described with reference to FIGS. 25 through 56.

Figure 25:
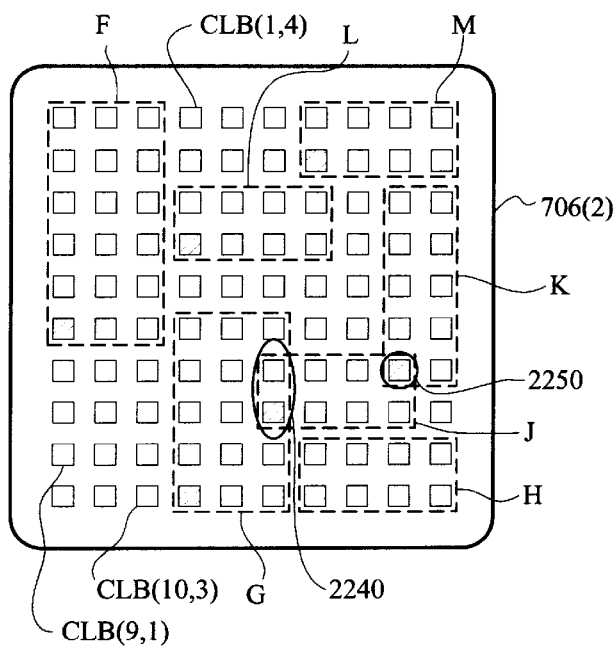
FIG. 25 is a graphical representation showing configuration data after removal of individual logic portions.

FIG. 25 is a graphic representation of configuration data table 706(2) that is modified in accordance with Step 2410 (see FIG. 24). As indicated, individual logic portions 2210, 2220 and 2230 (see FIG. 22) are removed from CLB sites CLB(1,4), CLB(9,1) and CLB(10,3), thereby freeing these CLB sites for use in the residual overlap removal process. The configuration data associated with the removed individual logic portions is stored for later replacement into configuration data table 706(2). After the individual logic portions are removed, control passes to Step 2420 (FIG. 24).

Figure 26:
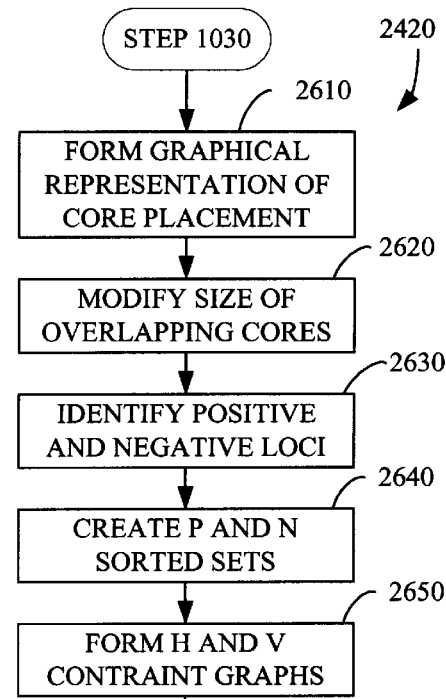
FIG. 26 is a flow diagram showing steps associated with the creation of constraint graphs in accordance with an embodiment of the present invention.

FIG. 26 is a flow diagram showing the steps associated with the creation of constraint graphs in accordance with Step 2420. The creation of constraint graphs in accordance with the present invention is loosely based upon the techniques taught in "Rectangle-Packing-Based Module Placement," Hiroshi Murata, Kunihiro Fujiyoshi, Shigetoshi Nakatake and Yoji Kajitani, ICCAD 1995, which is incorporated herein by reference. In general, this process begins with a step of determining the two-dimensional relationship between the edges of each core relative to the edges of other cores and to the edges of the target FPGA (Step 2610). The edges of overlapping cores are then modified to eliminate the overlap (Step 2620). A set of positive and negative loci are then identified that are determined by the location of each core relative to the other cores and to the edges of the target FPGA (Step 2630). A positive sorted set (P-set) and a negative sorted set (N-set) are then created in which the cores are respectively ordered in accordance to the positive and negative loci (Step 2640). Finally, horizontal (H) and vertical (V) constraint graphs are formed that include paths determined by the P-set and N-set (Step 2650). These steps are described in further detail in the following paragraphs.

As defined herein, the term "edges" is used to identify an imaginary boundary of an object that is referenced by the residual overlap removal process. When applied to a core, the term "edges" refers to an imaginary boundary surrounding the CLB sites that are assigned to that core. When applied to a target FPGA, the term "edges" refers to the peripheral area surrounding the rows and columns of CLB sites associated with the target FPGA. These distinctions will become apparent by the use of the term "edges" in the following description.

The creation of constraint graphs utilizes position data defined in the configuration data table 706(2) and the CLB site overlap table (not shown) that accurately describes the relative core placement (based on the CLB sites assigned to each core) with respect to the edges of the target FPGA. The data utilized during the creation of constraint graphs is represented in the figures using various graphs and tables. These graphical representations are utilized for explanatory purposes only, and are not intended to necessarily depict either actual data locations in memory or specific groupings of the data indicated in the figures.

Figure 27:
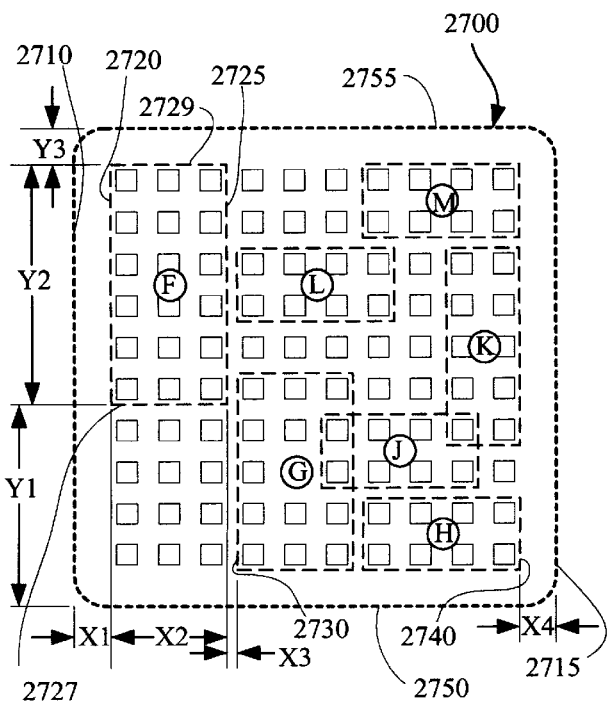
FIG. 27 is a graphical representation of initial position data utilized in the creation of constraint graphs.

FIG. 27 shows a graphical representation of original position data 2700 collected in Step 2610 in accordance with one embodiment of the present invention. Original position data 2700 includes the horizontal position of each core relative to the other cores and to a left edge 2710 and right edge 2715 of the target FPGA. For example, data X1 indicates the horizontal distance (i.e., zero CLBs) between left edge 2710 of the target FPGA and left edge 2720 of core F. Data X2 indicates the width of core F (i.e., three CLBs, as measured between left edge 2720 and right edge 2725). Data X3 indicates the horizontal distance (i.e., zero CLBs) between right edge 2725 of core F and a left edge 2730 of core G. Data X4 indicates the horizontal distance (i.e., zero CLBs) between right edge 2740 of core H and right edge 2715 of the target FPGA. Similar width and horizontal distance data is collected for the remaining cores that identifies the original horizontal placement location of the cores relative to the CLB sites of the target FPGA. In addition, original position data 2700 includes the vertical position of each core relative to each other and to a bottom edge 2750 and a top edge 2755 of the target FPGA. For example, data Y1 indicates the vertical distance (i.e., four CLBs) between bottom edge 2750 of the target FPGA and bottom edge 2727 of core F. Data Y2 indicates the height of core F (i.e., six CLBs, as measured between bottom edge 2727 and top edge 2729). Similar height and vertical position data is collected for the remaining cores. Data Y3 indicates the vertical distance (i.e., zero CLBs) between top edge 2729 of core F and top edge 2755 of the target FPGA. In addition to the core position data, data indicating the center of each core is also calculated from the position, height and width of the core. A circle identifies the center of each core in FIG. 27.

Figure 28:
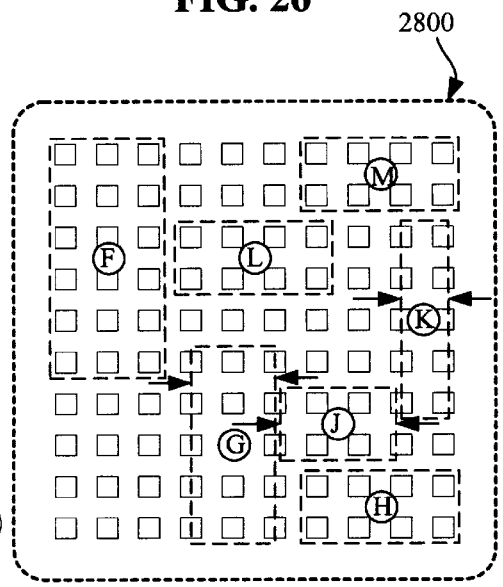
FIG. 28 is a graphical representation of the position data of FIG. 27 the sizes of the overlapping cores are modified to remove the overlaps.

FIG. 28 shows a graphical representation of position data 2800 as modified in Step 2620 to eliminate the overlap between cores G and J, and the overlap between cores J and K. In particular, the right edge of core G is moved leftward and the left edge of core J is moved rightward until these edges no longer overlap. Similarly, the right edge of core J and the left edge of core K are adjusted to remove their overlap. Note that the actual core sizes are not reduced. Instead, the reduction concept is used only to determine realistic core position relationships by providing "gaps" through which loci are able to pass, as discussed below. Further, in one embodiment when an edge of a core is adjusted, the opposite edge of the core is also adjusted to maintain symmetry. For example, the left edge of core G is moved rightward such that the center of core G (indicated by the circle) is not altered by the leftward movement of the right edge.

FIGS. 29(A) and 29(B) respectively show graphical representations of data associated with positive loci set 2900(A) and negative loci set 2900(B) that are identified in accordance with Step 2630.

FIG. 29(A) shows a positive loci set 2900(P) that is determined by the original position data associated with cores F, G, H, J, K, L and M. Positive loci set 2900(P) includes positive loci that extend horizontally to the right and left, respectively, from the center of each core. In accordance with the formation of positive loci, the right portion (i.e., the portion extending to the right of the core center) of each positive locus turns upward upon meeting a vertical edge, and turns right upon meeting a horizontal edge. This up-right turning process is repeated until the right portion of each positive locus reaches the upper right corner 2921 of the target FPGA. For example, the right portion of positive locus 2911 extends from the center of core F to the right edge of core F, then turns upward until it meets the top edge of core F, then turns right until it meets the left edge of core M, then turns upward until it meets the top edge of the target FPGA, then turns right until it reaches upper right corner 2921. Conversely, the left portion (i.e., the portion extending to the left of center) of each positive locus turns downward upon meeting a vertical edge, and turns left upon meeting a horizontal edge. This down-left turning process is repeated until the left portion of each locus reaches the lower left corner 2922. For example, the left portion of positive locus 2911 extends from the center of core F to the left edge of core F, then turns downward until it meets the bottom edge of core F, then turns left until it meets the right edge of the target FPGA, then turns downward until it reaches lower left corner 2922. Positive loci are similarly generated for each core, as indicated in FIG. 29(A). Specifically, positive locus 2912 is generated for core M, positive locus 2913 is generated for core L, positive locus 2914 is generated for core G, positive locus 2915 is generated for core J, positive locus 2916 is generated for core K, and positive locus 2917 is generated for core H.

FIG. 29(B) shows a negative loci set 2900(N) that is determined by the original position data associated with cores F, G, H, J, K, L and M. Negative loci set 2900(N) includes negative loci that extend horizontally upward and downward, respectively, from the center of each core. In accordance with the formation of negative loci, the upper portion (i.e., the portion extending upward from the core center) of each negative locus turns left upon meeting a horizontal edge, and turns upward upon meeting a vertical edge. This left-up turning process is repeated until the upper portion of each negative locus reaches the upper left corner 2941 of the target FPGA. For example, the upper portion of negative locus 2931 extends from the center of core F to the top edge of core F, then turns left until it meets the left edge of core F, then turns upward until it reaches upper left corner 2941. Conversely, the lower portion (i.e., the portion extending downward from the core center) of each negative locus turns right upon meeting a horizontal edge, and turns downward upon meeting a vertical edge. This right-down turning process is repeated until the lower portion of each negative locus reaches the lower right corner 2942. For example, the lower portion of negative locus 2931 extends from the center of core F to the bottom edge of core F, then turns right until it meets the right edge of core F, then turns downward until it meets the bottom edge of the target FPGA, then turns right until it reaches lower right corner 2942. Negative loci are similarly generated for each core, as indicated in FIG. 29(B). Specifically, negative locus 2932 is generated for core G, negative locus 2933 is generated for core H, negative locus 2934 is generated for core J, negative locus 2935 is generated for core L, negative locus 2936 is generated for core K, and negative locus 2937 is generated for core M.

It is noted that, in addition to the core edges, each locus forms an "edge" that cannot be crossed (overlapped) by all other loci. Because none of the loci overlap, the loci establish an arrangement order of the cores in the positive and negative loci sets that are used to determine the positional relationship between the cores. For example, reading from left to right in FIG. 29(A), the positional arrangement of the cores in positive loci set 2900(P) is core F (locus 2911), core M (locus 2912), core L (locus 2913), core G (locus 2914), core J (locus 2915), core K (locus 2916) and core H (locus 2917). Similarly, reading from left to right in FIG. 29(B), the positional arrangement of the cores in negative loci set 2900(N) is core F (locus 2931), core G (locus 2932), core H (locus 2933), core J (locus 2934), core L (locus 2935), core K (locus 2936) and core M (locus 2937).

FIGS. 30(A) and 30(B) are diagrams showing data associated with a positive sorted set (P-set) 3010 and a negative sorted set (N-set) 3020 that are generated in accordance with Step 2640 (see FIG. 26). P-set 3010 and N-set 3020 identify each core as arranged in the order respectively established by positive loci set 2900(P) and negative loci set 2900(N) that are shown in FIGS. 29(A) and 29(B).

Specifically, P-set diagram 3010 includes the cores arranged in the order F-M-L-G-J-K-H that corresponds to the positional arrangement of positive loci set 2900(P) (as read from left to right in FIG. 29(A)). N-set diagram 3020 identifies the cores as being arranged in the order F-G-H-J-L-K-M that corresponds to the positional arrangement of negative loci set 3020 (as read from left to right in FIG. 29(B)). As discussed further below, P-set 3010 and N-set 3020 are used to define horizontal and vertical constraint graphs in Step 2650 (see FIG. 26), and are utilized to remove overlaps from infeasible constraint graphs in Step 2440 (see FIG. 24).

Figure 31A:
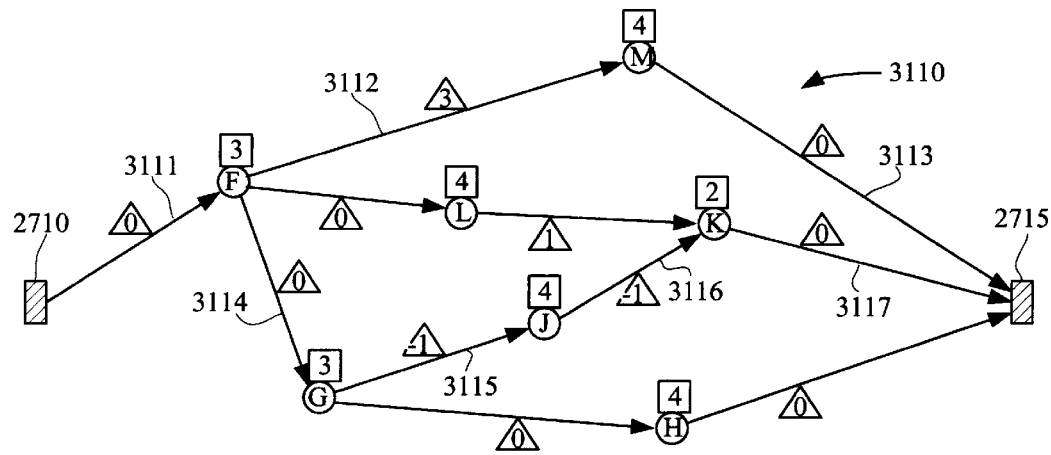
FIGS. 31(A) and 31(B) are a horizontal constraint graph and a vertical constraint graph, respectively, that are generated by the P-set and N-set data.
Figure 31B:
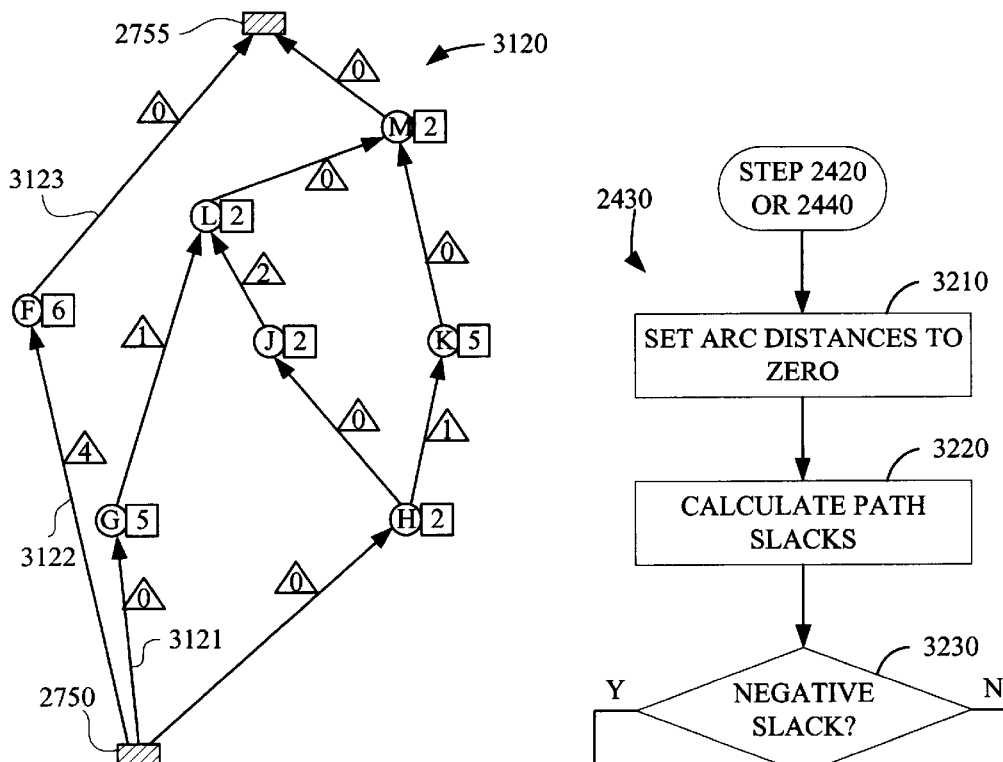

FIGS. 31(A) and 31(B) respectively show graphical representations of data associated with a horizontal constraint graph (H-graph) 3110 and a vertical constraint graph (V-graph) 3120 in accordance with Step 2650 (see FIG. 26). H-graph 3110 and V-graph 3120 include data relevant to the positional relationship between the cores in two axes (i.e., horizontal and vertical) that are established by the rows and columns of CLBs of the target FPGA. The rationale for using these graphs is that they facilitate dealing with the two-dimensional placement problem in terms of two one-dimensional problems. Of course, in order to retain the two-dimensional relationship between H-graph 3110 and V-graph 3120, certain rules and restrictions must be followed during graph formation. These rules and restrictions are established in the following description.

Referring again to FIGS. 31(A) and 31(B), each constraint graph includes cores (identified by circled letters), and arcs (represented by arrows). The cores and arcs of H-graph 3110 are arranged between left edge 2710 and right edge 2715 of the target FPGA. Similarly, the cores and arcs of V-graph 3120 are arranged between bottom edge 2750 and top edge 2755 of the target FPGA.

In addition, the width/height of each core is respectively indicated in H-graph 3110 and V-graph 3120. H-graph 3110 identifies the width of each core in the box located adjacent to the core. For example, core F in H-graph 3110 has a width of three CLBs. The core width information utilized in H-graph 3110 is obtained from, for example, the original position data 2700 shown in FIG. 27. Specifically, the width of core F corresponds to data value X2 in FIG. 27. In a similar fashion, V-graph 3120 identifies the height of each core in the box located adjacent to the core. For example, core F in V-graph 3120 has a height of six CLBs, as established by data value Y2 in FIG. 27.

The arcs of H-graph 3110 and V-graph 3120 are established by the relative positions of the cores in P-set 3010 and N-set 3020 (FIGS. 30(A) and 30(B), respectively), and identify the distances between two edges (i.e., FPGA edge to core edge, core edge to core edge, or core edge to FPGA edge).

An arc is established between two cores in H-graph 3110 if the two cores are arranged in the same order in both P-set 3010 and N-set 3020. For example, arc 3112 is formed between core F and core M because core F is located to the left of core M in both P-set 3010 and N-set 3020. Transitive arcs are omitted for clarity. For example, core F is located to the left of core J in both P-set 3010 and N-set 3020. However, an arc is not formed in H-graph 3110 between core F and core J because arc 3114 (core F to core G) and arc 3115 (core G to core J) already establish the distance between core F and core J. The "transitive" arc between core F and core J would be redundant in H-graph 3110, and is therefore omitted. Finally, arcs between the cores and left edge 2710 and right edge 2715 of the target FPGA are similarly established.

In contrast to H-graph 3110, an arc is established between two cores in V-graph 3120 if the two cores are arranged in an opposite order in P-set 3010 and N-set 3020. For example, an arc is established between a first core and a second core if the second core is located to the left of the first core in P-set 3110, and the first core is located to the right of the second core in N-set 3120. The direction of the arc is determined by the left-to-right order of the cores in N-set 3010. Referring to V-graph 3120 (FIG. 31(B)), arc 3121 is formed between core G and core L because core L is located to the left of core G in P-set 3010, and is located to the right of core G in N-set 3020. Similar to H-graph 3110, transitive arcs are omitted from V-graph 3120 for clarity. Finally, arcs between the cores and bottom edge 2750 and top edge 2755 of the target FPGA are established in a manner similar to that used to form the core-to-core arcs.

Arc lengths are indicated by integers located within the triangles of H-graph 3110 and V-graph 3120. The arc lengths indicate the horizontal/vertical distance between two edges. For example, the horizontal length of arc 3111 in H-graph 3110 is zero, as established by data value X1 in FIG. 27 (indicating that there are no CLB sites located between left edge 2710 of the target FPGA and left edge 2720 of core F). The horizontal distance of arc 3112 is three, indicating that three columns of CLB sites are located between right edge 2725 of core F and the left edge of core M (see FIG. 27). Similarly, vertical arc lengths are identified in V-graph 3120. For example, the vertical length of arc 3122 between bottom edge 2750 of the target FPGA and the bottom edge 2727 of core F is four CLBs, as is established by data value Y2 in FIG. 27. A negative integer indicates an overlap. For example, arc 3115 has an arc length of "−1". This negative arc length indicates an overlap of one CLB site between the respective right and left edges of core G and core J. Similarly, the negative arc length on arc 3116 indicates an overlap between core J and core K.

A "path" is a series of connected arcs and cores that extend between opposite edges of the target FPGA in H-graph 3110 or V-graph 3120. For example, a first horizontal path is established between left edge 2710 and right edge 2715 in H-graph 3110 by arc 3111, core F, arc 3112, core M and arc 3113. A second horizontal path is established by arc 3111, core F, arc 3114, core G, arc 3115, core J, arc 3116, core K and arc 3117. H-graph 3110 includes a total of four horizontal paths. Similarly, a first vertical path is established between bottom edge 2750 and top edge 2755 in V-graph 3120 by arc 3122, core F and arc 3123. V-graph 3120 includes a total of four vertical paths. The length of each horizontal/vertical path is equal to the width/height of the target FPGA. For example, if the target FPGA includes CLBs arranged in ten rows and ten columns, then each horizontal path length is equal to ten CLB sites, and each vertical path length is equal to ten CLB sites.

After H-graph 3110 and V-graph 3120 are established, control passes to Step 2430 (see FIG. 24).

The final objective of the residual overlap removal process is to reposition the cores such that all negative arc length values in H-graph 3110 and V-graph 3120 change to zero (or a positive number). Ideally, this should be achieved with a minimal change in the value of the other (non-negative) arcs. Any change in arc lengths between the original values (established in Step 2650) and the final placement data (i.e., after Step 2450, see FIG. 24) represents movement of the cores from the original "optimal" placement solution. Therefore, the objective of the present residual overlap removal process is to eliminate negative arc lengths while minimizing changes to all other arc lengths in the final placement solution.

The first step toward the elimination of negative arc lengths is to determine whether H-graph 3110 and V-graph 3120 are feasible (Step 2430). Feasibility of the graphs is determined by the width/height of the cores in each path. In other words, if the sum of the widths of the cores in a horizontal path is less than the total width of the target FPGA, then the path is considered feasible because a negative arc value can typically be eliminated by shifting the position of the cores along the path. However, if the sum of the widths of the cores in a horizontal path is greater than the total width of the target FPGA, then no amount of shifting along the path will eliminate negative arc values from the path.

Figure 32:
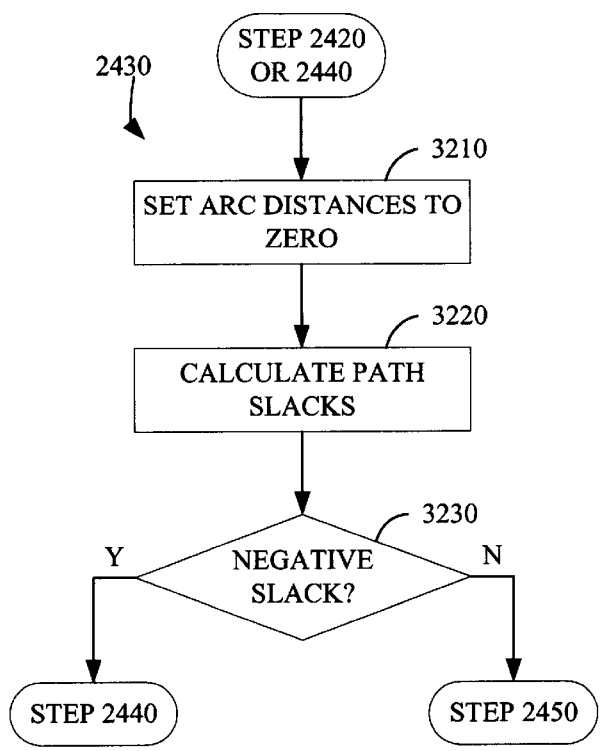
FIG. 32 is a flow diagram showing steps associated with a constraint graph feasibility analysis in accordance with an embodiment of the present invention.

FIG. 32 is a flow diagram showing steps associated with the decision process of Step 2430 in accordance with an embodiment of the present invention. The decision process begins by temporarily setting all arc values of the constraint graphs to zero (Step 3210). With zero arc values, the length of the paths in each graph is determined by the width/height of the cores of the paths. These path lengths are then used to determine the amount of slack available along each path (Step 3220). The slack of each path is then analyzed (Step 3230). If any of the slack values of a constraint graph are negative, then the graph is considered infeasible and control passes to Step 2430. Conversely, if all of the slack values are zero or positive numbers, then control passes to Step 2440.

Figures 33, 34A:
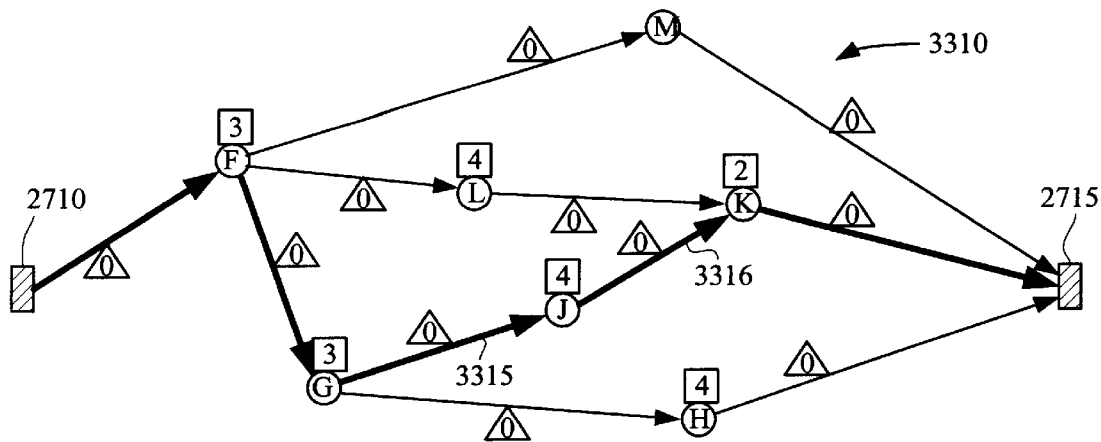
FIG. 33 is a graphical representation of a horizontal constraint graph as modified during a slack analysis utilized to identify critical paths during the constraint graph feasibility analysis.
FIGS. 34(A) and 34(B) show a horizontal constraint graph feasibility table and a vertical constraint graph feasibility table, respectively, that include data utilized during the constraint graph feasibility analysis.

FIG. 33 is a graphical representation of H-graph 3310 that is modified in accordance with Step 3210. H-graph 3310 differs from H-graph 3110 (FIG. 31) only in that all arc values are temporarily set to zero in H-graph 3310. In particular, paths 3315 and 3316 (corresponding to paths 3115 and 3116 in H-graph 3110) are changed from their negative value to zero. By zeroing negative arc values, the path length for the path containing the negative arc value is increased.

Figures 34B, 35:
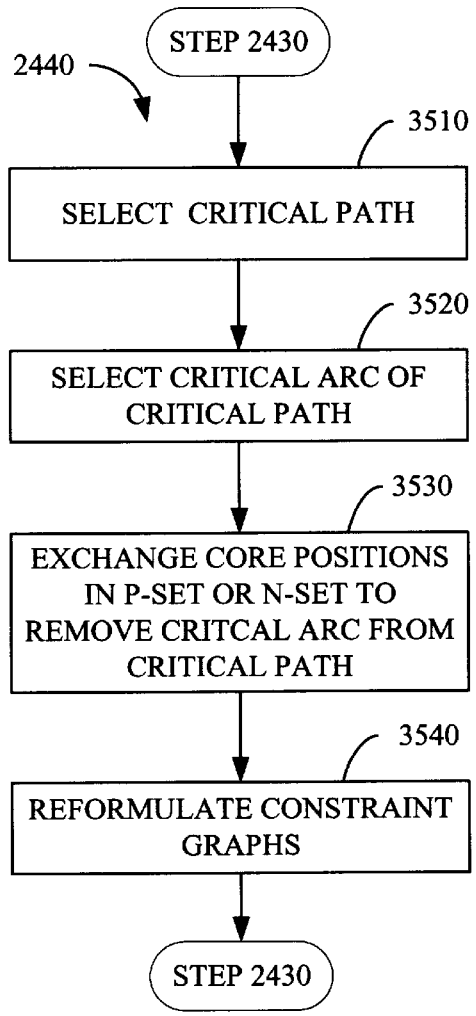
FIG. 35 is a flow diagram showing steps associated with a constraint graph revision process in accordance with an embodiment of the present invention.

FIGS. 34(A) and 34(B) are diagrams including data utilized to calculate path slacks in Step 3220 in accordance with one embodiment of the present invention. FIG. 34(A) includes horizontal constraint graph feasibility data table 3410 that is associated with H-graph 3310, and FIG. 34(B) includes vertical constraint graph feasibility data table 3420 that is associated with V-graph 3120 (with all path values zeroed). Horizontal constraint graph feasibility data table 3410 includes data associated with the four horizontal paths (HOR PATH), designated HP1 through HP4, that are associated with H-graph 3310 (see FIG. 33). The data associated with each horizontal path includes the identity of each core (CORE) in the horizontal path, along with the width (WDTH), designated in CLB sites, of the identified core. Because all arc lengths are zero, the total path length (PATH LNGTH) is computed by adding the widths of all cores in the horizontal path. The total width (FPGA WIDTH) of the target FPGA is provided for reference. The slack of each horizontal path is computed by subtracting the path length from the total FPGA width (i.e., FPGA WIDTH minus PATH LNGTH equals SLACK). Similarly, vertical constraint graph feasibility data table 3420 includes data associated with vertical paths (VER PATH), designated VP1 through VP4, that are associated with V-graph 3120 (see FIG. 31(B)). The data associated with each vertical path includes the identity of each core (CORE) in the vertical path, along with the height (HGHT), of the identified core. With all arc lengths zeroed, the total path length (PATH LNGTH) is computed by adding the heights of all cores in the vertical path. The total height (FPGA HGHT) of the target FPGA is provided for reference. The slack (SLACK) value of each vertical path is computed by subtracting the path length from the total FPGA height (i.e., FPGA HGHT minus PATH LNGTH equals SLACK).

The slack value of each horizontal and vertical path is utilized to determine the feasibility of the horizontal and vertical constraint graphs in accordance with Step 3230. Specifically, if the slack value is either zero or a positive number, then the path is feasible because the total CLB site requirements for the path are met by the available FPGA width. For example, horizontal path HP1 includes cores F and M, which have respective widths of three and four CLB sites. With all arc distances temporarily set to zero in Step 3210, the total path length (PATH LNGTH) of horizontal path HP1 is seven CLB sites. Assuming the width of the target FPGA (FPGA WIDTH) is ten CLBs, the slack for horizontal path HP1 is three CLB sites, yielding the positive slack value "3". Similarly, vertical path VP1 includes only core F, which has a height of six CLB sites. Assuming the height of the target FPGA (FPGA HGHT) is ten CLBs, the SLACK for vertical path VPl is "4" (four) CLB sites. When all slack values in horizontal constraint graph feasibility data table 3410 and vertical constraint graph feasibility data table 3420 are positive or zero, control passes from Step 3230 (FIG. 32) to Step 2450 (see FIG. 24).

Infeasible paths are identified by negative slack values. That is, when the path length is greater than the width/height of the target FPGA, then the slack computation (i.e., FPGA WIDTH/HGHT minus PATH LNGTH equals SLACK) yields a negative value. A negative slack value indicates the infeasibility of a path because it indicates that the number of CLB sites required to place the path are greater than the total number of actual CLBs provided by the target FPGA. For example, horizontal path HP3 includes core F (three CLB sites wide), core G (three CLB sites wide), core J (four CLB sites wide) and core K (two CLB sites wide), which combine to produce a path length of twelve (12) CLB sites. Assuming the FPGA width is ten CLBs, horizontal path HP3 has a negative slack value (indicated by reference numeral 3415) of "−2" (negative two). When one or more slack values in horizontal constraint graph feasibility data table 3410 or vertical constraint graph feasibility data table 3420 are negative, control passes from Step 3230 (FIG. 32) to Step 2440 (see FIG. 24). Because horizontal path HP3 has a negative slack value, H-graph 3110 is infeasible. Therefore, control passes from Step 3230 to Step 2440.

FIG. 35 is a flow diagram showing the steps associated with the revision of infeasible constraint graphs in Step 2440 (FIG. 24) in accordance with an embodiment of the present invention. This revision process begins by selecting a critical path from an infeasible constraint graph (Step 3510). Next, a critical arc of the critical path is selected (Step 3520). The cores located on each end of the critical arc are then exchanged in either the P-set or the N-set such that the critical arc is removed from the critical path (Step 3530). Finally, the H-graph and the V-graph are reformulated using the revised P-set and N-set (Step 3540), and then control is passed back to Step 2430 to check the feasibility of the reformulated graphs.

In one embodiment, selection of the critical path (Step 3510) includes identifying the critical path having the greatest negative slack in horizontal constraint graph feasibility data table 3410 and vertical constraint graph feasibility data table 3420. Applying this embodiment in the above example, the selection of horizontal path HP3 as the critical path is trivial because it is the only critical path. When both the H-graph and the V-graph have critical paths with equal negative slack values, then the selection of one of the critical paths can be made randomly, or based on a predetermined basis, such as alternatively selecting the V-graph and H-graph critical path. Control then passes to Step 3520.

The selected critical path is made feasible by removing a selected core from the critical path, thereby reducing the length of the critical path such that it is equal to or less than the width/height of the target FPGA. However, a core removed from the critical path must be assimilated into another location of the configuration data table 706(2). Consequently, a selected core that is removed from the critical path may create new, and potentially more serious, critical paths. For example, as discussed above with respect to FIG. 23(A), if core G is moved to the left, new overlap conditions are created that can only be removed by substantial repositioning of the cores, thereby yielding an unacceptable final placement solution. To avoid significant unproductive processing time, the core removed from the selected critical path should be selected after the consequences of its removal have been analyzed.

The task of removing a selected core from a critical path is achieved by removing a critical arc from the constraint graph that is connected to the selected core. The term "critical arc" is used herein to identify the arc selected for removal. By removing a critical arc from the critical path, the selected core becomes displaced from the critical path, and the length of the critical arc is reduced by the width/ height of the selected core. Specifically, by removing a critical arc in the H-graph, based on the formulation rules associated with the generation of constraint graphs, a selected core must be relocated above (or below) the critical horizontal path. Similarly, by removing a critical arc in the V-graph, a selected core must be relocated to the right (or left) of the critical vertical path.

The selection of a critical arc of the critical path (Step 3120) utilizes a cost analysis that is driven by the effect that the removal of an arc has on the constraint graphs. In an embodiment of the present invention, the cost analysis associated with the selection of a critical arc is quickly generated by determining the number of new arcs created/old arcs removed in the H-graph and V-graph from the relative position of the arc in the P-set and N-set of the placement solution. In other words, the effect of removing an arc from the H-graph or the V-graph can be predicted based on the relative position of the cores connected by the arc. When the arc is removed from the H-graph, the creation of new arcs and the removal of old arcs (i.e., in addition to the critical arc) can be quickly calculated The effect of removing an arc between a first core S and a second core T from an H-graph is shown in FIGS. 36(A) through 39(B).

Figure 36A:
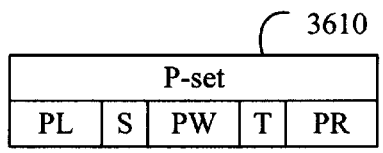
FIGS. 36(A) and 36(B) are diagrams showing examples of a P-set and an N-set, respectively, that list sample cores S and T relative to other cores in a generalized placement solution.
Figure 36B:
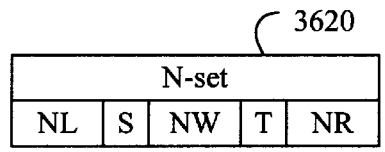

FIGS. 36(A) and 36(B) respectively show a P-set 3610 and an N-set 3620 incorporating first core S and second core T. In P-set 3610, "PL" represents the set of all cores located to the left of core S, "PR" represents the set of all cores located to the right of core T, and "PW" represents the set of all cores located between core S and core T. Similarly, in N-set 3620, "NL" represents the set of all cores located to the left of core S, "NR" represents the set of all cores located to the right of core T, and "NW" represents the set of all cores located between core S and core T.

Figure 37A:
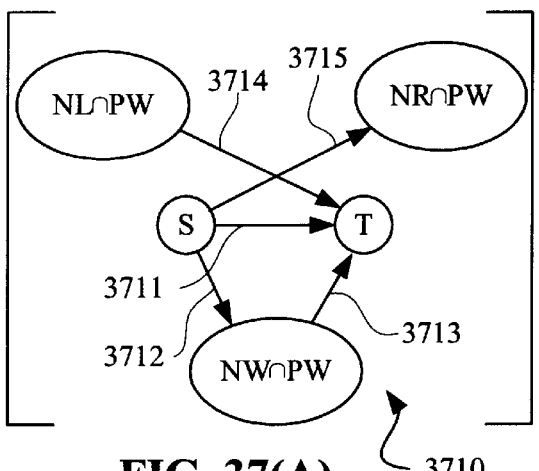
FIGS. 37(A) and 37(B) are a horizontal constraint graph and a vertical constraint graph, respectively, that are generated by the P-set and N-set of FIGS. 36(A) and 36(B).
Figure 37B:
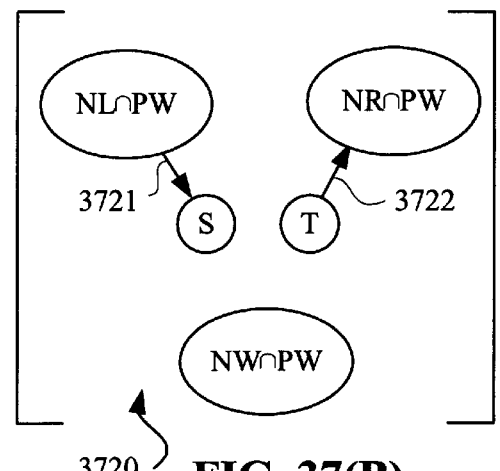

FIGS. 37(A) and 37(B) respectively show an H-graph 3710 and a V-graph 3720 generated in accordance with P-set 3610 and N-set 3620. Because the order of cores S and T is the same in both P-set 3610 and N-set 3620, an arc 3711 is drawn from core S to core T in H-graph 3710. Other arcs are drawn between cores S and T and the other cores in P-set 3610 and N-set 3620. Specifically, "NL∩PW" represents the set of cores located in both set NL and set PW, "NR∩PW" represents the set of cores located in both set NR and set PW, and "NW∩PW" represents the set of cores located in both set NW and set PW. Based on the rules of constraint graph construction, H-graph 3710 includes an arc 3712 extending from core S to set NW∩PW, an arc 3713 extending from set NW∩PW to core T, an arc 3714 extending from set NL∩PW to core T, and an arc 3715 extending from core S to set NR∩PW. In addition, V-graph 3720 includes an arc 3721 extending from set NL∩PW to core S, and an arc 3722 extending from core T to set NR∩PW.

Figure 38A:
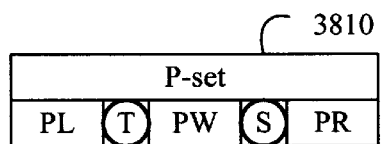
FIGS. 38(A) and 38(B) are diagrams showing the P-set and N-set, respectively, in which sample cores S and T are exchanged to eliminate an arc in the horizontal constraint graph.
Figure 38B:
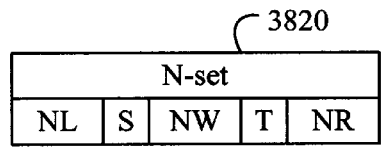

FIGS. 38(A) and 38(B) respectively show a P-set 3810 and an N-set 3820 showing the positions of core S and core T required to remove arc 3711. That is, based on the rules of constraint graph construction, arc 3711 must be removed after cores S and T are exchanged in P-set 3810 because the order of these cores is different in P-set 3810 and N-set 3820.

Figure 39A:
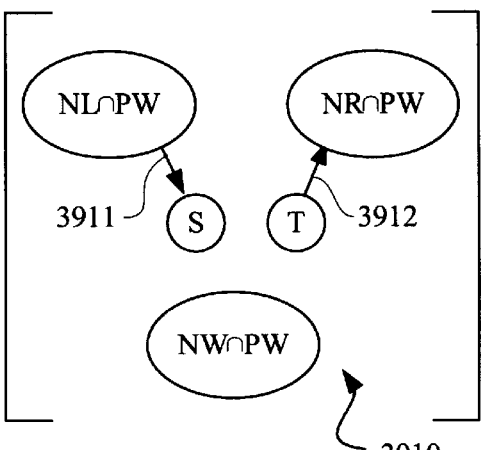
FIGS. 39(A) and 39(B) are a horizontal constraint graph and a vertical constraint graph, respectively, that are modified in response to the core exchange shown in the P-set and N-set of FIGS. 38(A) and 38(B).
Figure 39B:
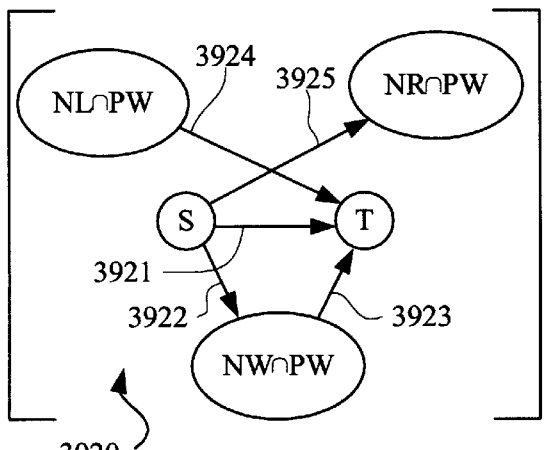

FIGS. 39(A) and 39(B) respectively show the new arcs in an H-graph 3910 and a V-graph 3920 that are generated by the exchange of cores S and T in P-set 3810 and N-set 3820. Note that arcs 3712, 3713, 3714 and 3715 are eliminated from H-graph 3910 in response to the removal of arc 3711. In addition, arcs 3721 and 3722 are removed from V-graph 3920. Further, several new arcs are created in H-graph 3910 and V-graph 3920. AS shown in FIG. 39(A), H-graph 3910 includes an arc 3911 extending from set NL∩PW to core S, and an arc 3912 extending from core T to set NR∩PW. As shown in FIG. 39(B), V-graph includes new arc 3921 extending from core S to core T, new arc 3922 extending from core S to set NW∩PW, new arc 3923 extending from set NW∩PW to core T, new arc 3924 extending from set NL∩PW to core T, and new arc 3925 extending from core S to set NR∩PW.

The effect of removing an arc between a first core S and a second core T from a V-graph is shown in FIGS. 40(A) through 44(B).

FIGS. 40(A) and 40(B) respectively show a P-set 4010 and an N-set 4020 incorporating first core U and second core V. In P-set 4010, "PL" represents the set of all cores located to the left of core V, "PR" represents the set of all cores located to the right of core U, and "PW" represents the set of all cores located between core V and core U. Similarly, in N-set 4020, "NL" represents the set of all cores located to the left of core U, "NR" represents the set of all cores located to the right of core V, and "NW" represents the set of all cores located between core U and core V.

FIGS. 41(A) and 41(B) respectively show an H-graph 4110 and a V-graph 4120 generated in accordance with P-set 4010 and N-set 4020. Because the order of cores U and V is the different in P-set 4010 and N-set 4020, an arc 4121 is drawn from core U to core V in V-graph 4120. Other arcs are drawn between cores U and V and the other cores in P-set 4010 and N-set 4020. Specifically, H-graph 4110 includes an arc 4111 extending from set PL∩NW to core V, and an arc 4112 extending from core U to set PR∩NW. In addition, V-graph 4120 includes an arc 4122 extending from core U to set NW∩PW, an arc 4123 extending from set NW∩PW to core V, an arc 4124 extending from core U to set PL∩NW, and an arc 4125 extending from set PR∩NW to core V.

FIGS. 42(A) and 42(B) respectively show a P-set 4210 and an N-set 4220 showing the positions of core U and core V required to remove arc 4121 from V-graph 4120. That is, based on the rules of constraint graph construction, arc 4121 must be removed after cores U and V are exchanged in N-set 4220 because the order of these cores becomes the same in both P-set 4210 and N-set 4220.

FIGS. 43(A) and 43(B) respectively show the removal of old arcs and generation of new arcs in an H-graph 4310 and a V-graph 4320 that result from the exchange of cores U and V in N-set 4210. Note that arcs 4111 and 4112 are eliminated from H-graph 4310 in response to the removal of arc 4121. In addition, arcs 4122, 4123, 4124, and 4125 are removed from V-graph 4320. Further, several new arcs are created in H-graph 4310 and V-graph 4320. As shown in FIG. 43(A), H-graph 4310 includes an arc 4311 extending from core U to core V, and an arc 4312 extending from set NW∩PW to core V, an arc 4313 extending from core U to set NW∩PW, an arc 4314 extending from set PL∩NW to core V and an arc 4315 extending from core U to set PR∩NW. As shown in FIG. 43(B), V-graph includes new arc 4321 extending from set PR∩NW to core U, and new arc 4322 extending from core V to set PL∩NW.

Utilizing the arc generation/removal information that is depicted in FIGS. 36(A) through 43(B), the effect of removing a particular arc from a critical path is easily and quickly determined. In particular, once an arc is selected for analysis, the two cores connected by the arc are identified. The two cores associated with the selected arc can be inserted in place of cores S and T in P-set 3610 and N-set 3620 (FIGS. 36(A) and 36(B)) or in place of cores U and V in P-set 4010 and N-set 4020 (FIGS. 40(A) and 40(B)). All other cores fall into the sets PL, PW, PR, NL, NW and NR based on their positional relationship with the two cores. Based on the arc generation and removal information shown in FIGS. 36(A) to 43(B), the effect of new arcs generated and old arcs removed in response to exchanging the two cores is easily and quickly determined. The effect of the new arcs on path slacks is used to calculate the cost of the exchange, and to identify the critical arc. Additional criteria such as number of critical paths passing through the arc are used to break ties. After the critical arc is selected, control passes to Step 3530.

FIGS. 44(A) and 44(B) respectively show a P-set 4410 and an N-set 4420 that are modified in Step 3530. Assuming the critical arc selected in Step 3520 is arc 3316 (see FIG. 33), then cores J and K are exchanged as indicated in P-set 4410 (FIG. 44(A)) to eliminate this arc from H-graph 3310. Note that N-set 4420 is not changed. Control then passes to Step 3540.

FIGS. 45(A) and 45(B) illustrate H-graph 4510 and V-graph 4520 that are modified in response to the exchange of cores J and K in Step 3530. Control then passes back to Step 2430 (see FIG. 24).

The revision of infeasible constraint graphs process (Step 2440) is repeated until both graphs are feasible in Step 2430. When Step 2430 is called after the formation of H-graph 4510 and V-graph 4520, the feasibility of these constraint graphs is again determined. As indicated in FIG. 45(A), core J is no longer in the same path as core K, thereby reducing the length of the path including core K. Further, by summing the widths of each core in the paths of H-graph 4510, it can be shown that none of the paths has a length greater than ten CLB sites. Therefore, H-graph 4510 is feasible. However, as indicated in vertical constraint graph feasibility table 4620, the fourth path of V-graph 4520 (including arc 4521, core H, arc 4522, core J, arc 4523, core K, arc 4524, core M and arc 4525, as shown in FIG. 45(B)) has a length of eleven CLB sites, producing a negative slack value 4625 of "–1" (negative one). Therefore, control is again passed from Step 2430 to Step 2440.

Figure 47A:
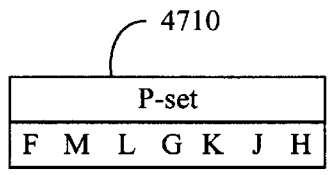
FIGS. 47(A) and 47(B) are diagrams showing the P-set and N-set, respectively, in which cores M and K of the second logic operation are exchanged to eliminate a critical arc from the vertical constraint graph shown in FIG. 45(B).
Figure 47B:
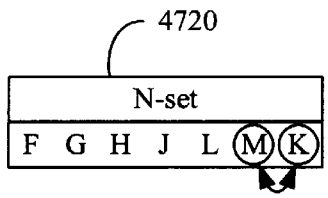

FIGS. 47(A) and 47(B) illustrate the exchange of cores M and K in N-set 4720 in accordance with the second iteration of Step 3530 (this assumes arc 4524 is selected as the critical arc in the second iteration of Step 3520).

Figure 48A:
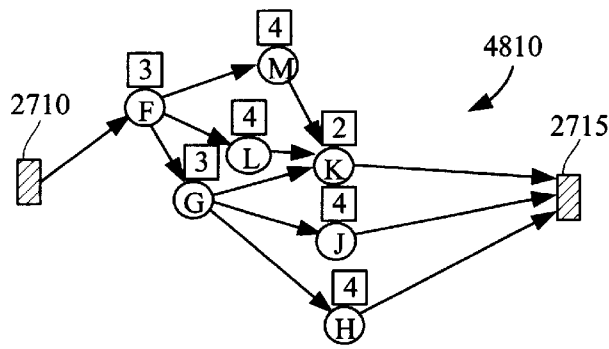
FIGS. 48(A) and 48(B) are a horizontal constraint graph and a vertical constraint graph, respectively, that are modified in response to the core exchange shown in the P-set and N-set of FIGS. 47(A) and 47(B).
Figure 48B:
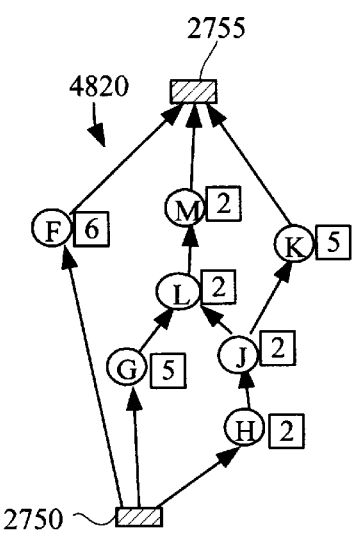

FIGS. 48(A) and 48(B) show an H-graph 4810 and a V-graph 4820 that are generated in response to modified P-set 4710 and N-set 4720. Control then passes back to Step 2430.

As indicated in FIGS. 48(A) and 48(B), the effect of removing critical arc 4524 from the fourth vertical path is to shift core M out of the fourth path. Although other path adjustments are generated in response to this action, none of the horizontal paths and vertical paths has a length greater than ten CLB sites. Therefore, the result of Step 2430 is positive (Y), and control passes to Step 2450.

Only one of several possible techniques is utilized in the above-described embodiment directed to revising infeasible constraint graphs (Step 2440). In an alternative embodiment, the core swapping (exchanging) technique described above is replaced with a core moving technique whereby a selected critical core is moved (without swapping) in the P-set and/or the N-set. In another embodiment, the well-known compaction technique is utilized, intermixed with the swapping or moving techniques.

Figure 49:
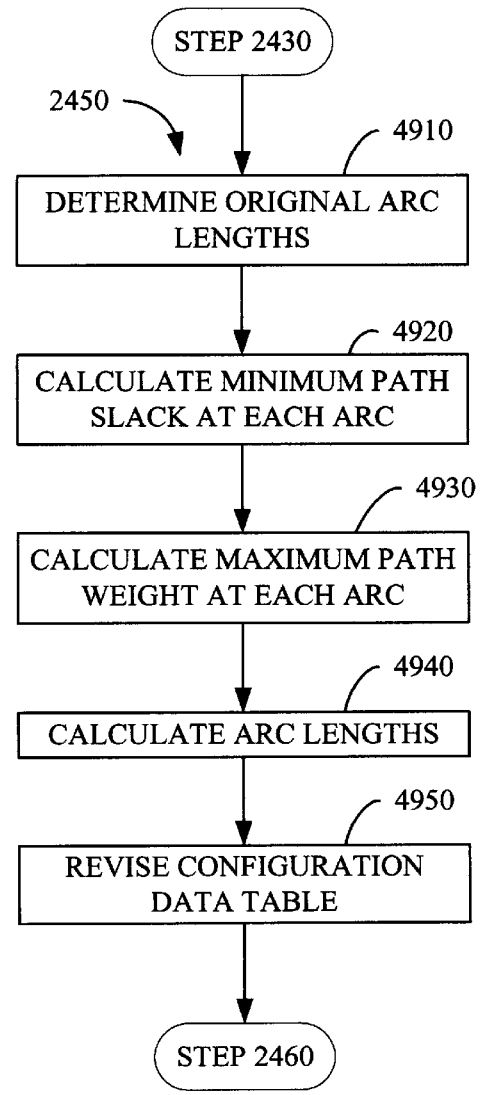
FIG. 49 is a flow diagram showing steps associated with a slack allocation process in accordance with an embodiment of the present invention.

FIG. 49 is a flow diagram showing the steps associated with the slack allocation process of Step 2450 (FIG. 24) in accordance with an embodiment of the present invention. The slack allocation process begins by determining the original arc lengths (arc weights) for all arcs in the revised H-graph and V-graph that are formed in Step 2440 (Step 4910). Next, a minimum path slack is calculated for each arc (Step 4920), and a maximum path weight is calculated for each arc (Step 4930). The final arc length for each arc is then calculated by multiplying the original arc weight times the minimum path slack for that arc, and then dividing by the maximum path weight for the arc (Step 4940). Finally, the final arc lengths are used to reposition the cores in configuration data table 706(2) (Step 4950), and then control is passed to Step 2460 (see FIG. 24).

The purpose of the slack allocation process is to determine how much slack is available in each path for adjustment of core positions, and how this slack is distributed among the various arcs so that the final position of each core is as close to its original position as possible without overlapping. Once the path slacks are obtained, the slack for each path is distributed amongst the arcs in that path based on the arc-weights that are determined by the original placement values. In reality, the following steps associated with slack allocation are performed using a fast arc-based slack analysis, which determines the minimum path slacks and maximum path weights for each arc directly, in linear time, without explicitly doing any path-analysis. This fast arc-based slack analysis will be apparent to those of ordinary skill in the art upon reviewing the following examples.

Figure 50A:
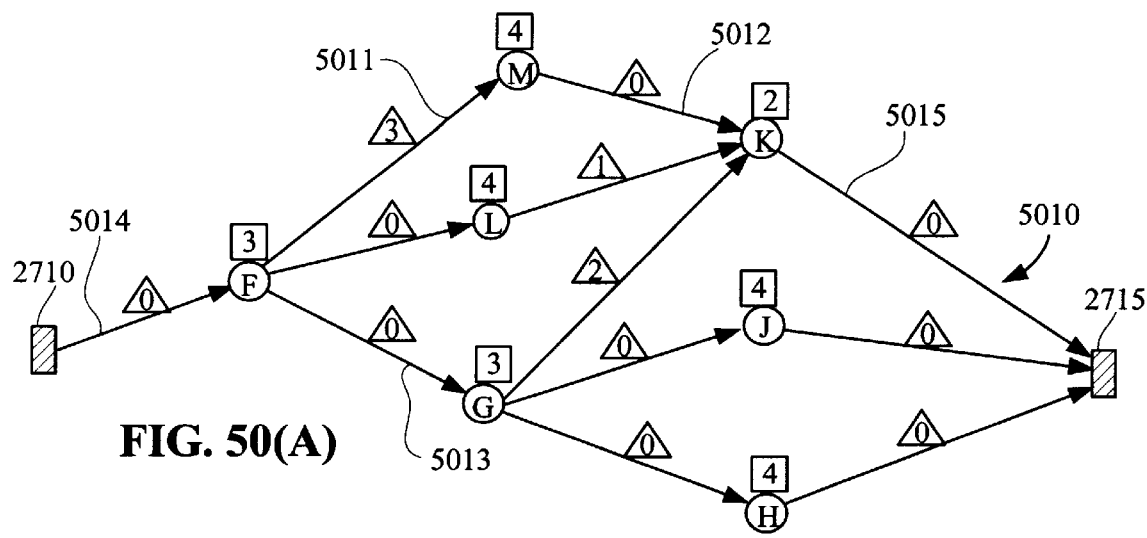
FIGS. 50(A) and 50(B) are a horizontal constraint graph and a vertical constraint graph, respectively, that are modified to include original arc lengths.
Figure 50B:
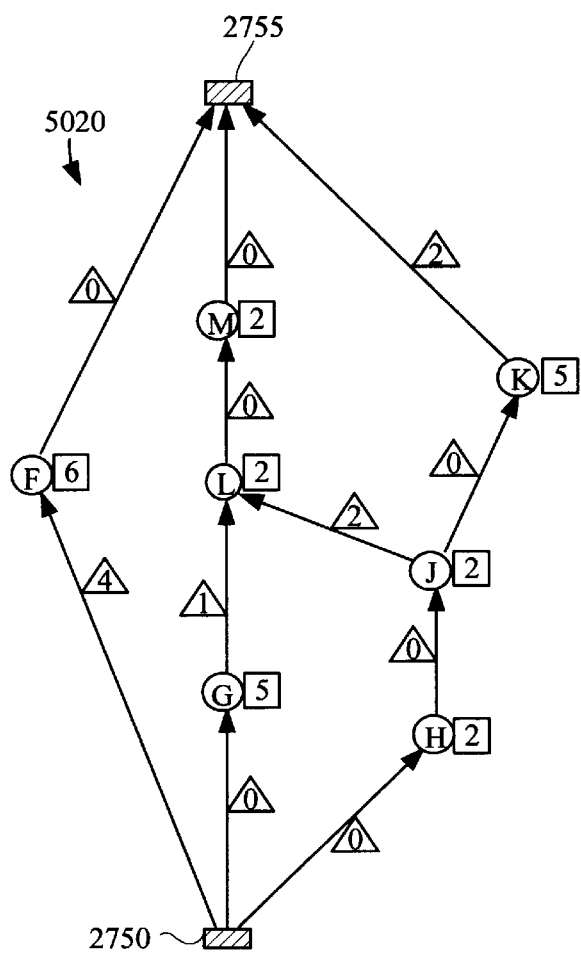

FIGS. 50(A) and 50(B) show H-graph 5010 and V-graph 5020, respectively, as modified in accordance with Step 4910. In particular, each arc length (arc weight) is entered in accordance with the original placement position of the various cores. Where identical arcs exist in both the original and final graphs, the arc length is simply transferred to H-graph 5010 and V-graph 5020. For example, arc 5011 in H-graph 5010 (i.e., from core F to core M) corresponds with arc 3112 in H-graph 3110. Therefore, the arc value for arc 5011 (i.e., the original horizontal distance from the right edge of core F to the left edge of core M) can be copied directly from arc 3112. However, because some of the paths of H-graph 5010 and V-graph 5020 differ from those of the original placement, some of the arc values for the new graphs must be calculated from the original placement position of the cores. For example, arc 5012 of H-graph 5010 (i.e., between cores M and K) does not have a corresponding arc value in original H-graph 3110. Therefore, the distance between cores M and K must be determined from the original placement data. Referring to FIG. 27, the right edge of core M extends two CLB sites past the left edge of core K in the original placement solution. However, by definition, no overlaps exist between cores M and K in the final solution. Therefore, all negative arc values are changed to zero in Step 4910. After all original arc lengths are determined, control passes to Step 4920.

The slack allocation process is performed independently on H-graph 5010 and V-graph 5020 to generate horizontal arc lengths and vertical arc lengths. The horizontal and vertical arc values are then combined in Step 4970 to generate configuration data associated with the final placement solution. Because the slack allocation process performed on V-graph 5020 is essentially identical to that performed on H-graph 5010, a description of the slack allocation process for V-graph 5020 is omitted.

The minimum path slack value (calculated in Step 4920) for a particular arc indicates the maximum length that arc can be assigned, as determined by all of the paths passing through that arc. For example, referring to FIG. 50(A), arc 5013 (from core F to core G) is part of three separate paths (F-G-K, F-G-J and F-G-H). The total slack for the F-G-K path is two CLB sites (calculated by adding the widths of cores F, G and K, and ignoring the arc lengths). However, the slack for paths F-G-J and F-G-H is zero (i.e., the sum of both sets of core widths is ten CLB sites). Therefore, the minimum path slack for arc 5013 is zero. In other words, if arc 5013 were assigned a length of one or more, then both the F-G-H and F-G-H paths would be longer than the total width of the target FPGA.

Figure 51A:
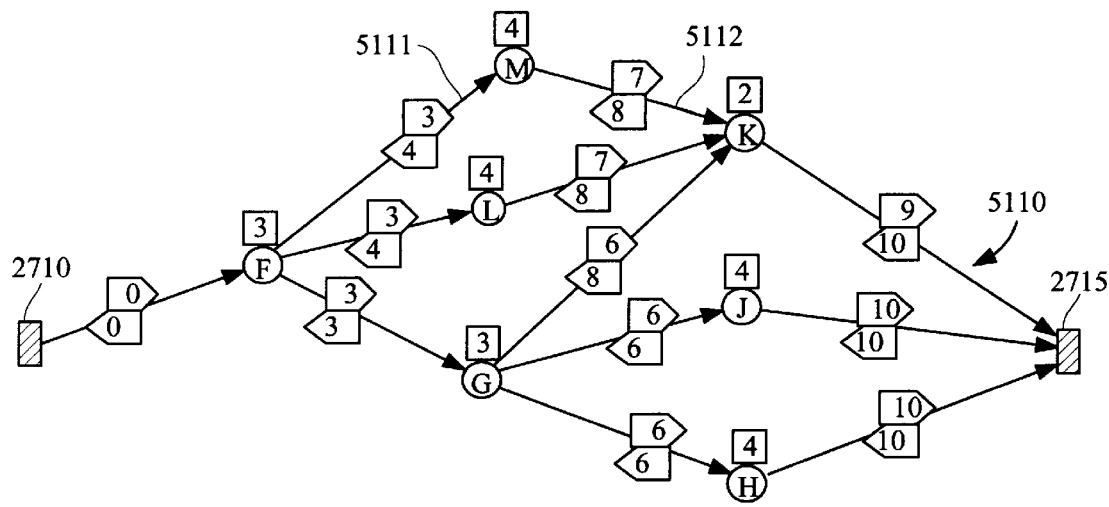
FIGS. 51(A) and 51(B) are horizontal constraint graphs including data indicating the calculation of distance slack values utilized in the slack allocation process.
Figure 51B:
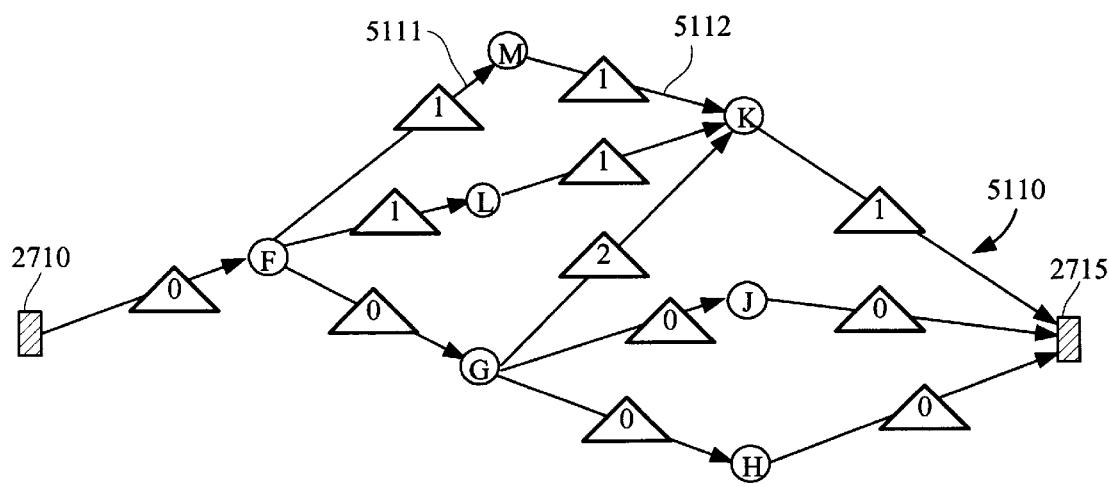

FIGS. 51(A) and 51(B) show a modified H-graph 5110 that graphically depicts the calculation of minimum path slack values at each arc in accordance with an embodiment of Step 4920. The arc lengths of H-graph 5110 are ignored (e.g., temporarily set to zero) during the calculation of the slack values. Next, a left-to-right propagation analysis is performed in which a propagation value is calculated at each arc. These propagation values are shown in the box superimposed on each arc that is formed with a rightward pointing arrow. The left-to-right propagation values start with a zero value on the arc extending from left edge 2710 of H-graph 5210, and are increased by the width of each core traversed over the course of the path from left edge 2710 to right edge 2715. For example, the propagation values for arcs 5111 and 5112, which are part of a first path of H-graph 5110, are determined by the width of cores F and core M, respectively. That is, core F has a width of three CLB sites, and there are no cores located to the left of core F. Therefore, the propagation value for arc 5111 is three. Similarly, core M has a width of four CLB sites, and is in the same path as arc 5111. Therefore, arc 5112 has a propagation value of seven because of the presence of core F to the left of core M in the first path. Next, a right-to-left required distance slack analysis is performed which provides required distance values at each arc. These required distance values are shown in the box superimposed on each arc that is formed with a leftward pointing arrow. The required distance slack values start with the FPGA width (e.g., ten CLBs) at arc extending to right edge 2715, and are decreased at each arc core by the width of the core traversed in the reverse direction along each path. For example, the required distance value at arc 5112 is eight (ten minus two CLB sites for core K). Similarly, the required distance value at arc 5111 is four (ten minus two CLB sites for core K, and minus four CLB sites for core M). Finally, as shown in FIG. 51(B), the propagation value for each arc is subtracted from the required distance value to provide the distance-based slack value for each arc (indicated in the triangle superimposed on each arc). For example, the distance-based slack value at arc 5111 is one CLB site (four CLB sites minus three CLB sites). Similarly, the distance-based slack value at arc 5112 is also one CLB site (eight CLB sites minus seven CLB sites). Similar values are provided for all other arcs of H-graph 5110. The final path slack value thus derived for each arc is the minimum of the slacks of all paths passing through the arc.

The maximum path weight value (calculated in Step 4930) for a particular arc is the weight value (representing total length of all arcs) associated with the path passing through that arc that has the greatest weight value of all paths passing through the arc. For example, referring to FIG. 50(A), arc 5011 (from left edge 2710 to core G) has a length of three CLB sites, but all other arcs in path F-M-K (i.e., arcs 5012, 5014 and 5015) have lengths of zero. Therefore, the total path weight for path F-M-K is three CLB sites. Because the largest path weight of all paths in H-graph 5010 is three CLB sites, each arch of the F-M-K is assigned a maximum path weight value of three CLB sites.

Figure 52A:
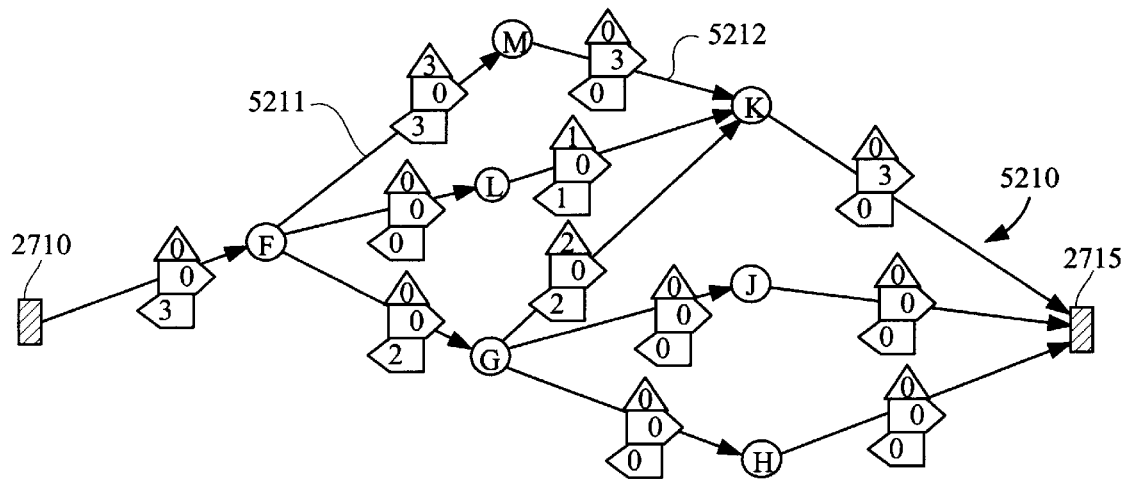
FIGS. 52(A) and 52(B) are horizontal constraint graphs including data indicating the calculation of path weight values utilized in the slack allocation process.
Figure 52B:
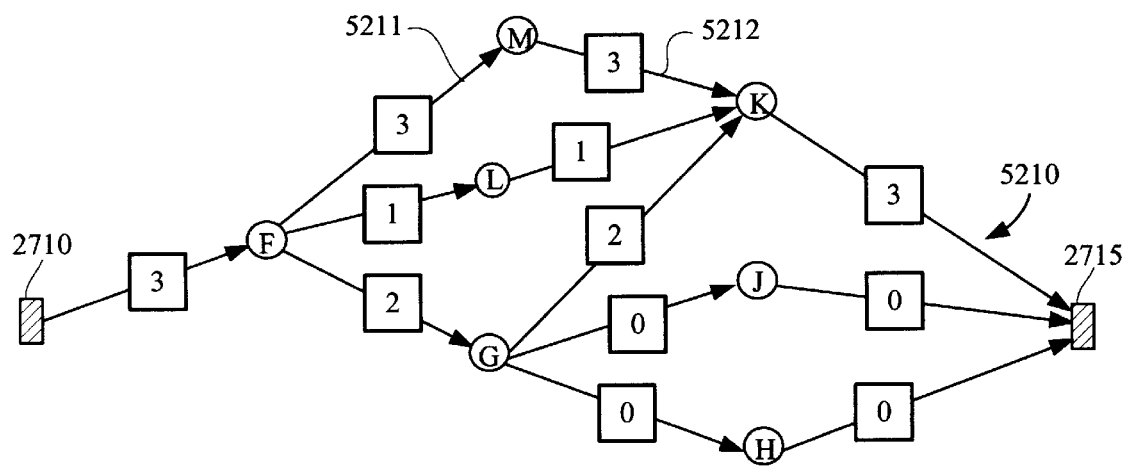

FIGS. 52(A) and 52(B) show a modified H-graph 5210 that graphically depicts the calculation of maximum path weights for each arc in accordance with an embodiment of Step 4920. In contrast to the calculation of minimum path slack values, the original arc lengths are utilized in the calculation of maximum path weights, and the core widths are ignored (e.g., temporarily set to zero). The original arc lengths are shown in triangles. Next, a left-to-right propagation analysis is performed in which a propagation value is calculated at each arc. These propagation values are shown in the box superimposed below each arc length that is formed with a rightward pointing arrow. The left-to-right propagation values start with a zero value on the arc extending from left edge 2710 of H-graph 5210, and are increased by the length of each arc traversed over the course of the path from left edge 2710 to right edge 2715. For example, the propagation value for arc 5211, which is part of the first path of H-graph 5210, is determined by the lengths of the arcs located to the left of core F. That is, because the arc pointing to core F has a length of zero CLB sites, the propagation value for arc 5211 is zero. In contrast, arc 5212 is assigned a propagation value of three because of the length of arc 5211 (i.e., three CLB sites). Similar propagation values are provided along each path of H-graph 5210. Next, a right-to-left propagation analysis is performed that provides right-to-left propagation values at each arc. These propagation values are shown in the box superimposed on each arc that is formed with a leftward pointing arrow. The right-to-left propagation values start with a zero value at the arc extending to right edge 2715, and are increased at each arc by the width of the arc traversed in the reverse direction along each path. For example, the right-to-left propagation value at arc 5212 is zero because no arc is traversed that has a positive length value. Similarly, the right-to-left propagation value at arc 5211 is three because arc 5211 (having a length of three CLB sites) is traversed along the first path before reaching arc 5211. Finally, as shown in FIG. 52(B), the left-to-right propagation value for each arc is added to the right-to-left propagation value to provide the maximum path weight for each arc (indicated in the box superimposed on each arc). For example, the maximum path weight at arc 5211 is three (zero plus three). Similarly, the maximum path weight at arc 5212 is also three (three plus zero). Similar values are provided for all other arcs of H-graph 5210. The maximum path weight value thus calculated for each arc is the maximum of the path weights of all paths passing through the arc.

Figure 53A:
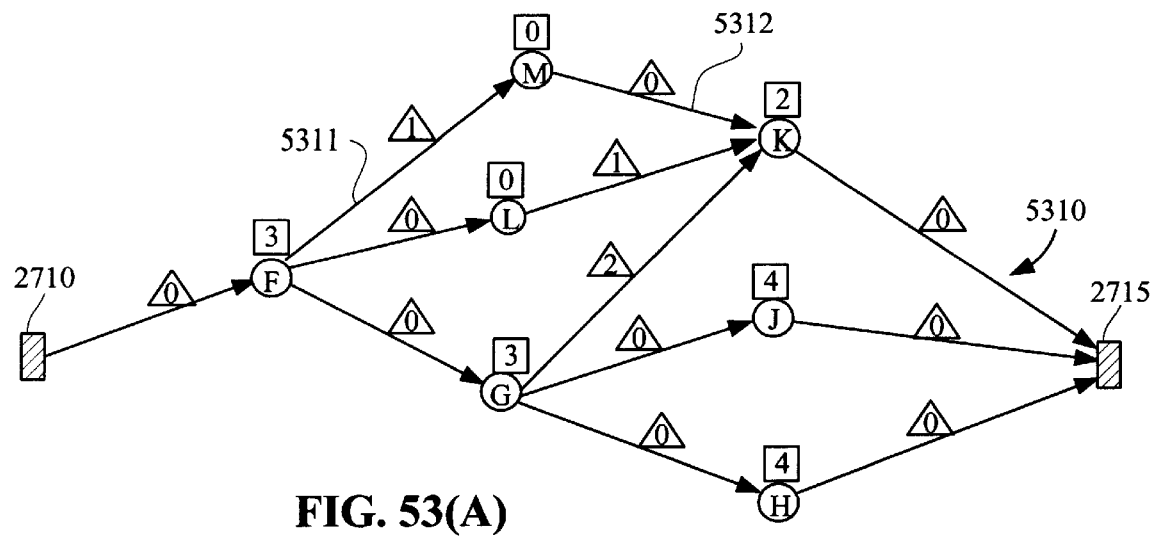
FIGS. 53(A) and 53(B) are a horizontal constraint graph and a vertical constraint graph, respectively, that are modified to include final arc values calculated during the slack allocation process.
Figure 53B:
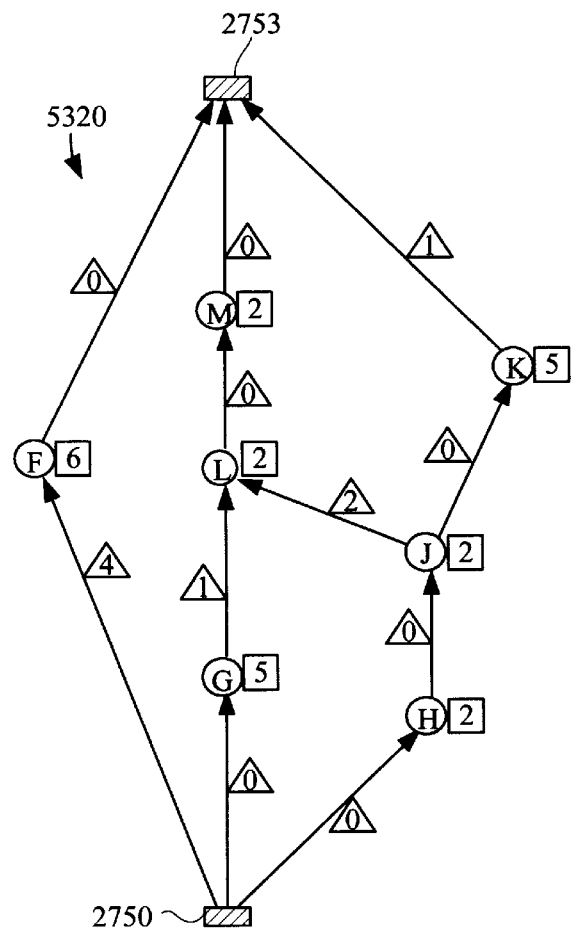

FIGS. 53(A) and 53(B) show an H-graph 5310 and a V-graph 5320 that include the final arc length values calculated in accordance with Step 4940. In particular, the slack value for each arc is calculated by multiplying the original arc weight (from Step 4910) times the minimum path slack value assigned to the arc (from Step 4920), and then divided by the maximum path weight value assigned to the arc (from Step 4930). For example, the slack value for arc 5311 is calculated by multiplying the original arc weight (three CLB sites) times its minimum path slack value (one CLB site) divided by its maximum path weight value (three CLB sites), which produces a final arc length of one CLB site. Similarly, the final arc length of arc 5312 is calculated from the original arc weight (zero) times the minimum path slack value (one) divided by the maximum path weight value (two), which produces a final arc length of zero. FIGS. 53(A) and 53(B) show a final H-graph 5310 and a final V-graph 5320 that include the arc lengths generated by slack allocation. After all the arc lengths are calculated for graph 5310 and V-graph 5320, control then passes to Step 4950.

During slack allocation, a common problem is determining where to allocate residual slack. For example, assume a path in a V-graph includes three arcs P, Q and R having original arc lengths of one CLB site, one CLB site and two CLB sites, respectively. Assume further that the minimum path slack for the path (after constraint graph revision) is 14, and that the maximum path weight is four. Based on these assumptions, the final arc lengths for arcs P, Q and R are three (1×14/4), three (1×14/4) and seven (1×14/2), respectively. This leaves a residual slack of one CLB site to be distributed (and added) to arcs P, Q and R. However, it is not possible to assign fractions of CLB sites—only integer values can be assigned to the arcs. Therefore, the problem to be addressed is identifying which of the arcs P, Q and R is assigned the residual CLB site.

To solve the residual slack problem, the effect of adding a residual CLB site to a selected arc is determined for all "upstream" nodes (cores) that are part of paths including the selected arc. For example, assume arc P is bumped up by one (from three to four). Assuming arc P is located below arcs Q and R in the path, both the node (core) located between arcs P and Q and the node located between arcs Q and R (i.e., the nodes located upstream of arc P) will be "pushed" up by one CLB site. The term "critical node" is used to describe all nodes (cores) located on paths originating from, for example, arc P (i.e., the arc to which the residual slack is allocated). The goodness of the decision to increasing the length of arc P by one CLB site (i.e., the residual slack) is dependent upon the effect of that this increase on all critical nodes on the paths that fanout from arc P.

To calculate the goodness of the increase to arc P on a critical node N located upstream of arc P, let the current distance (i.e., after the initial allocation of three CLB sites to node P) of critical node N from the origin in the upward direction) be "d". Let the original distance (based on the original placement solution) of critical node N be "od". The distance of critical node N from its original/preferred location is changed from (d−od) to (d+1−od) by the allocation of residual slack to arc P. The allocation of residual slack to arc P is "good" if the increase of the current distance d by one brings critical node N closer to the original distance od. The "goodness" of allocating the residual slack to arc P can therefore be determined by the equation $(d+1-od)^2-(d-od)^2$. That is, the more negative a value this equation produces, the greater the "goodness" of the allocation to arc P. Therefore, the overall "goodness" of allocating the residual slack to arc P depends on the sum of the effects of all critical nodes located upstream of arc P. This overall "goodness" can be expressed by the equation:

$$\sum_{critical\ nodes} \{(d_N + 1 - od_N)^2 - (d_N - od_N)^2\}, \quad \text{(Eqn. 1)}$$

which can be rewritten $$\sum_{critical\ nodes} (2 \times (d_N - od_N) + 1). \quad \text{(Eqn. 2)}$$

Eqn. 2 is used to break ties during the slack allocation process. As with slack calculation, this goodness determination can be computed in linear time by examining nodes in topologically sorted order from output to inputs. After slack allocation, the final location of all cores (with no overlaps) is known.

FIG. 54 is a graphical representation of configuration data table 706(2) as modified in accordance with Step 4950. In particular, each of the cores is placed in accordance with the horizontal and vertical arc values calculated in Step 4940. It is noted that the final placement solution matches that provided in the intuitive approach shown in FIG. 24(D). After the cores are positioned in accordance with the new arc values, control passes to Step 2460 (FIG. 24).

FIG. 55 is a graphical representation of configuration data table 706(2) as modified in accordance with Step 2460. Referring back to FIG. 24, Step 2460 is called to replace individual logic portions 2210, 2220 and 2230 (see FIG. 22) that were removed in Step 2410. As mentioned above, the constraint-graph based residual overlap removal process is only applied to cores (i.e., objects including more than one CLB site). All individual logic portions are then placed in the remaining slots in as close to the original position as possible. This is done using a bipartite-matching technique. Bipartite matching is ideally suited for the problem of replacing individual logic portions, i.e., mapping N objects to S (>=N) slots with a fixed cost-matrix which represents the cost of putting an object n in slot s. The cost is the distance of s from the original position of n (os). Initially, the bipartite matching technique attempts to find a solution by assuming that object n can only go to slots s which are within a radius R from its original location (os). The value of R is slowly increased until a feasible solution is reached. The reason for this approach is to limit memory usage for very large chips. After the individual logic portions are replaced, control passes to Step 1050 (FIG. 10).

FIG. 56 is a graphical representation of configuration data table 706(2) as modified in accordance with Step 1050. As discussed above, the non-reference logic portions of the cores are placed in their assigned CLB sites in this step.

Although the present invention has been described in considerable detail with reference to certain preferred embodiments thereof, one of ordinary skill would recognize that variations to the disclosed embodiments are possible. For example, although the residual overlap removal process is described in terms of sequential steps, many of the numerical values utilized in, for example, the calculation of path slacks and slack allocation can be calculated in linear time without explicitly doing any path analysis. Therefore, the spirit and scope of the appended claims should not be limited to the description of the preferred embodiments contained herein.

We claim:

1. A post-placement residual overlap removal method for use in a core-based programmable logic device (PLD) programming process wherein the PLD is programmed to implement a logic operation, the PLD including a plurality of configurable logic blocks (CLBs) arranged in rows aligned in a horizontal direction and columns aligned in a vertical direction, the logic operation being defined by a plurality of cores, each core including a group of interrelated logic portions, wherein the logic portions of each core are assigned to a selected group of the plurality of CLBs during a placement portion of the PLD programming process to produce an original placement solution, the method comprising the steps of:

defining a positional relationship between the cores using a horizontal constraint graph and a vertical constraint graph, the horizontal constraint graph including a plurality of horizontal paths determined by a horizontal positional relationship of the cores assigned to each row of CLBs, and the vertical constraint graph including a plurality of vertical paths determined by a vertical positional relationship of the cores assigned to each column of CLBs;

determining the feasibility of the horizontal constraint graph and the vertical constraint graph by identifying critical paths in which the number of logic portions assigned to a row of CLBs or a column of CLBs is greater than the number of CLBs in the row of CLBs or the column of CLBs;

if one of the horizontal constraint graph and the vertical constraint graph is infeasible, revising the infeasible constraint graph by reassigning the logic portions of a selected core such that the number of logic portions assigned to the CLBs of the critical path are reduced;

repeating the steps of determining the feasibility and revising an infeasible constraint graph until both the horizontal constraint graph and the vertical constraint graph are feasible; and allocating slack along the paths of the horizontal and vertical constraint paths such that a revised placement solution is produced that is as close to the original placement solution as possible.

2. The method according to claim 1,
wherein the logic operation is also defined by one or more individual logic portions, and
wherein the method further includes:
  removing individual logic portions from the original placement solution prior to the step of defining the positional relationship between the cores; and
  replacing the individual logic portions into the revised placement solution after the step of allocating slack and forming a revised placement solution.

3. The method according to claim 2, wherein the step of replacing the individual logic portions is performed using bipartite matching.

4. The method according to claim 1, wherein the step of defining the positional relationship between the cores comprises the steps of:
  determining a two-dimensional relationship between edges of each core relative to the remaining cores of the plurality of cores, and relative to the edges of the PLD;
  identifying positive loci and negative loci based on the determined two-dimensional relationship;
  creating a positive sorted set (P-set) and a negative sorted set (N-set) in which the positive loci and negative loci are arranged in accordance with the positive loci and negative loci; and
  creating the horizontal constraint graph and the vertical constraint graph using the P-set and the N-set.

5. The method according to claim 4, wherein the step of determining the two-dimensional relationship includes identifying a horizontal distance, measured in CLB sites, between a vertical edge of a first core and a vertical edge of the PLD, wherein the horizontal distance between the vertical edge of the first core and the vertical edge of the PLD is a positive integer if a one or more columns of CLB sites is located between the vertical edge of the first core and the vertical edge of the PLD, and wherein the horizontal distance between the vertical edge of the first core and the vertical edge of the PLD is a zero if the vertical edge of the first core is between a peripheral column of CLB sites and the vertical edge of the PLD.

6. The method according to claim 4, wherein the step of determining the two-dimensional relationship includes identifying a horizontal distance, measured in CLB sites, between the vertical edges of a first core and the vertical edges of a second core, wherein the horizontal distance between the first core and the second core is a positive integer if one or more columns of CLB sites is located between a vertical edge of the first core and a vertical edge of the second core, and wherein the horizontal distance between the first core and the second core is a negative integer if the vertical edge of the first core overlaps the vertical edge of the second core such that logic portions of the first core and logic portions of the second core are assigned to a first CLB site.

7. The method according to claim 6, wherein the step of defining the positional relationship between the cores further comprises the step of temporarily modifying the vertical edges of the first core and the second core to eliminate the overlap before identifying the positive loci and the negative loci.

8. The method according to claim 4,
wherein the step of identifying positive loci includes the steps of extending horizontal line portions from a center of each core according to the two-dimensional relationship, wherein the horizontal line portion extending rightward from each core turns upward upon meeting a vertical edge, and the horizontal line portion extending leftward from each core turns downward upon meeting a vertical edge; and
wherein the step of identifying negative loci includes the steps of extending vertical line portions from a center of each core according to the two-dimensional relationship, wherein the vertical line portion extending upward from each core turns leftward upon meeting a horizontal edge, and the vertical line portion extending downward from each core turns rightward upon meeting a horizontal edge.

9. The method according to claim 4,
wherein the step of creating the horizontal constraint graph includes forming a horizontal arc between a first core and a second core of the horizontal constraint graph if the first core and the second core are arranged in the same order in both the P-set and the N-set, and
wherein the step of creating the vertical constraint graph includes forming a vertical arc between a third core and a fourth core of the vertical constraint graph if the third core and the fourth core are arranged in an opposite order in the P-set and the N-set.

10. The method according to claim 9,
wherein the horizontal arc is assigned an integer value indicating a number of columns of CLBs located between the first core and the second core in the original placement solution, and
wherein the vertical arc is assigned an integer value indicating a number of rows of CLBs located between the third core and the fourth core in the original placement solution.

11. The method according to claim 9,
wherein each horizontal path of the horizontal constraint graph includes a first arc extending from a left edge of the PLD to a left edge of a first core and a second arc extending from a right edge of a second core a right edge of the PLD,
wherein each horizontal path has a length determined by adding the widths of all of the cores and arc values assigned to all of the arcs located on said each horizontal path, and
wherein the step of determining the feasibility of the horizontal constraint graph includes:
  temporarily setting all of the arcs associated with each horizontal path to zero,
  calculating the slacks of each horizontal path by adding the widths of all of the cores in each horizontal path, and
  determining whether the slacks associated with any of the horizontal paths is a negative integer.

12. The method according to claim 4, wherein the step of revising infeasible constraint graphs comprises:
  selecting a critical path of the horizontal constraint graph and a vertical constraint graph that is infeasible; selecting an arc of the critical path;

revising one of the P-set and the N-set by exchanging the core positions in one of the P-set and the N-set such that the selected arc is removed from the critical path; and reformulating the horizontal constraint graph and the vertical constraint graph using the revised P-set and N-set.

13. The method according to claim 1, wherein the step of allocating slack comprises:

determining original are lengths between the plurality of cores in accordance with the original placement solution;

calculating the minimum pa th slack for each arc;

calculating the maximum path weight at each arc;

calculating arc lengths for each arc based on the minimum path slack and maximum path weight associated with said each arc; and forming the revised placement solution based on the calculated arc lengths.

14. The method according to claim 13, wherein the step of allocating slack is performed independently on the horizontal constraint graph to generate horizontal arc lengths, and on the vertical constraint graph to generate vertical arc lengths, and wherein the step of forming the revised placement solution comprises combining the horizontal arc lengths and the vertical arc lengths.

15. The method according to claim 13, wherein the step of calculating the minimum path slack for each arc includes identifying a maximum possible arc length for said each arc as determined by all paths passing th rough said each arc.

16. The method according to claim 13, wherein the step of calculating the maximum path weight at each arc includes adding all arc lengths associated with each path passing through said each arc, and selecting a largest total arc length for said each arc from among the added arc lengths.

17. The method according to claim 13, wherein the step of calculating arc lengths for each arc comprises multiplying an original arc length for said each arc with the minimum path slack calculated for said each arc, and then dividing by the maximum path weight calculated for said each arc.

18. The method according to claim 13, further comprising the step of allocating residual slack existing after the step of calculating arc lengths, wherein the residual slack is assigned to a selected arc after determining the effect of adding the residual slack to the selected arc on cores located on all paths including the selected arc.

19. The method according to claim 18, wherein determining the effect of adding the residual slack to the selected arc includes calculating t he collective effect of the addition on all cores located upstream on all paths including the selected arc.

20. The method according to claim 19, wherein the collective effect is calculated in accordance with the following formula:

$$S_{critical\ nodes}\{(d_N+1-od_N)^2-(d_N-od_N)^2\},$$

where $d_N$ is a distance of a selected core N from a selected origin allocation of the residual slack, and $od_N$ is an original distance d of the selected core N based on the original placement solution.

* * * * *